United States Patent [19]

Odashima et al.

[11] Patent Number: 5,279,045
[45] Date of Patent: Jan. 18, 1994

[54] MINUTE PARTICLE LOADING METHOD AND APPARATUS

[75] Inventors: Hitoshi Odashima, Yokohama; Hiroshi Hasegawa, Kanagawa; Masayuki Kawaharata; Hideyuki Fukasawa, both of Hadano, all of Japan

[73] Assignee: Hitachi, Ltd., Tokyo, Japan

[21] Appl. No.: 649,847

[22] Filed: Jan. 31, 1991

[30] Foreign Application Priority Data

Jan. 31, 1990 [JP] Japan .................... 2-019019
Jul. 13, 1990 [JP] Japan .................... 2-186774

[51] Int. Cl.$^5$ ............................ F26B 3/08
[52] U.S. Cl. ........................ 34/10; 366/101; 366/102; 34/15; 34/51; 34/54; 34/57 A
[58] Field of Search ............ 34/10, 57A, D, R; 366/101, 336/102, 105, 106, 51, 44, 54, 15, 92, 61

[56] References Cited

U.S. PATENT DOCUMENTS

| | | |
|---|---|---|
| 4,157,245 | 6/1979 | Mitchell et al. ............... 34/10 |
| 4,167,819 | 9/1979 | Ebeling, Jr. et al. ............ 34/10 |
| 4,188,185 | 2/1980 | Suh et al. ..................... 34/10 |
| 4,226,830 | 10/1989 | Davis ......................... 34/10 |

Primary Examiner—Henry A. Bennet
Assistant Examiner—Denise Gromada
Attorney, Agent, or Firm—Antonelli, Terry, Stout & Kraus

[57] ABSTRACT

The present invention is to define an enclosed space by covering a holder which can hold numerous minute particles, and introduce a fluid into the enclosed space to stir up the numerous minute particles within the enclosed space with a turbulent flow of the fluid so that the minute particles are placed in and held by the holder After stirring up and loading the minute particles in the holder, the fluid is introduced into the enclosed space again to recover the remaining minute particles which have not been held by the holder. The number of minute particles required for one cycle of the loading operation are taken out by moving a particle push-up shaft vertically, having a recess at the distal end thereof, within a stocker which stores a large number of minute particles, and then delivered to the enclosed space with the fluid.

18 Claims, 40 Drawing Sheets

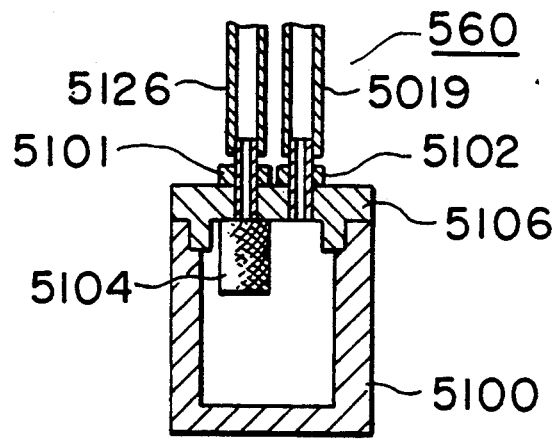
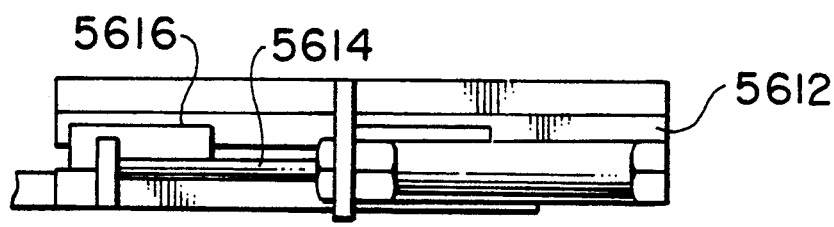
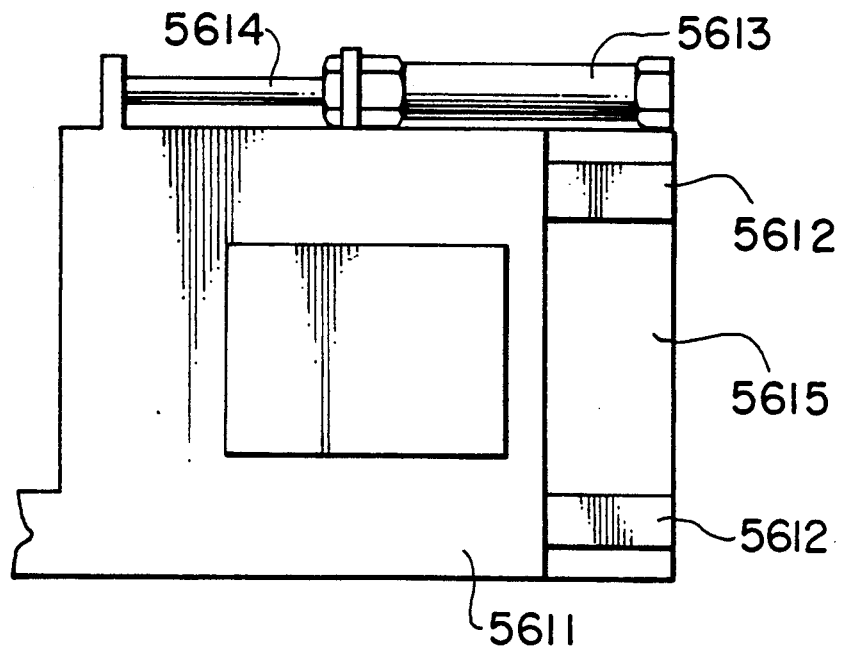

5306

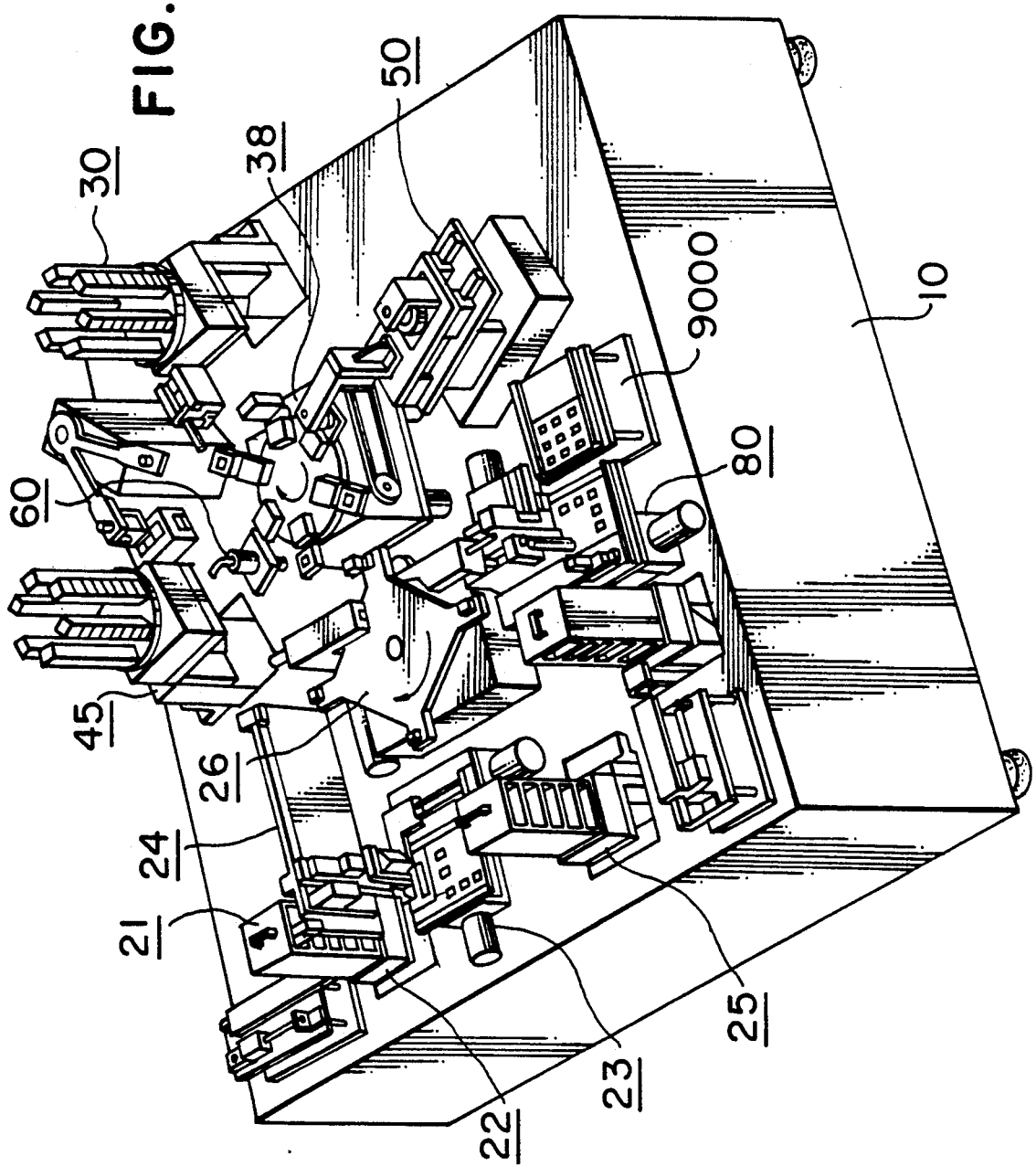

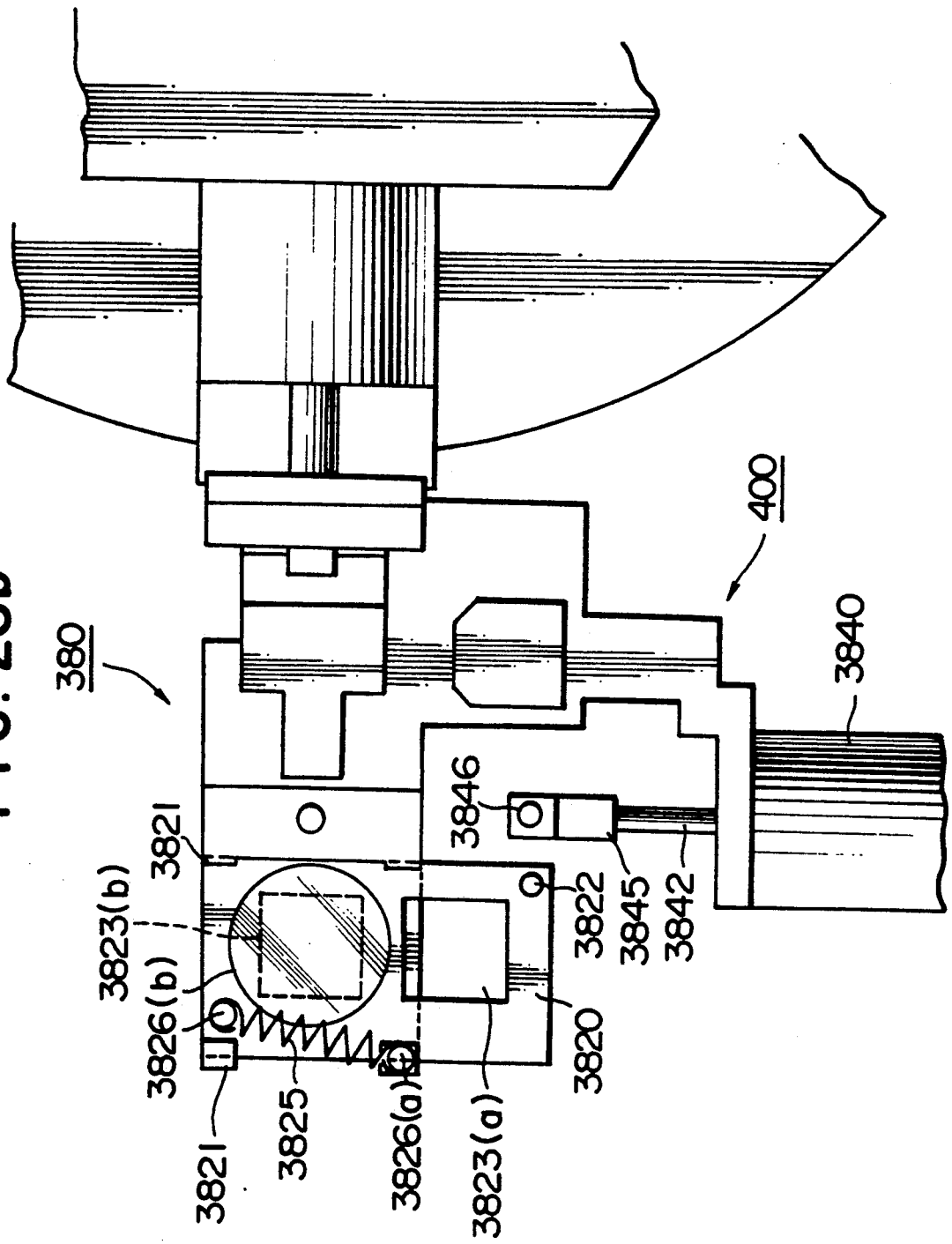

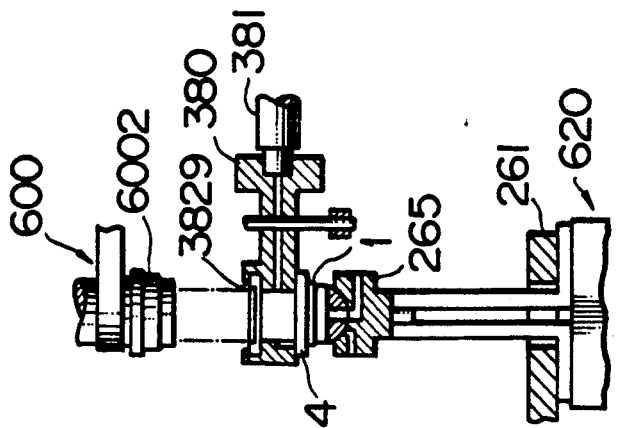
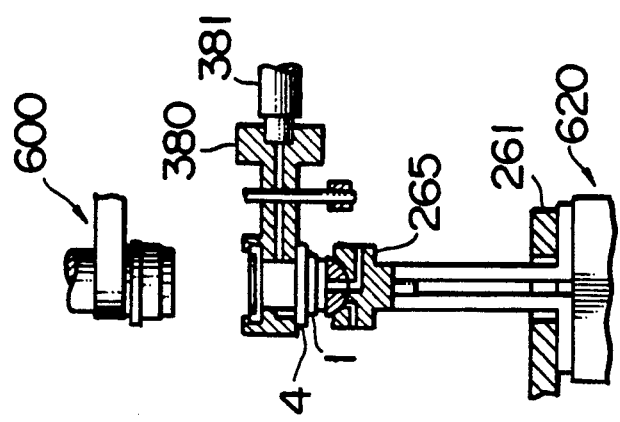
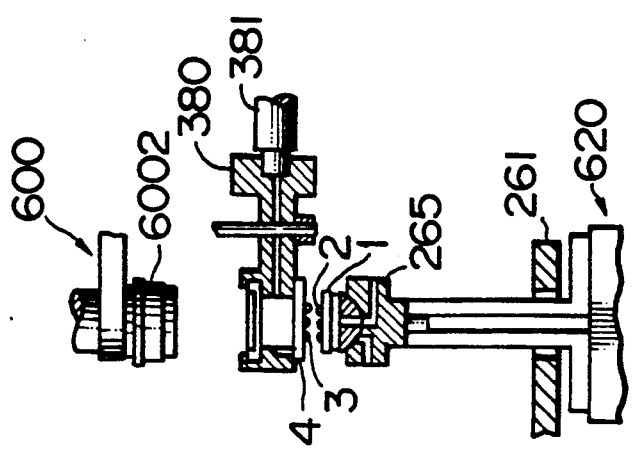

MINUTE PARTICLE LOADING METHOD AND APPARATUS

BACKGROUND OF THE INVENTION

The present invention relates to minute particle loading method and apparatus, and more particularly to a method and an apparatus for supplying and loading solder balls into a jig having holes which are in the same array as solder ball connected portions (or connecting pads) of a semiconductor device and are to receive the solder balls, when the solder balls are joined to the solder ball connected portions of the semiconductor device.

The present invention also relates to solder bump forming method and apparatus for forming solder bumps at the solder ball connected portions by melting the solder balls.

The present invention further relates to a method and an apparatus for manufacturing a semiconductor module in which the solder bumps are formed by the above methods and apparatus.

Japanese Patent Unexamined Publication No. 60-52045 discloses a method of supplying and arraying solder balls into predetermined positions.

The disclosed method is illustrated in FIG. 40a–40d. This method comprises the step of 40a, locating a positioning plate 9004 having insertion holes 9003, into which particles 9000 such as solder balls are to be placed, with respect to electrode pads 9002 on a substrate 9001 such that the insertion holes 9003 locates just above the respective electrode pads 9002, FIG. 40b, supplying the particles 9000 on the positioning plate 9004 and vibrating the positioning plate 9004, FIG. 40c, causing the particles 9000 to be fitted in the respective insertion holes 9003 upon the vibration, and FIG. 40d, discharging the surplus particles 9000 by tilting both the positioning plate 9004 and the substrate 9001 at the same time.

However, the above method suffers from the following problems. First, even once the particles are fitted in the respective insertion holes of the positioning plate, the particles may slip off from the holes when the positioning plate is vibrated or tilted, because no means exist for retaining the particles in the insertion holes. This results in the reduced hit rate in a loading operation of the particles. Secondly, the particles and the positioning plate may be charged with static electricity, causing the particles to adhere to each other or to the positioning plate, resulting in difficulty loading the particles in the desired amount and positions. Thirdly, tilting the positioning plate makes the mechanism more complex. Finally, since the surplus particles scattering flow, difficulty is encountered in recovering the particles.

One of bump forming methods is disclosed in Japanese Patent Examined Publication No. 64-819, for example.

As shown in FIGS. 41-43, this disclosed method pertains to a technique of forming solder bumps on respective connecting pins 115 extended to penetrate through a ceramic substrate 111. First, a predetermined amount of flux 118 is coated on a head of each of the connecting pins 115 by a flux dispensing apparatus 117. Then, solder balls 125 are placed in a container 126 disposed on a vibrator 127, and are suctioned by a suction mask 133 of a vacuum-suction apparatus 128. The solder balls 125 thus suctioned, rest on the respective heads of the connecting pins 115 coated with the flux 118. After de-energizing the vacuum-suction apparatus, vibration is applied, separating the solder balls 125 from the suction mask 133. The solder balls 125 remaining held on the respective heads of the connecting pins 115 due to adhesion forces of the flux 118.

The solder balls adhering to the connecting pins can be melted by bringing the ceramic substrate with the solder balls adhering thereto into a furnace and heating the solder balls under preset temperature control, as described in Japanese Patent Unexamined Publication No. 62-257737 by way or by of example, or by condensing a laser beam to the small diameter and scanning the laser beam over the particular solder balls.

However, such a conventional solder bump forming method suffers from the problems as follows. When the solder balls are separated from the suction mask upon the vibration, or when the ceramic substrate with the solder balls adhering thereto is conveyed into the furnace for melting the solder balls, the solder balls may be shifted in their positions. Also, unless the coated amount and viscosity of the flux are properly controlled, the flux could be dried so that the solder balls would be shifted in their positions. In some cases, the dried flux might even cause the solder balls to drop off when they are melted.

As mentioned above, because the solder balls are retained by only the adhesion forces of the flux, the conventional solder bump forming method is problematic in that the solder balls are easily shifted and the solder bumps cannot be formed in desired positions.

Further, the method of bringing the ceramic substrate into the furnace to melt the solder balls takes time for conveying the ceramic substrate. Alternatively, the method of condensing the laser beam to the small diameter and scanning the laser beam over the solder balls takes time until all the solder balls are melted, because the laser beam is partially irradiated at one time and scanned to cover all the solder balls. Thus, the conventional solder bump forming method is also problematic in taking time to convey the ceramic substrate or melt all the solder balls and, as a result, increasing the time required for forming the solder bumps.

SUMMARY OF THE INVENTION

The present invention has been achieved in view of the foregoing problems in the prior art, and has for its object to provide minute particle loading method and apparatus with which minute particles such as solder balls can be loaded quickly and reliably.

Another object of the present invention is to provide minute particle loading method and apparatus in which minute particles such as solder balls can be automatically loaded and recovered without damaging the minute particles.

A still other object of the present invention is to provide solder bump forming method and apparatus with which solder bumps can be formed at desired positions without causing the solder balls to be shifted.

A yet other object of the present invention is to provide solder bump forming method and apparatus in which the time required for forming solder bumps can be cut down because of eliminating the need of conveying a solder ball connected member such as a ceramic substrate and taking no lengthy time to melt all the solder balls.

To solve the above objects, the present invention is to define an enclosed space by covering a holder which can hold numerous minute particles, and introduce a fluid into the enclosed space to stir up the numerous minute particles within the enclosed space with a turbulent flow of the fluid so that the minute particles are placed in and held by the holder.

After stirring up and loading the minute particles in the holder, the fluid is introduced into the enclosed space again to recover the remaining ones of the minute particles which have not been held by the holder.

The minute particles in number required for one cycle of the loading operation are taken out by vertically moving a particle push-up shaft, having a recess at the distal end thereof, within a stocker which stores a large number of minute particles, and then delivered to the enclosed space with the fluid.

In order to form solder bumps, the method of the present invention comprises the step of aligning solder balls with solder ball connected portions, and then melting the solder balls while pressing the solder balls upon the solder ball connected portions with a predetermined force.

An alternative method to achieve the above objects comprises the steps of placing solder balls in a solder ball holder having holes of which depth is smaller than the diameter of the solder balls; and melting the solder balls while pressing one of the solder ball holder and a solder ball connected member having the solder ball connected portions upon the other with a predetermined force.

In the step of melting the solder balls, it is preferable to melt an entirety of the solder ball connected member and all the solder balls together for melting the solder balls.

A solder bump forming apparatus suitable for implementing the above solder bump forming method comprises solder ball aligning means for aligning the solder balls with the solder ball connected portions; solder ball pressing means for pressing the solder balls upon the solder ball connected portions with a predetermined force; and solder ball melting means for melting the solder balls pressed upon the solder ball connected portions.

An alternative solder bump forming apparatus for melting a plurality of solder balls to form solder bumps at a plurality of solder ball connected portions, comprises a solder ball holder having a plurality of holes which have a depth smaller than the diameter of the solder balls and are formed at positions corresponding to the plurality of solder ball connected portions; holder positioning means for positioning the solder ball holder to a predetermined position; solder ball connected member positioning means for positioning a solder ball connected member having the plurality of solder ball connected portions with respect to the positioned solder ball holder so that the plurality of solder ball connected portions respectively face the plurality of holes defined in the solder ball holder; solder ball pressing means for pressing one of the solder ball holder and the solder ball connected member having the solder ball connected portions upon the other with a predetermined force so that the solder balls placed in the holes of the solder ball holder are pressed upon the solder ball connected portions with the predetermined force; and solder ball melting means for melting the plurality of solder balls by at least heating the plurality of solder balls together pressed upon the solder ball connected portions.

The solder ball connected member may be of, for example, a semiconductor device of leadless type, a ceramic substrate with connecting pins penetrating therethrough, or the like.

Preferably, the solder bump forming apparatus further comprises position offset detector means for detecting the position offset between the solder ball connected portions and the solder balls, and position offset correction commanding means for moving at least one of the solder ball connected member positioning means and the holder positioning means to correct the position offset, when the position offset between the solder ball connected portions and the solder balls is detected.

The solder ball melting means preferably has laser beam irradiator means for irradiating a laser beam to the solder balls. Hot air blower means for blowing hot air to the solder balls, or light radiation beam irradiator means such as a halogen lamp may be used in place of the laser beam irradiator means.

Preferably, the solder ball holder has formed therein through holes extending from the bottom portion of the holes of the solder ball holder, and a negative pressure source is connected to the through holes.

BRIEF DESCRIPTION OF THE DRAWINGS

FIG. 4a is a plan view of FIG. 4b showing a view as looked in the direction of the arrow A in FIG. 2a, and FIG. 4b is a view as viewed in the direction of the arrow A in FIG. 2a;

FIG. 5 is a sectional view of the supply section taken along the line C—C in FIG. 2a;

FIG. 6b is a view as viewed in the direction of the arrow-headed line D—D in FIG. 2a;

FIG. 7 is a sectional view of the recovery section;

FIG. 8a is a plan view of a horizontal drive section, and FIG. 8b is a view as viewed in the direction of the arrow-headed line E—E in FIG. 2b;

FIGS. 11A-11G are schematic views showing successive steps from supply to recovery of the solder balls;

FIG. 13 is an overall view of the apparatus embodying the present invention;

FIG. 23c is a view thereof as viewed in the direction of the arrow B in FIG. 23a;

FIGS. 26a and 26b are detailed views of a head section mounted on the turntable station (B) and suction the glass jig;

FIGS. 28-34 illustrate a first embodiment of a solder bump forming apparatus according to the present invention;

FIG. 28 is an overall front view of a solder ball joining station (or an aligning station) in FIG. 13, FIG. 29 is a sectional view of main parts of a positioner section, FIG. 30 is an overall side sectional view of the positioner section, FIG. 31 is an overall plan view of a position offset detector section, FIG. 32 is an overall side view of a laser beam irradiator section and a position offset detector section, FIGS. 33a-33e are explanatory views for explaining successive steps of forming solder bumps.

FIGS. 35 and 36 illustrate a second embodiment of the solder bump forming apparatus according to the present invention, in which:

FIG. 35 is a front view of main parts of a positioner section, and

FIG. 36 is a side view of main parts of the positioner section;

FIG. 37 is a front view of main parts of a positioner section, and

FIG. 38 is a side view of main parts of the positioner section;

FIG. 41 is an overall sectional view of a suction apparatus;

FIG. 42 is an overall sectional view of a vibrator; and

FIG. 43 is an overall sectional view of a flux dispensing apparatus.

DETAILED DESCRIPTION OF PREFERRED EMBODIMENTS

Several preferred embodiments of the present invention will be described with reference to the drawings.

Figure 1:
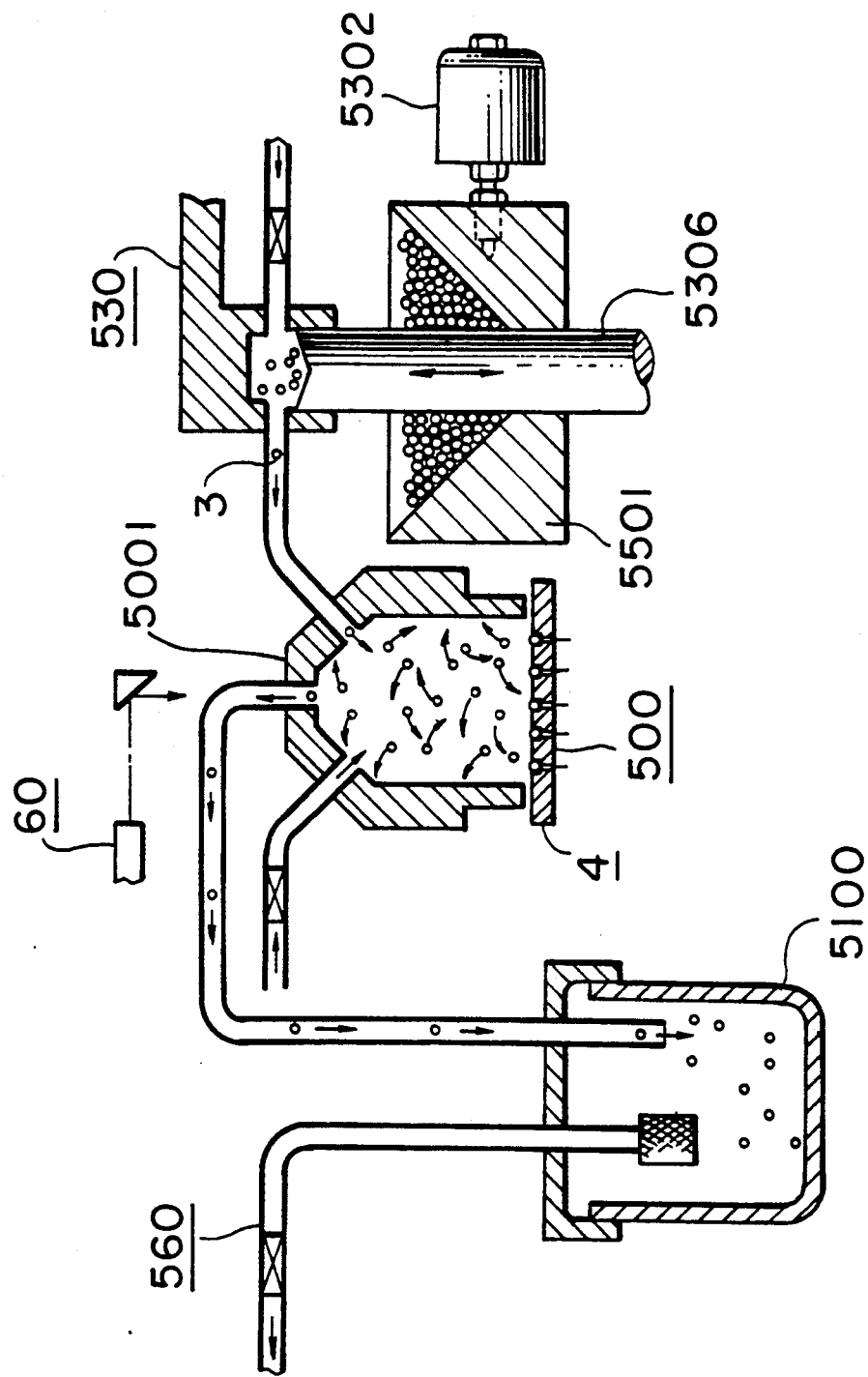
FIG. 1 is a schematic view showing a supply section, a placement head section and a recovery section of a solder ball supply station in a solder ball loading apparatus according to the present invention.
Figure 14A:
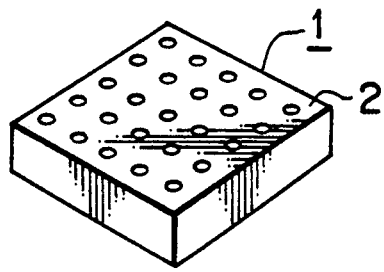
FIGS. 14a and 14b are views showing a workpiece and a part (solder ball) to be processed by the apparatus of the present invention, respectively.
Figure 14B:

FIG. 1 illustrates one embodiment of a minute particle (solder ball) loading apparatus according to the present invention. A semiconductor device 1 as a workpiece to be processed by the present apparatus is one of leadless type and has a plurality of pads (or solder ball connected portions) 2, 2, . . . to which solder balls 3 having the diameter of 0.1-0.5 mm are to be joined for electrically connecting the semiconductor device 1 to a substrate or the like, as seen from FIGS. 14a and 14b. These pads 2, 2 . . . are provided several hundreds in number with intervals of 0.3-0.5 mm between the adjacent pads.

Figure 16:
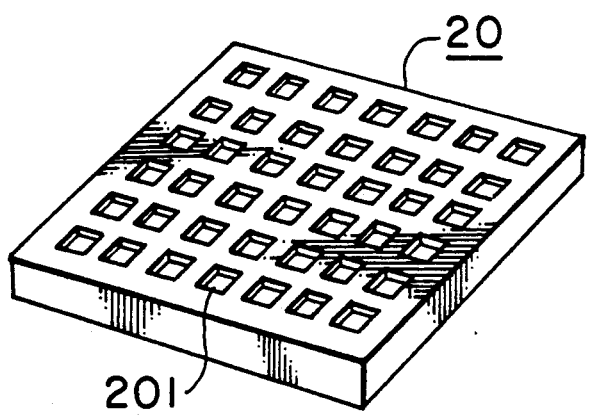
FIG. 16 is a perspective view showing a pallet for receiving the workpieces to be processed.
Figure 17:
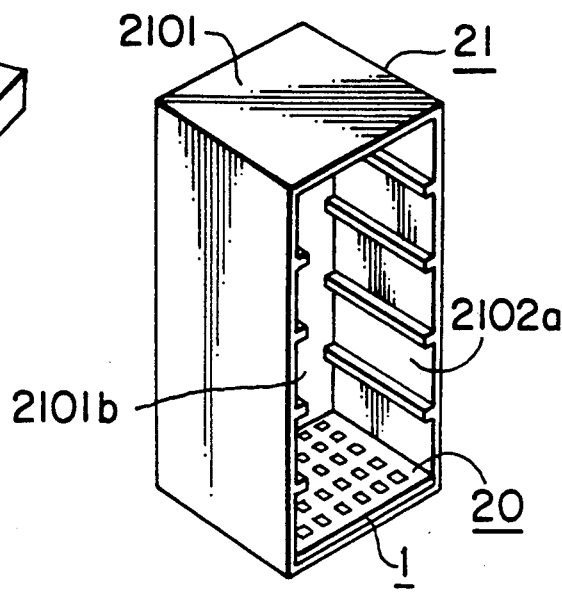
FIG. 17 is a perspective view showing a magazine for accommodating a plurality of pallets.

A plurality of semiconductor devices 1 are accommodated together in a pallet 20 which has a plurality of semiconductor device mounting portions 201, 201, . . . bored therein, as shown in FIG. 16.

Figure 15A:
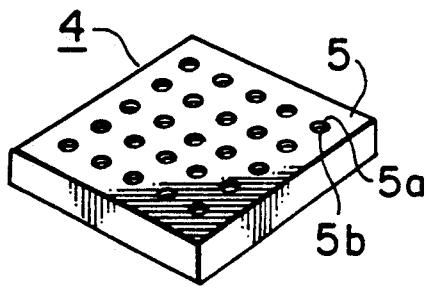
FIGS. 15a and 15b are views showing a jig in which the solder balls are to be loaded.
Figure 15B:
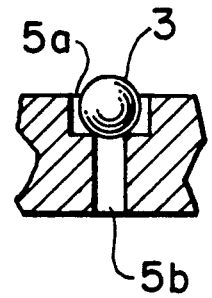

A solder ball holder 4 for holding a plurality of solder balls 3, 3, . . . is formed of a glass plate and, as shown in FIGS. 15a and 15b, a plurality of loading holes 5a, 5a, . . . in which the respective solder balls 3 are to be loaded are bored in the solder ball holder 4 in the same array as the plural pads 2, 2, . . . of the semiconductor device 1.

The loading holes 5a each have a depth smaller than the diameter of the solder ball 3. A through hole 5b having the smaller diameter than the solder ball 3 is formed to extend from the bottom of the loading hole 5a to the rear surface of the solder ball holder 4.

As shown in FIG. 1, the solder ball loading apparatus comprises a separator section for separating the solder balls from a stocker 5501, capable of accommodating the solder balls employed in an operation for several hours, in number necessary for placing the solder balls into all the holes of the glass jig 4, a placement head section 500 having a mechanism which can hold the glass balls intimately close to the upper surface (in which the holes for receiving the solder balls are formed) of the glass jig 4, and a hopper (A) 5001 which has a certain volume, a recovery section 560 having a container 5100 which is connected to suction means for recovering the surplus solder balls left after loading all the holes of the glass jig with the solder balls, means for controlling pressures of compressed air used in the respective sections, and a control system for electrically controlling operations of the respective sections.

With the above arrangement, the glass jig 4 is first fixed in place with the holes (for receiving the solder balls) directed upwardly to be capable of suction of the solder balls. Then, the hopper (A) 5001 of the placement head section 500 is rested on the upper surface of the glass jig 4, and the solder balls separated by the separator section in the above-mentioned necessary number are delivered to the hopper (A) 5001 with compressed air (A). At this time, the compressed air (A) is discharged through a gap defined between the lower end of the hopper (A) 5001 and the upper surface of the glass jig, so that the solder balls reside in the hopper (A) 5001 without entering a hose (B) 5021 and a hose (C) 5019 connected to the hopper (A) 5001. Next, after stopping the compressed air (A), compressed air (B) is introduced through the hose (C) 5019 under a predetermined pressure to stir up the solder balls within the hopper (A) 5001. The stirring-up operation causes the solder balls to be led toward the respective holes (for receiving the solder balls) of the glass jig with turbulent air flow of the compressed air. Thus, the solder balls are led toward the holes repeatedly for a very short period of time and a hit rate of loading the solder balls in the holes is extremely high. Alternatively, by introducing and stopping the compressed air (B) in an intermittent manner, i.e., by the stirring up operation and resting the solder balls repeatedly, the turbulent air flow can be also produced with higher efficiency to further cut down the time required for loading the solder balls in all the holes. The solder balls loaded in the respective holes of the glass jig are suctioned by the suction means onto the glass jig, while the surplus solder balls are left on the upper surface of the glass jig (within the hopper (A) 5001).

The surplus solder balls remaining in the hopper (A) 5001 are recovered with the compressed air (B) into the recovery container 5100 through the hose (C) 5019.

Figure 2A:
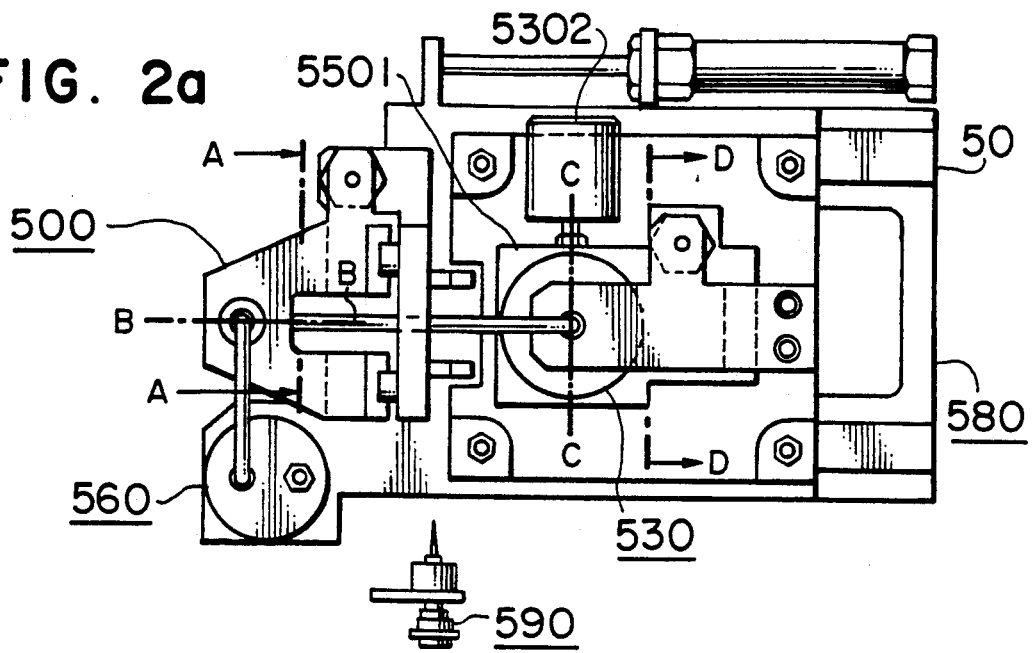
FIG. 2a is a plan view of the solder ball supply station.
Figure 2B:
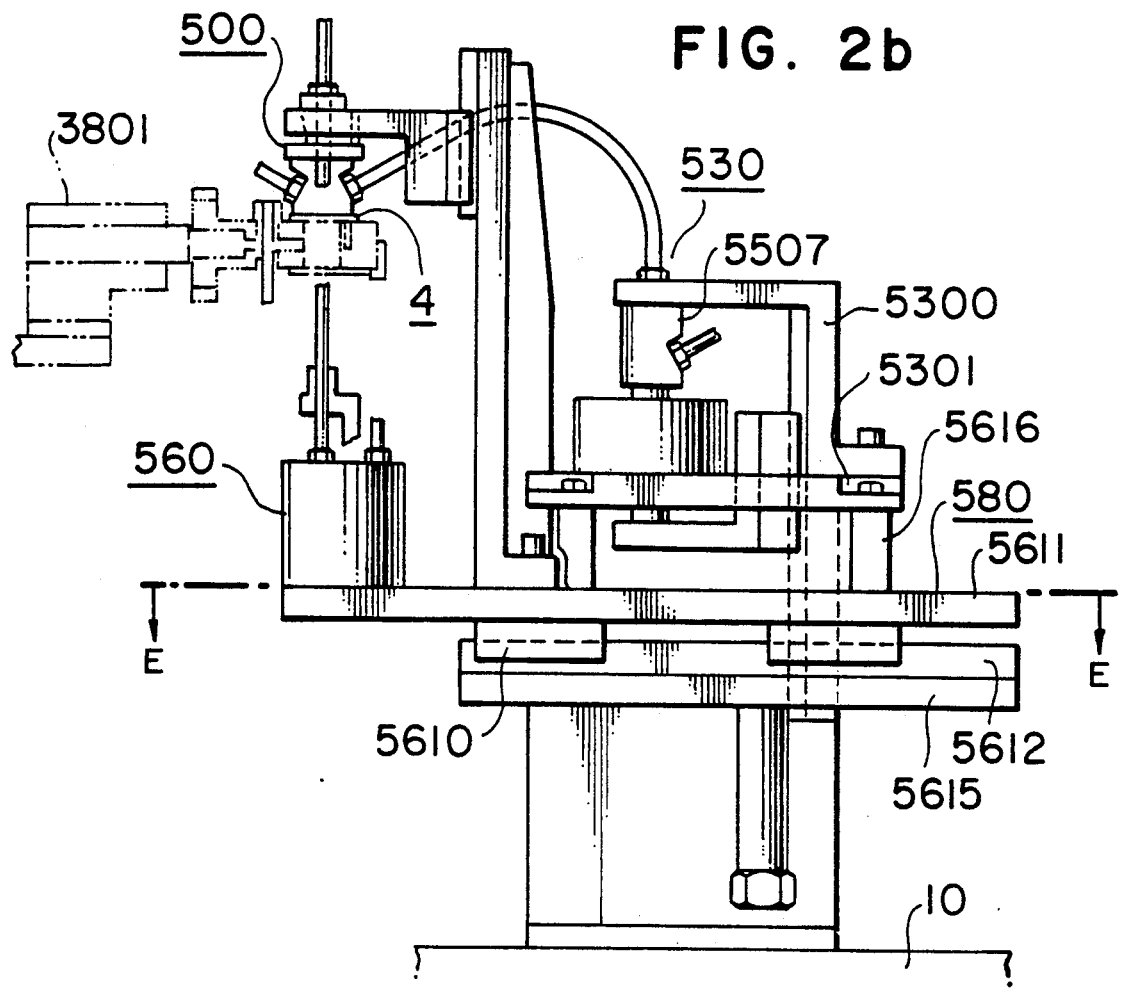
FIG. 2b is a front view thereof.

Main sections of a solder ball supply station 50 according to the present invention; i.e., supply section, placement head section, check section, and recovery section, will be described below with reference to FIGS. 1 to 12. As shown in FIG. 1, 2a and 2b, the solder ball supply station 50 comprises a placement head section 500 for loading the solder balls 3 in the respective holes 5a of the glass jig 4, which is fixedly suctioned to a square post 3801 (a component of a head section 380 in FIG. 9) on a turntable station (B) 38 (see FIG. 13), a supply section 530 for feeding a predetermined amount of solder balls to the placement head section 500, a recovery section 560 for recovering the surplus solder balls 3 which are left after loading all the holes 5a of the glass jig 4 with the solder balls, a horizontal drive section 580 for horizontally reciprocating the above respective sections while fixedly supporting them, a recognizer 610 for checking whether or not the solder balls are placed in all the holes 5a of the glass jig 4, and an air control section for controlling the pressure of the compressed air.

Figure 3A:
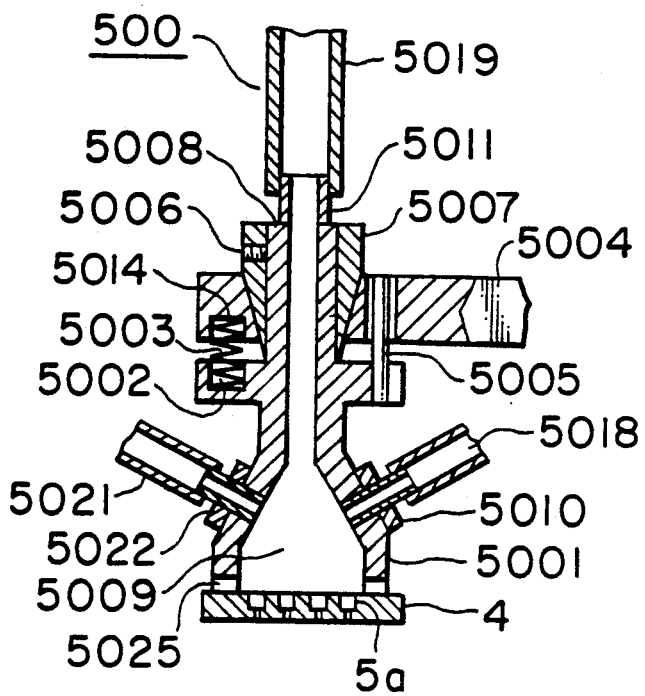
FIG. 3a is a sectional view of the placement head section taken along the line B—B in FIG. 2a, and FIG. 3b is a bottom view thereof.
Figure 3B:
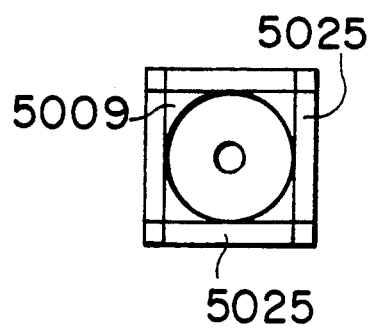
Figure 4A:
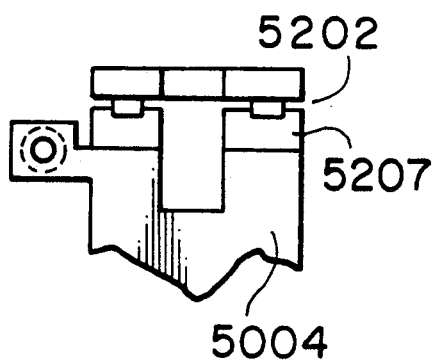
Figure 4B:
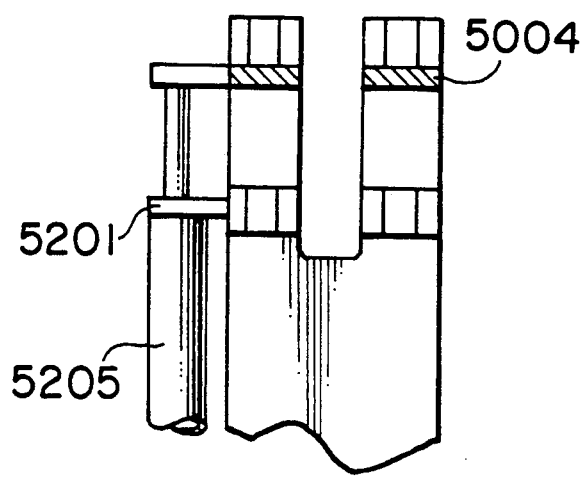

The placement head section 500 is illustrated in FIGS. 2a and 2b, FIG. 3a showing a sectional view taken along the line B—B in FIG. 2a, FIG. 3b showing a bottom view of FIG. 3a, FIG. 4b showing a view as looked in the direction of the arrow-headed line A—A in FIG. 2a, and FIG. 4a showing a plan view of FIG. 4b.

As shown in FIG. 3a, in facing relation to the upper surface of the glass jig 4 suctioned to the head section 380, there is disposed the hopper (A) 5001 as enclosed space forming means which is square in cross-section and has an enclosed space 5009 of the size enough to surround all the holes 5a (for receiving the solder balls 3) of the glass jig 4. A column 5008 is extended from a part of the hopper (A) 5001, and a conical member 5007 having a substantially conical outer shape is fitted over the column 5008 and fastened by a screw 5006. An inclined portion of the conical member 5007 is fitted in a complimentarily inclined portion of a hopper mount base 5004. In addition, three holes 5002 are bored in an outer peripheral region of the column 5007 extending from the hopper (A) 5001 at positions lying on a circle of the same radius and trisecting the circumference of the circle, while three hole 5014 are bored in the hopper mount base 5004 in opposite relation, with compression springs 5003 respectively interposed between three pairs of the holes 5002 and 5014. The inclined portion of the conical member 5007 on the hopper (A) 5001 is thereby normally brought into close contact with the inclined portion of the hopper mount base 5004 under a certain force, i.e., repelling forces of the compression springs 5003. When the hopper (A) 5001 is lifted from the hopper mount base 5004, the inclined portion of the conical member 5007 is disengaged or spaced from the inclined portion of the hopper mount base 5004, and the conical member 5007 is now supported by only the compression springs 5003 so that it may be tilted freely. Accordingly, even if the surface of the glass jig 4 is inclined, the bottom surface of the hopper (A) 5001 can follow the inclined surface of the glass jig 4 to be closely contacted therewith in its entirety (under a predetermined pressure as well) by lifting and adjusting the hopper (A) 5001. Furthermore, the hopper (A) 5001 has four grooves 5025 (see FIGS. 3a and 3b) respectively formed in the square lower ends of the hopper (A) 5001 for allowing only the compressed air to escape therethrough (but preventing the solder balls to pass therethrough) when the hopper (A) is closely contacted with the surface of the glass jig 4. Then, pins 5005 for limiting the rotating motion of the hopper (A) 5001 are fixed to the hopper (A) and inserted into corresponding holes bored in the hopper mount base 5004 (the size of the holes is set to ensure that the pins will not interfere with the hole's inner walls). As shown in FIGS. 4a and 4b, the hopper mount base 5004 is associated with a commercially available slide unit 5202 allowing slidable motion in the vertical direction, and an air cylinder 5205 for vertically moving a slide table 5207 of the slide unit 5202, a fixed part of the slide unit 5202 and the air cylinder 5205 being both fixed to a support base 5201 (which is in turn fixed to the aforesaid horizontal drive section 580). With the above arrangement, the hopper (A) 5001 is normally held at a certain level (by engagement between the inclined portion of the conical member 5007 and the inclined portion of the hopper mount base 5004). When the hopper mount base 5004 descends, the hopper (A) 5001 is brought into contact with the upper surface of the glass jig 4. When the hopper mount base 5004 descends further, the hopper (A) 5001 is freely tilted so that it might be closely contacted with the upper surface of the glass jig 4 even if the latter is inclined. Note that the close contact therebetween is effected under the certain pressing force by the action of the aforesaid compression springs.

The hopper (A) 5001 is also provided with a joint (A) 5010 to which a hose (A) 5018 is connected for introducing the solder balls 3 from the supply section 530 into the enclosed space 5009, a joint (B) 5022 to which the hose (B) 5021 is connected for introducing the compressed air from a compressed air supply source 6001 (see FIG. 10) therethrough to more the solder balls out of the enclosed space 5009, and a joint (C) 5011 to which the hose (C) 5019 is connected for allowing the solder balls to pass therethrough from the enclosed space 5009 to the recovery section 560.

With the placement head section 500 thus arranged, when the hopper (A) 5001 rests on the upper surface of the glass jig 4 (connected to the suction means) while following thereto and the solder balls 3 are supplied to the hopper (A) 5001, the solder balls 3 enter the holes 5a of the glass jig 4. At this time, when the compressed air under predetermined pressure is introduced from the hole (B) 5021 into the hopper (A) 5001, those solder balls 3 which have been placed in the holes 5a are fixedly suctioned, while those solder balls 3 which have not been placed in the holes 5a are forced by the air pressure to upwardly spring back, move in all directions, or collide with one another within the hopper (A) 5001 (this turbulent motion of the solder balls is referred to as stirring-up), thereby allowing the solder balls to be directed many times toward those holes which are still empty. On this occasion, the compressed air may be introduced and stopped intermittently to intensify the turbulent motion of the solder balls.

Figure 5:
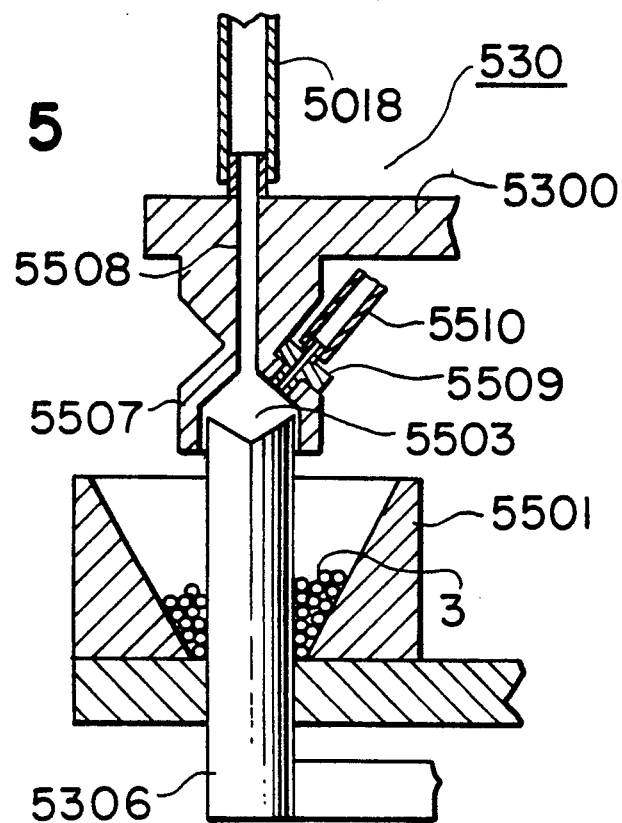
Figure 6A:
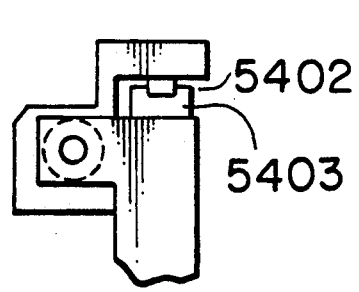
FIG. 6a is a plan view of FIG. 6b.
Figure 6B:
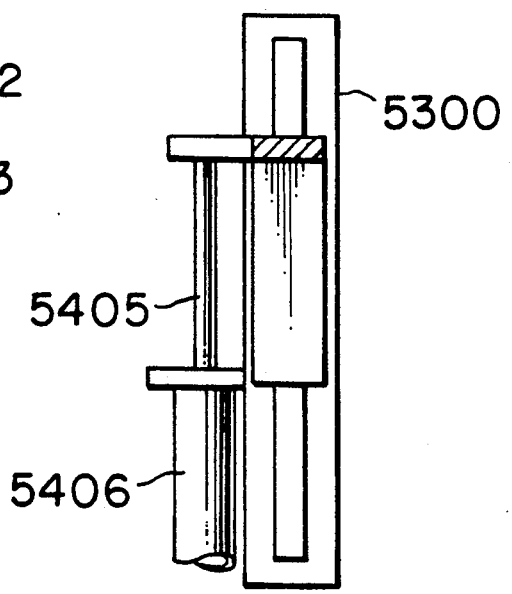

The supply section 530 is detailed in FIG. 5 showing a sectional view taken along the line C—C in FIG. 2a, FIG. 6b showing a view viewed in the direction of the arrow-headed line D—D in FIG. 2a, and FIG. 6a showing a plan view of FIG. 6b.

The stocker 5501 can accommodate several hundred thousand solder balls 3 (the volume of the stocker 5501 being determined depending on the size of solder balls, how many hours should one resupply of the solder balls last where the solder balls are supplied by a loading operation to the stocker 5501, and other factors), and has a conical space in which the solder balls 3 are stored. A ball push-up shaft 5306 is disposed to extend through the stocker 5501 at the center which has a conical-shaped upper distal end and is able to move in the vertical direction. A vibrator 5302 is disposed at one location around the stocker 5501 and fixed to the horizontal drive section 580.

As shown in FIGS. 6a and 6b, the ball push-up shaft 5306 is associated with a commercially available slide unit 5402 and an air cylinder 5406 for vertically moving a slide table 5403 as a slide part of the slide unit 5402, a fixed part of the slide unit 5402 and the air cylinder 5406 being both fixed to a support base 5300. A rod 5405 of the air cylinder 5406 is fixed to the slide table 5403 for moving the ball push-up shaft 5306 in the vertical direction.

With the above arrangement, when the ball push-up shaft 5306 from the lowermost position in an above-described manner, some of the solder balls 3 (corresponding to an amount of the solder balls supplied at one time) stored in the stocker 5501 are put in the conical-shaped upper distal end of the ball push-up shaft 5306 to be ascended together. Such vertical movement of the ball push-up shaft 5306 is performed repeatedly in response to an operation command applied to the air cylinder 5406 from the control system (not shown). Whenever the ball push-up shaft 5306 is descended to the lowermost position, the vibrator 5302 is actuated to vibrate the solder balls 3 in the stocker 5501 for substantially leveling the upper surface of a pool of the solder balls throughout the width of the stocker 5501.

A hopper (B) 5507 is fixed to the support base 5300 surrounding the upper distal end of the ball push-up shaft 5306 when it is ascends. The hopper (B) 5507 has an opening 5503 into which the upper distal end of the ball push-up shaft 5306 penetrates, and a joint (D) connected to the opening 5503 via a through hole 5508. The hose (D) 5018 extending from the placement head section 500 is connected to the joint (D) so that the solder balls may be delivered from the opening 5503 to the placement head section 500. In addition, a joint (E) 5009 connected to a hose (E) 5510 is also attached to the hopper (B) 5507 for introducing compressed air to deliver the solder balls put in the upper distal end of the ball push-up shaft 5306 to the placement head section 500. With the above arrangement, the solder balls put on the ball push-up shaft 5306 in a number necessary for one cycle of operation ascend to enter the hopper (B) 5507 and are then delivered to the placement head section 500 with the compressed air. The foregoing operations are performed successively in response to commands from the control system (not shown).

The recovery section 560 is detailed in FIG. 7. A cylindrical container 5100 enclosed at one side and having threads tapped at the other side is fixed to the horizontal drive section 580, with a threaded cap 5106 screwed into the other side of the container 5100. The cap 5106 is provided with a joint (F) 5101 connected to the suction means (not shown) through a hose (F) 5126, and a joint (G) 5102 connected to the joint (C) 5011 of the placement head section 500 through the hose (C) 5019. A net 5104 is attached to surround the tip end of the joint (F) 5101 penetrating into the container 5100, whereby the solder balls 3 are prevented from passing through the joint (F) 5101 into the suction means.

With the above arrangement, the solder balls are delivered with the compressed air from the placement head section 500 toward the recovery section 560 as mentioned above and, at the same time, vacuum suction is effected through the joint (G) 5102 connected to the suction means not shown) for recovering the solder balls 3 into the container 5100. The recovered solder balls 3 are later taken out of the container 5100 by removing the cap 5106 and returned back to the stocker 5501 for reuse.

The recovered solder balls 3 may be returned or conveyed from the container 5100 back to the stocker 5501 by using compressed air in a like manner as the recovery of the solder balls from the hopper (A) 5001 to the container 5100.

The horizontal drive section 580 is illustrated in FIGS. 2a and 2b, FIG. 8b showing a view as viewed in the direction of the arrow-headed line E—E in FIG. 2b, and FIG. 8a showing a plan view of FIG. 8b. In order to horizontally slide the stocker 5501 of the supply section 530 in FIG. 2a, the support base 5300 to which the hopper (B) 5507 is fixed, a securing base 5301 to which the support base 5300 is fixed, anti-vibrating rubber members 5610 fixed to a base plate 5611 (at four locations), as well as the base plate 5611, a guide rail 5612 is fixed to a mount base 5615 (which is in turn fixed to a base bench 10) and two slide bases 5616 are slidably engaged with the guide rail 5612. An air cylinder 5613 fixed to the mount base 5615 has a rod 5614 fixed to the base plate 5611, and the rod 5614 is moved upon an operation command applied to the air cylinder 5613 to slide the base plate 5611.

With the above arrangement, the horizontal drive section 580 can fixedly hold or horizontally move the placement head section 500, the supply section 530 and the recovery section 560, as required, to avoid interference with the turntable station (B) 38 when the latter is rotated.

Figure 9:
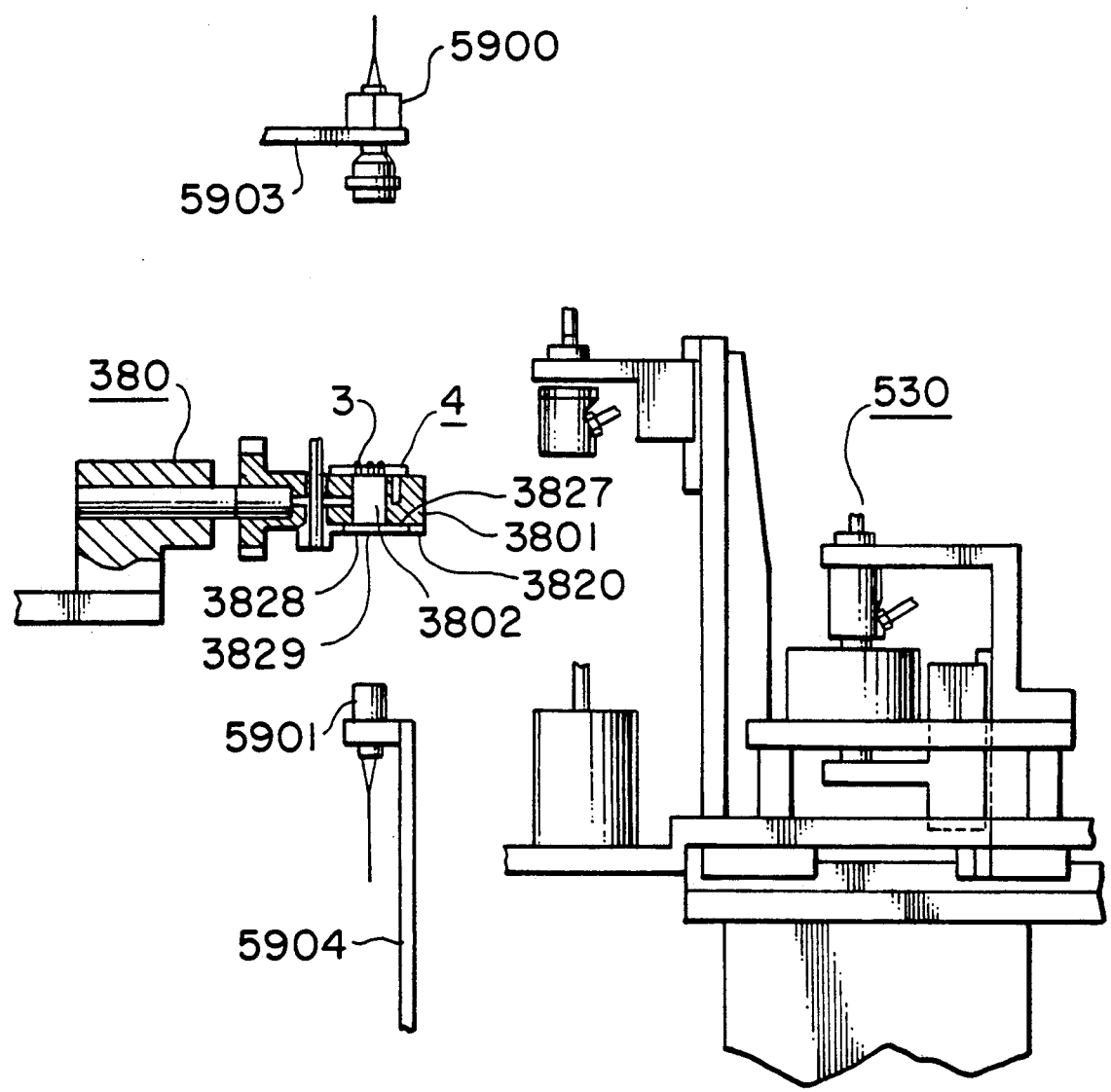
FIG. 9 is a view showing a second recognizer section.

As shown in FIG. 9, a second recognizer section comprises a recognizing camera 5900 disposed right above the glass jig 4, which is firmly suctioned to the head section 380, and fixed to a support base 5903 (which is in turn fixed to the base bench 10), and an illumination lamp 5901 disposed below the head section 380 and fixed to the base bench 10 (not shown in FIG. 9) via a holder 5904. With the above arrangement, after loading the solder balls 3 by the placement head section 500 in the holes of the glass jig 4 firmly suctioned to the head section 380, the glass jig 4 is illuminated by light emitted from the illumination lamp 5901. At this time, a square through hole (A) 3802 penetrating through the square post 3801 of the head section 380 is enclosed on one side (near the camera 5900) by the transparent glass jig 4 in the holes of which the solder balls 3 are loaded, and on the other side (near the illumination lamp 5901) by a transparent glass plate 3829 bonded so as to cover a square hole (C) 3827 bored in a flat plate 3820, so that the illuminating light is transmitted to the camera 5900 through the head section 380.

With the above arrangement, the solder balls 3 placed on the glass jig 4 are detected by the camera 5900 which senses silhouettes of the solder balls 3 using the transmitted light from the illumination lamp 5901, thereby determining the presence or absence of the solder balls 3 in the respective holes. If even one hole of the glass jig 4 is empty, the solder ball loading operation is automatically repeated.

FIGS. 10a–10d illustrate circuit diagrams for controlling pressure of the compressed air utilized to produce stirring-up of the solder balls in the placement head section 500 shown in FIGS. 3a and 3b and to deliver the solder balls from the supply section 530 to the placement head section 500. The circuit shown in FIG. 10a includes a compressed air supply source 6001 comprising a compressor or the like, a commercially available air filter 6002 for eliminating dust or so contained in the compressed air, a pressure controller 6003 capable of desirably changing pressure of the compressed air, and a solenoid valve 6004 for feeding or stopping the compressed air under the controlled pressure, as required. The compressed air is fed from the solenoid valve 6004 to the placement head section 500 and the supply section 530.

With the above arrangement, the compressed air can be introduced under predetermined constant pressure into the placement head section 500 and the supply section 530 as required (in response to a command from the control system (not shown)).

Operations of the main sections in the solder ball supply station 50 are illustrated in FIGS. 11a–11f, and the process from loading the solder balls on the glass jig to recovering the surplus solder balls left after loading all the holes of the glass jig with the solder balls is illustrated in FIGS. 11A–11G. Steps in the respective operations will be described below successively.

Figure 11A:
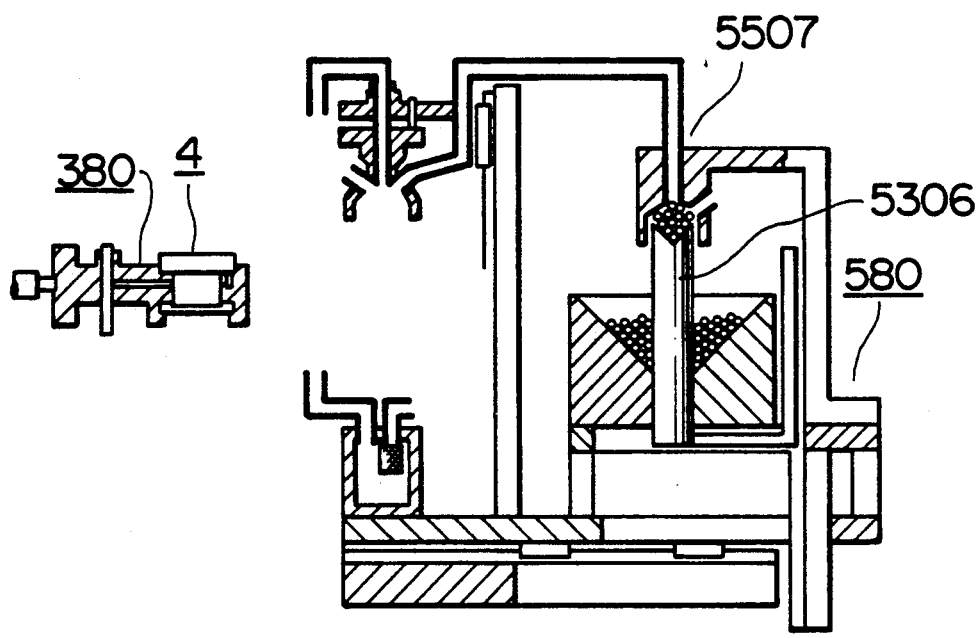
FIGS. 11a-11f are schematic views showing the main sections of the solder ball supply station in successive steps.

In a first step shown in FIG. 11a, the glass jig 4 is firmly suctioned to the head section 380 and sent to the solder ball supply station 50. At this time, the placement head section 500 is retracted to a position out of interference with the head section 380. Also, the ball push-up shaft 5306 ascends with its upper distal end entering the hopper (B) 5507. Under this condition, some of the solder balls 3 in the stocker 5501 capable of accommodating a large number of solder balls is separated in number corresponding to an supply amount of solder balls necessary for one cycle of operation. As a result of the experiment, it was found that the supply amount of solder balls necessary for one cycle of operation is suitably 2-2.5 times an amount of solder balls required to fill all the holes of the glass jig 4.

Figure 11B:
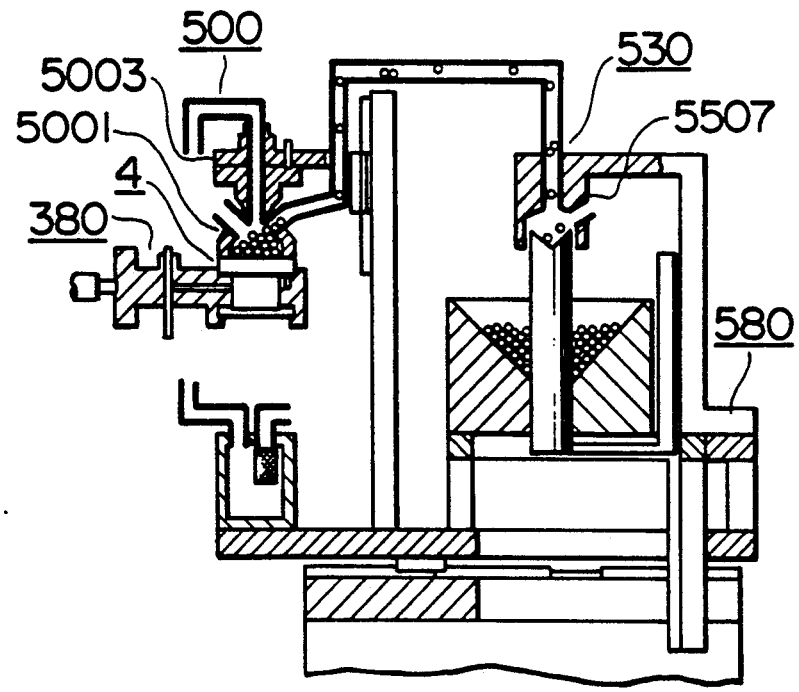
Figure 11C:
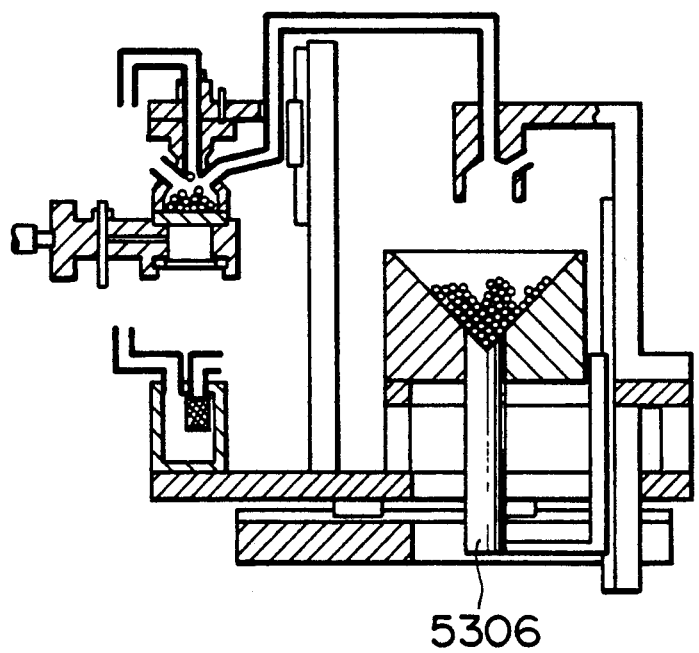

In a second step shown in FIG. 11b, the respective sections are advanced by the horizontal drive section 580 so that the placement head section 500 is moved to a position just above the glass jig 4 firmly suctioned to the head section 380. The placement head section 500 is then descended so that the hopper (A) 5001 of the placement head section 500 is detached from the mount base 5004 and pressed against the glass jig 4 by only the compression springs 5003. The lower surface of the hopper (A) 5001 is thereby closely contacted with and pressed against the upper surface of the glass jig 4. Under the above condition, compressed air (a) is introduced through the hose (E) 5510 into the hopper (B) 5507 of the supply section 530, whereupon the solder balls 3 are delivered to the placement head section 500 through the hose (D) 5018 (as shown in FIGS. 11B and 11C). In this step, the compressed air (a) may be set to pressure as low as necessary for delivering the solder balls (0.1–0.4 kgf/cm2 in the present invention). As indicated by the arrows (a) in FIG. 11C, a flow of the compressed air (a) is allowed to escape through the grooves 5025, formed as flow passages at the lower end of the hopper (A) 5001, in the four directions so that the solder balls 3 are prevented from flowing toward the hose (C) 5019 and the hose (B) 5021. After the solder balls in an amount to be supplied at one time are all delivered, the compressed air (a) introduced through the hose (E) 5510 is stopped.

In a third step shown in FIG. 11c, the ball push-up shaft 5306 descends, while the other components remain in the same conditions as in the above second step. Under this condition, compressed air (b) is introduced through the hose (B) 5021 into the hopper (A) 5001. Pressure of the compressed air (b) is set on the order enough to float the solder balls 3 from the glass jig 4 within the hopper (A) 5001, so that the solder balls collide with one another or strike against the side walls of the hopper (A) 5001. Thus, the solder balls 3 are stirred up within the hopper (A) 5001 to be placed in the respective holes 5a of the glass jig 4 next by next (FIG. 11E). Because the solder balls 3 are stirred up substantially at the same flow speed as the compressed air (a), the solder balls 3 are directed toward the holes 5a of the glass jig 4 repeatedly in many times for the short period of time. Therefore, a hit rate of loading the solder balls 3 is very high. In this respect, it has been found that by repeating the supply and stoppage of the compressed air (i.e., the conditions of FIGS. 11E and 11F) intermittently, the loading time required to place the solder balls 3 in all the holes 5a of the glass jig 4 is reduced in comparison with the case of continuously stirring up the solder balls 3. It has been also found that as the frequency of repeating the above two conditions is increased, the loading of the solder balls onto the glass jig can be completed in a shorter period of time.

Since the compressed air continuously escapes through the grooves 5025 formed at the lower end of the hopper (A) 5001 in this step as well, the solder balls are prevented form flowing out through the other hoses. In this way, the solder balls are located in all the holes 5a of the glass jig 4 and firmly suctioned in place by the suction means on the head section 380. The surplus solder balls are left on the surface of the glass jig 4.

Figure 11D:
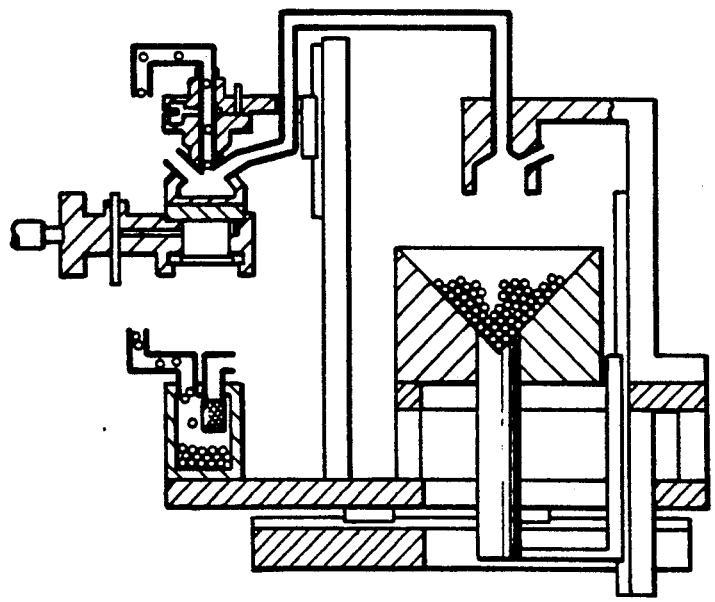
Figure 11E:
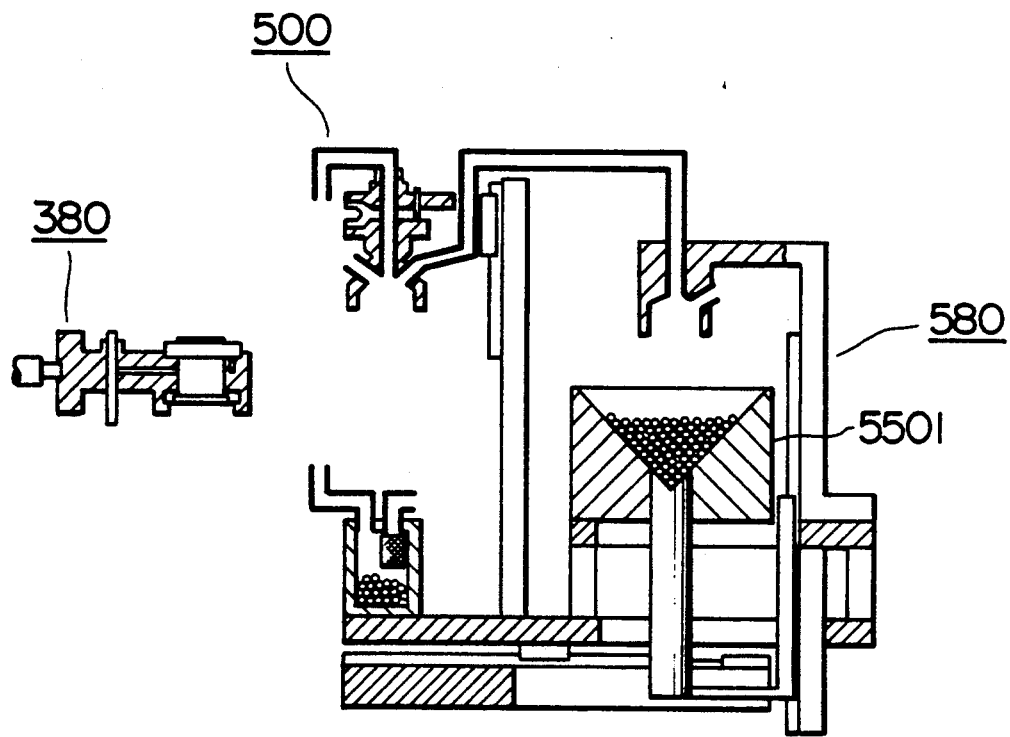

In a fourth step, the respective sections remain in the condition of FIG. 11d as with the third step. After the solder balls 3 are placed in all the holes 5a of the glass jig 4 in the third step, the compressed air (b) introduced through the hose (B) 5021 is stopped. (At the same time, the compressed air (a) introduced through the hose (E) 5510 is also stopped). Then, as shown in FIG. 11G, air is suctioned into the container 5100 through the hose (F) 5126 connected to the suction means and, simultaneously, the compressed air (b) is introduced through the hose (B) 5021 into the hopper (A) 5001. This causes the compressed air (b) to flow through the hose (C) 5019, container 5100 and the hose (F) 5126 to the suction means. Therefore, the solder balls 3 are entrained and delivered into the container 5100 along with the flow of the compressed air (b). As a result, the surplus solder balls 3 left on the glass jig 4 are all recovered into the container 5100. In this step, pressure of the compressed air (b) may be changed from the pressure used in the above third step. Alternatively, a separate circuit may be provided to supply compressed air under desired pressure. In either case, the intended aim can be achieved by determining a discharge flow rate of the suction means such that the compressed air (b) flows through the circuit as mentioned above. After recovering all the solder balls 3 into the container 5100, the compressed air (b) is stopped.

In a fifth step, as shown in FIG. 11e, the placement head section 500 is lifted and retracted by the horizontal drive section 580 to a position out of interference with the head section 380. At this time, the solder balls 3 loaded in the holes 5a of the glass jig 4 remain firmly suctioned to the glass jig 4, whereas the solder balls 3 stored in the stocker 5501 are vibrated by the vibrator 5302 so that its upper surface is almost level within the stocker 5501.

Figure 11F:
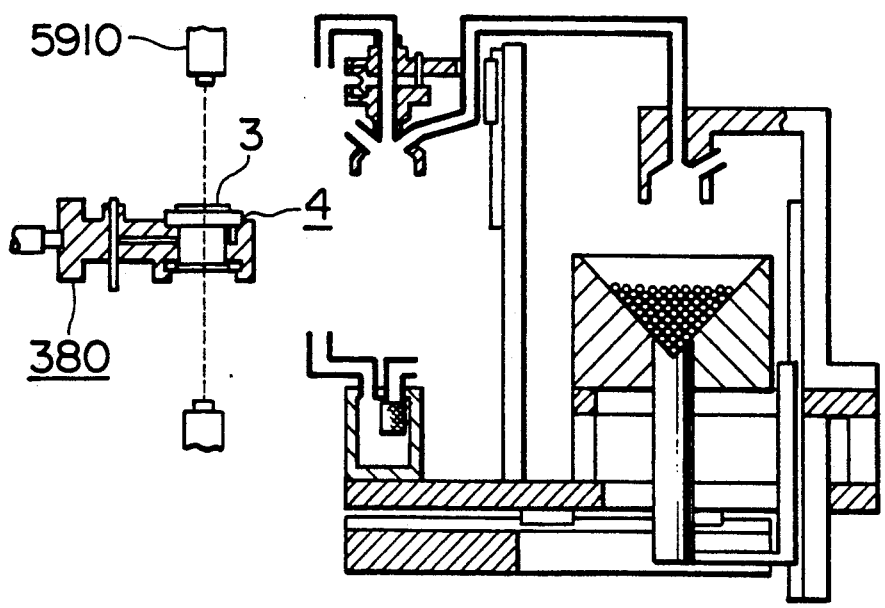
Figure 11A:
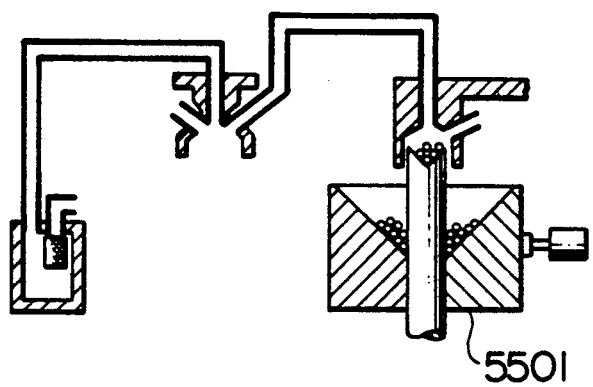
Figure 11B:
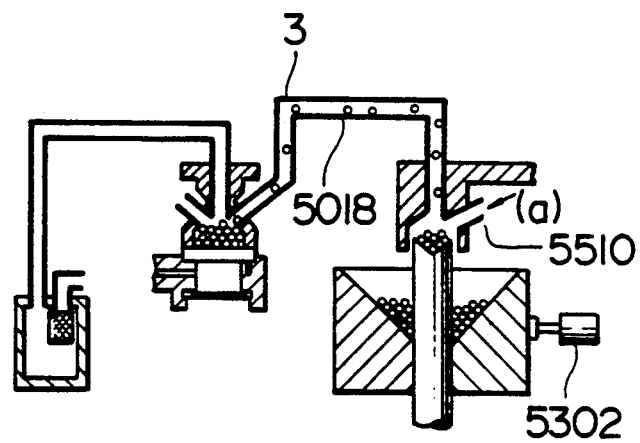
Figure 11C:
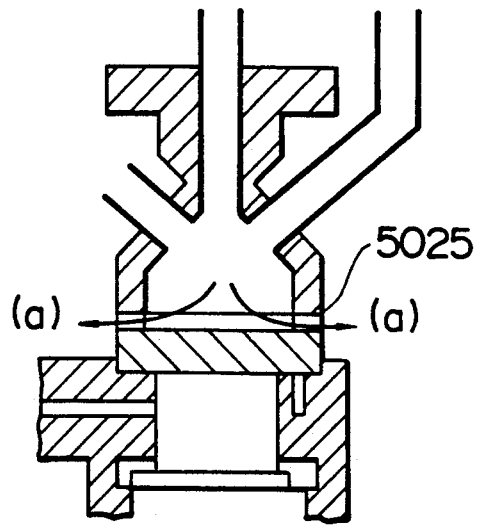
Figure 11D:
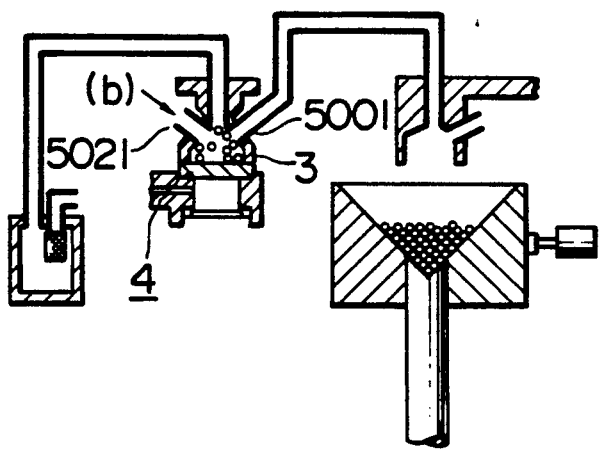
Figure 11E:
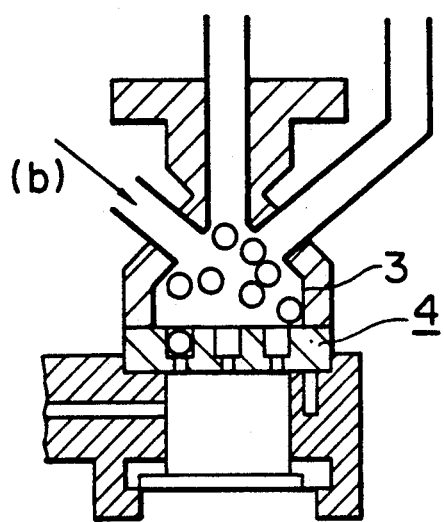
Figure 11F:
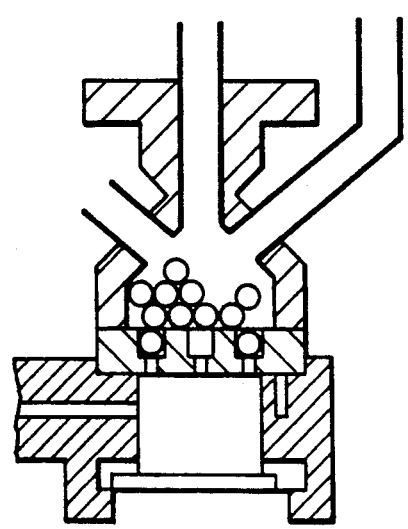
Figure 11G:
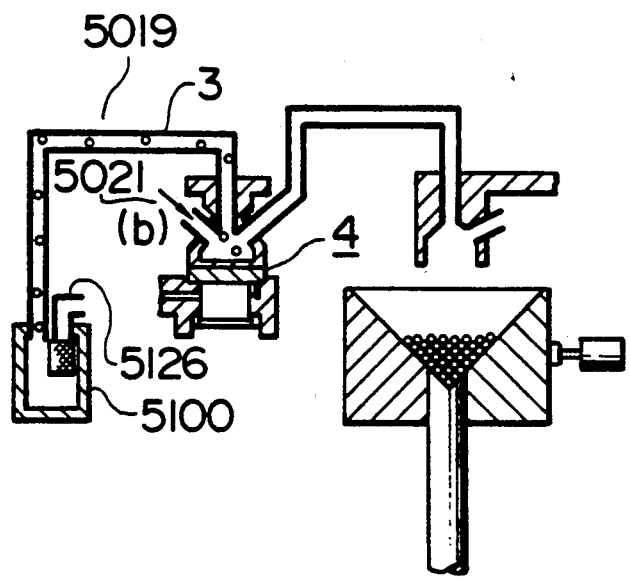

In a sixth step, as shown in FIG. 11f, mechanical operations remain in the same conditions as the above fifth step. The aforesaid camera 5900 checks from above whether or not the solder balls 3 are loaded in all the holes 5a of the glass jig 4 held by the head section 380. If even one of the holes 5a is empty, the series of the foregoing steps are repeated again in response to a command from the control system (not shown). Because of the high hit rate of loading the solder balls in the present invention, the foregoing steps are repeated only one time in this embodiment. Unless all the holes of the glass jig are filled with the solder balls after repeating the foregoing steps, this condition is considered as being caused by other reasons (such as dust present on the glass jig) and an approach to cope with this situation is taken.

As explained above, since a large number of solder balls are stored in the stocker 5501 and a predetermined amount of solder balls necessary for one cycle of the loading operation is taken out therefrom, the solder ball supply station 50 is suitable for use over a prolonged time. Further, the surplus solder balls 3 left after loading all the holes 5a of the glass jig 4 with the solder balls are recovered by the compressed air (b) and the suction means for reuse. If even one hole 5a of the glass jig 4 is empty, i.e., not loaded with the solder ball 3, this incomplete condition is detected to and compensated for by repeating the steps from the beginning. A sequence of the foregoing operations are all carried out automatically under control of the control system.

The above-described solder ball loading method may be implemented by alternative methods as follows.

Figure 10A:
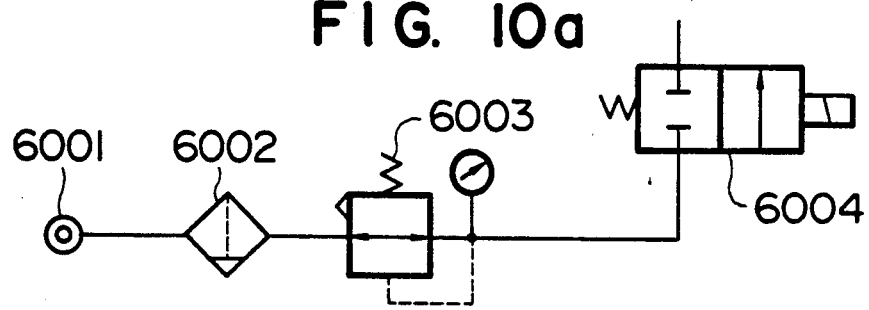
FIGS. 10a, 10b, 10c and 10d are circuit diagrams for controlling stirring-up of solder balls and pressure of compressed air in the supply section.
Figure 10B:
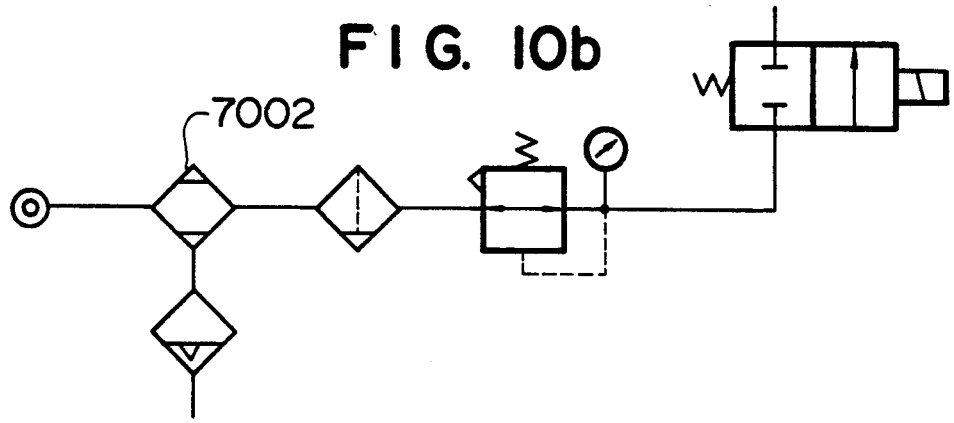

(1) The method of introducing the compressed air into the solder ball supply section 530 and the placement head section 500 may be modified, as shown in FIG. 10b, by interposing a dry air unit 7002 between the compressed air supply source 6001 and the air filter 6002 in FIG. 10a (the rest of the circuit being the same as in FIG. 10a). With the addition of the dry air unit 7002, moisture adhering onto the solder balls is removed, achieving an improvement in reliability of soldering. The similar advantage may be also obtained by installing a heater 7004 downstream of the dry air unit 7002 in FIG. 10b to positively dry the solder balls, as shown in FIG. 10c.

Figure 10C:
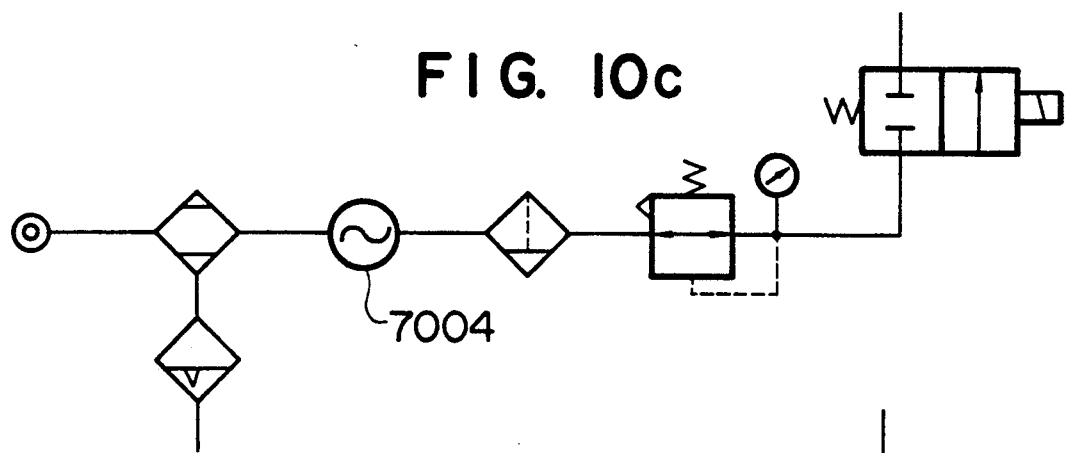
Figure 10D:
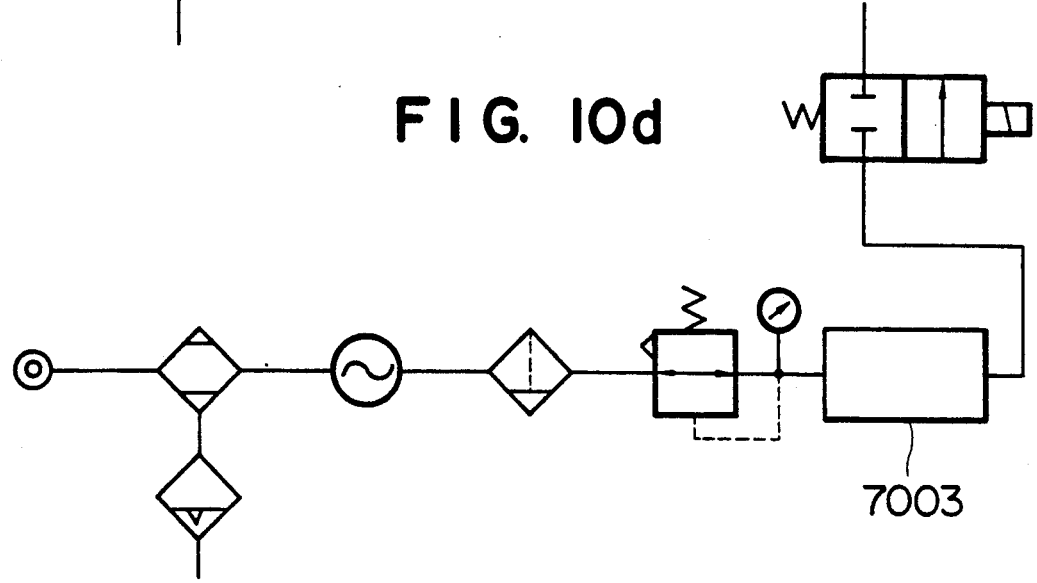

(2) In the circuits of FIGS. 10a, 10b and 10c, a static electricity removing device 7003 may be installed downstream of the pressure controller 6003 to prevent the solder balls 3 from being charged with static electricity and, as a result, prevent the solder balls 3 from adhering onto the respective components.

(3) It will be apparent that the above dry air means, heater means, and static electricity removing means may be installed at any locations where the respective means can fulfill their intended aims, other than the locations illustrated above by way of example. Furthermore, a combination of those means may be selected optionally.

(4) In order to cut down the time required for melting the solder balls, the aforesaid heater may be used as not only drying means, but also heating means, thereby preheating the solder balls up to a certain temperature. Alternatively, the melting time of solder balls may be also shortened by providing heating means in the stocker or storing the preheated solder balls in the stocker.

(5) Inert gas such as N2 gas may be fed from the aforesaid compressed air supply source 6001 in place of the compressed air (while the rest of the apparatus remains in the same arrangement), thereby preventing oxidation of the solder balls. This method can be combined with any of the foregoing methods (1)-(4).

Figure 12:
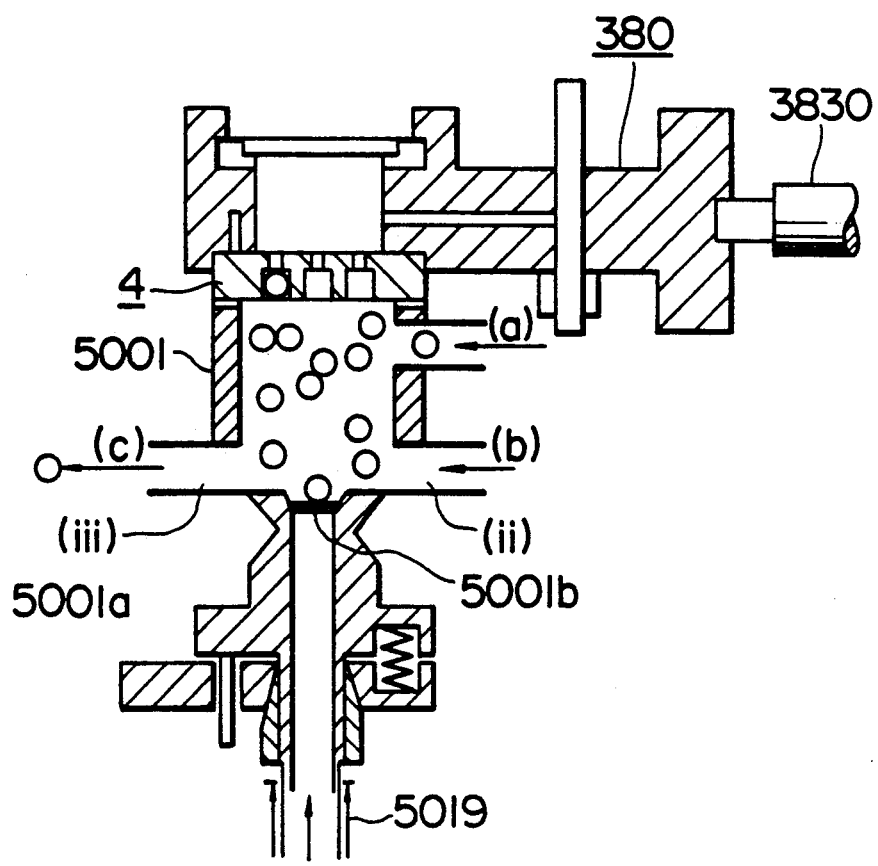
FIG. 12 is a view of the placement head section, in the vertically inverted form, shown in FIG. 3.

(6) The head section 380 has been explained as disposing the glass jig 4 with the holes for receiving the solder balls directed upwardly, and loading the solder balls from above the holes. This solder ball loading method may be modified, as shown in FIG. 12, such that the head section 380 is inverted through 180 degrees, i.e., such that the glass jig 4 is firmly suctioned to the lower surface of the head section 380 with the holes for receiving the solder balls directed downwardly, and the solder balls are blown up toward the glass jig 4 to be loaded in the holes thereof. One embodiment of this modification will now be described.

A placement head section 500 for implementing the modified method is arranged similarly to the above one as illustrated in FIG. 3a showing the view taken along the line B—B in FIG. 2a, FIG. 3b showing the bottom view of FIG. 3a, FIG. 4b showing the view as viewed in the direction of the arrow-headed line A—A in FIG. 2a, and FIG. 4a showing the plan view of FIG. 4b. The placement head section 500 of this embodiment operates substantially in the same manner as the above-described embodiment except for the following points.

(a) The head section 380 and the placement head section 500 are rotated together through 180 degrees about a rotary shaft 3830 of the head section 380, followed by fixing the head section 380 in a properly positioned state.

(b) An inlet through which the solder balls are transferred from the supply section 530 to the hopper (B) 5001 is located, as indicated by the arrow a in FIG. 12, near the glass jig 4 (so that the solder balls 3 may be dropped after exiting the inlet).

(c) Inlets through which the compressed air is introduced for stirring up and recovering the solder balls are located in opposed relation to the foregoing embodiment. As shown in FIG. 12, however, the inlet of the hopper (B) 5001 for the compressed air (indicated by the arrow d) to stir up the solder balls is covered with a net 5001b fixed by a ring 5001a, thereby preventing the solder balls 3 from penetrating into the hose (C) 5019.

(d) The inlet of the compressed air (indicated by the arrow b) used for recovering the solder balls is positioned opposed to the joint (B) 5021 for recovery (indicated by the arrow c). Accordingly, when recovering the solder balls, a fluid under predetermined pressure is introduced as indicated by the arrow b so that the solder balls are recovered into the container 5100 as indicated by the arrow c.

(e) The compressed air (d) for stirring up the solder balls is introduced through the hose (c) 5019 at pressure under which the solder balls can strike against the glass jig 4 in a satisfactory manner.

With the modified method, as described above, the solder balls (in an amount necessary for one cycle of loading operation) delivered from the supply section 530 are blown up with the stirring compressed air (d) toward the glass jig and loaded in all the holes of the glass jig while being firmly suctioned thereto.

A solder bump forming apparatus according to the present invention comprises, as shown in FIG. 13, a holder turntable station (B) 38 supporting a solder ball holder (glass jig) 4 and rotating intermittently in units of a predetermined angle, a solder ball supply station 50 for supplying the solder balls 3 to the solder ball holder 4 on the holder turntable station (B) 38, a solder ball joining (or aligning) station 60 for grasping the semiconductor device 1 on a device turntable station (A) 26, positioning the semiconductor device 1 relative to the solder ball holder 4 on the holder turntable station (B) 38, and melting the solder balls 3, a solder bump formed device storage station 80 for storing the semiconductor device 1 in which the solder balls 3 have been melted to form solder bumps, and a control station (not shown) for controlling the above respective stations.

Respective components of the solder bump forming apparatus will be described in detail below.

Figure 18A:
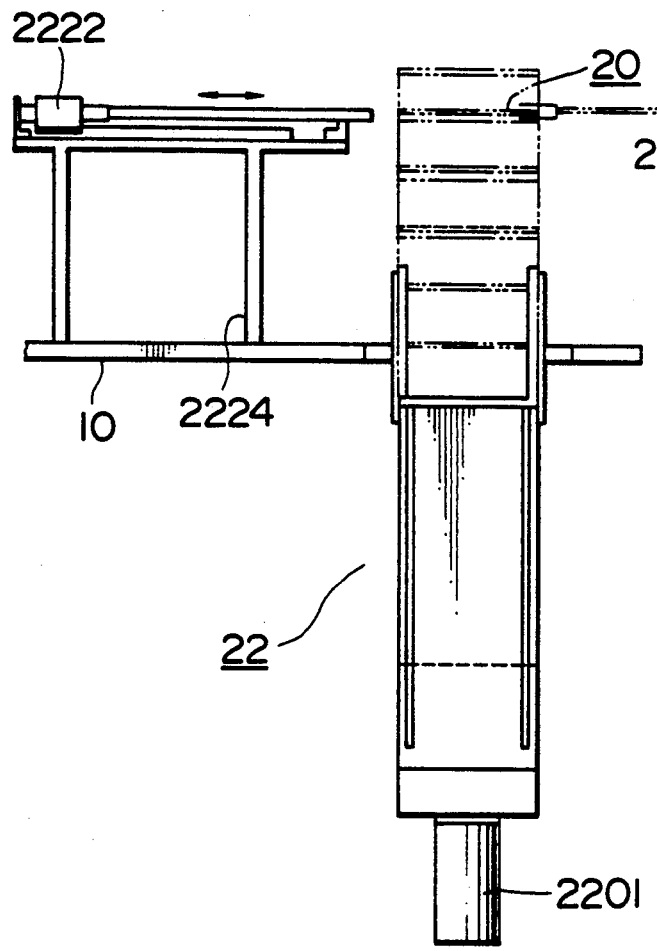
FIGS. 18a, 18b and 18c are views showing a supply station for supplying the pallets.
Figure 18B:
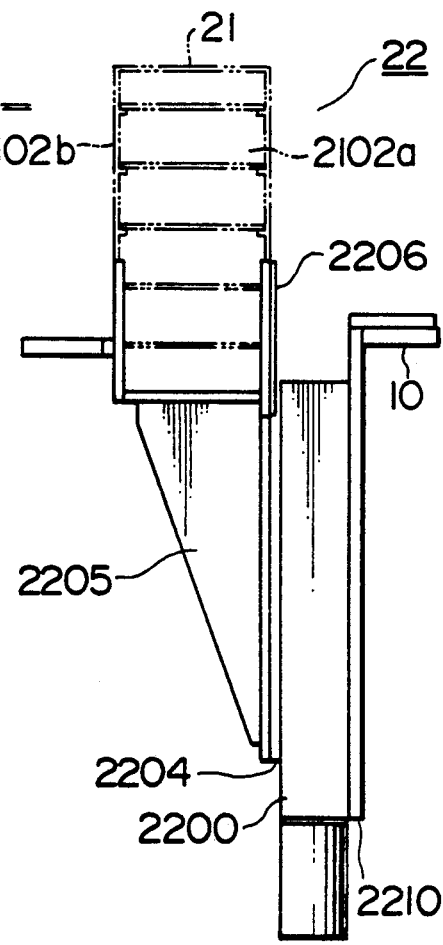
Figure 18C:
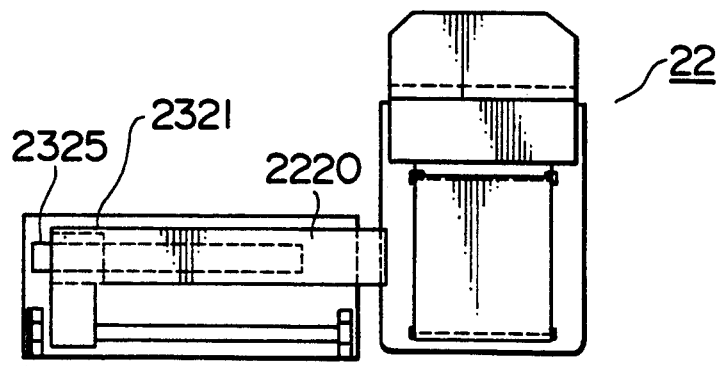

As shown in FIGS. 18a, 18b and 18c, a pallet supply station 22 has a vertically movable slide unit 2200 attached to a stationary base 2210 which is in turn fixed to the base bench 10. A magazine holder 2205 for detachably holding a guide 2206 for guiding a magazine 21 to a predetermined position is fixed to a slide table 2204 of the slide unit 2200. The slide table 2204 moves in the vertical direction by a pulse motor 2201 which turns a ball screw (upon a rotation command applied to the pulse motor). With the above arrangement, when the pulse motor is rotated by a predetermined angle to vertically move the slide table 2204, the magazine 21 can be moved in the vertical direction by a predetermined amount. This vertical movement of the magazine 21 is set to an amount (i.e., a pitch of grooves 2102(a) and 2102(b) in the magazine 21) necessary for taking out pallets 20 stored in the magazine 21 one by one.

A guide rail 2325 and an air cylinder 2222 are fixed to a support base 2224 which is in turn fixed to the base bench 10, and a slider 2321 slidably engaged with the guide rail 2325 is horizontally moved by the air cylinder 2222 for taking out the pallet 20 in the magazine 21. A push plate 2220 adapted to push the pallet 20 outwardly is fixed to the slider 2321.

With the above arrangement, the pallet 20 stored in the magazine 21 is vertically moved by applying the rotation command to the pulse motor 2201 to reach the same level as the push plate 2220. At the time when the pallet 20 (the semiconductor device 1) is required by an X-Y table 23, the push plate 2220 is advanced (as indicated by dot lines) by the air cylinder 2222 to push out the pallet 20 on to the X-Y table 23. When the next pallet 20 is required, the pulse motor 2201 is rotated to vertically move the magazine 21 so that the next pallet 20 is aligned with the push plate 2220. Then, the air cylinder 2222 is actuated to push out that pallet 20 onto the X-Y table 23. In this way, the pallets 20, each having a number of semiconductor devices 1 therein are stacked within the magazine 21 in multiple stages and, when the next pallet 20 is required (i.e., when the semiconductor devices in the pallet 20 currently on the X-Y table 23 are all depleted), the pallets 20 are successively supplied to the X-Y table 23 in an automatic manner. Therefore, it is possible to continuously supply the semiconductor devices for a long period of time.

Figure 19A:
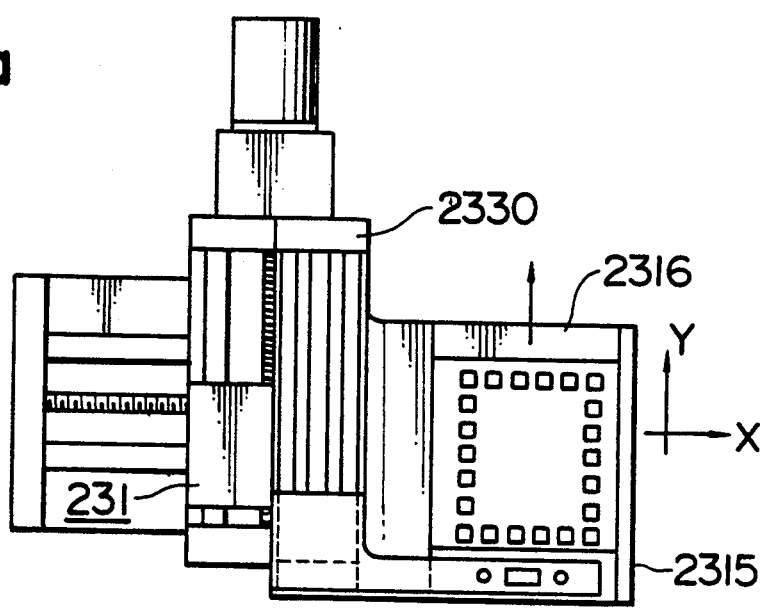
FIGS. 19a, 19b and 19c are views showing an X-Y table for moving the pallet in the X and Y directions.
Figure 19B:
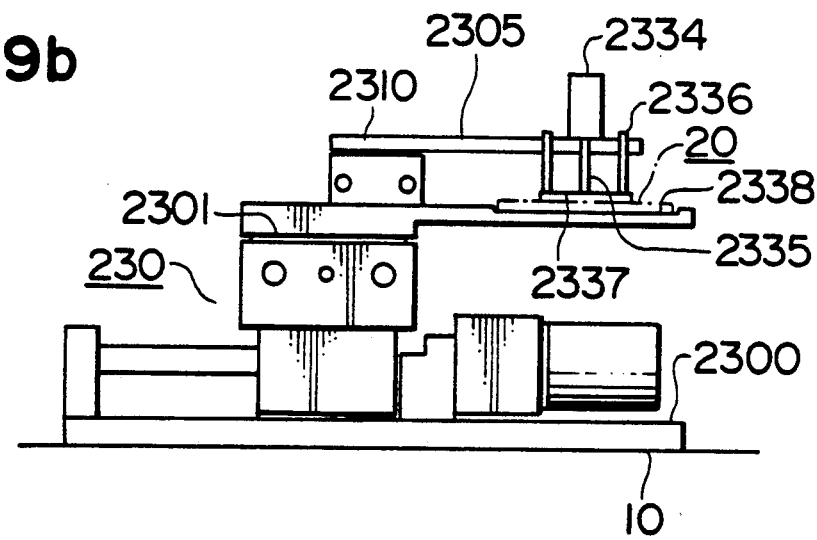
Figure 19C:
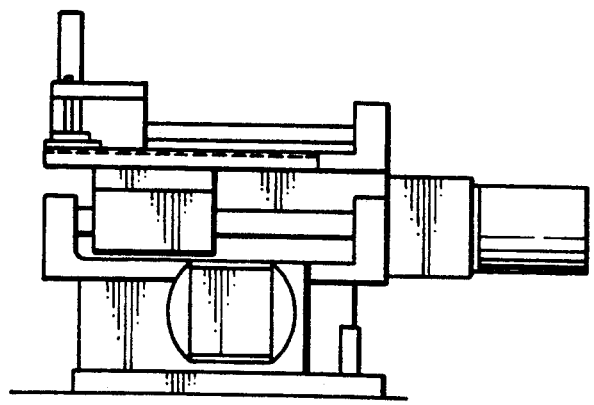

As shown in FIGS. 19a–19c, the X-Y table 23 has a commercially available X-Y table 230 fixed to a base plate 2300, which is in turn fixed to the base bench 10, and movable horizontally in the X and Y directions by actuating a pulse motor to move a ball screw. To a movable table 2301 of a Y-table 231 of the X-Y table 230, there are fixed a pallet receiving base 2315 having a groove 2316 into which the pallets 20 penetrate slidably, and an air cylinder unit 2330 having two guide shafts and movable horizontally therealong. A horizontal plate 2305 is fixed to a horizontally movable slider 2310 of the air cylinder unit 2330, and a pad plate 2337 is fixedly connected to the lower ends of shafts 2336 fitted through the horizontal plate 2305 in a vertically movable manner and the lower end of a rod 2335 of a central air cylinder 2334 (fixed to the horizontal plate 2305). With such an arrangement, the pad plate 2337 can be moved in the vertical and Y-directions by actuating the respective air cylinders. In this respect, an amount of vertical movement of the pad plate 2337 is selected such that when the pad plate 2337 is lifted, it is positioned so that it does not interfere with the pallet 20 at the time the pallet 20 is transferred by the pallet supply station 22 onto an upper surface 2338 of the pallet receiving base 2315, and when the pad plate 2337 is lowered, it takes a level which does not interfere with the upper surface 2338 of the pallet receiving base 2315 at the time the pad plate is moved horizontally. A distance of horizontal movement of the pad plate 2337 is selected such that it can be moved by the air cylinder unit 2330 in the Y-direction through the distance enough to transfer the pallet 20 to a palette discharge station 25.

Note that when the pallet 20 is transferred from the pallet supply station 22 is rested on the pallet receiving base 2315, it is fixed in a certain position by some means (not shown).

With the above arrangement, the pallet 20 is transferred from the pallet supply station 22 to enter the groove 2316 on the pallet receiving base 2315 of the X-Y table 23, whereby the pallet is positioned and fixed. Then, the pallet 20 is moved by the X-Y table 230 in the X and Y directions by a predetermined amount (depending on the position of each semiconductor device placed in the pallet 20). Because a semiconductor device supply station 24 for taking the semiconductor devices out of the pallet 20 on the X-Y table 23 one by one and supplying it to the turntable station (A) 26 has a fixed device receiving position, the pallet 20 must be moved by the X-Y table 23 for enabling the semiconductor device supply station 24 to take the semiconductor devices out of the pallet 20. With such movement in the X and Y directions, the semiconductor devices 1 can be taken out of the pallet 20 by the semiconductor device supply station 24 one by one.

When the semiconductor devices 1 in the pallet 20 are all depleted, the air cylinder unit 2330 is actuated to transfer the emptied pallet 20 by the pad plate 2335 (now in a lowered position) to the pallet discharge station 25, and the fresh pallet 20 (having the semiconductor devices) is transferred from the pallet supply station 22 onto the X-Y table 23.

As seen from FIG. 13, the pallet discharge station 25 is mechanically almost the same as the pallet supply station 22 shown in FIGS. 18a–18c (except that the pallet discharge station 25 includes no mechanism for sending out the pallet 20). Specifically, the pallet discharge station 25 is arranged such that the slide unit 2220 is movable in the vertical direction and detachably holds the magazine 21, in which the pallets 20 are to be placed, and the slide unit 2220 is vertically moved by a pulse motor to place the pallets 20 transferred from the X-Y table 23 into the grooves 2101(a), 2101(b) of the magazine 21 stage by stage.

With the above arrangement, the pallets 20 emptied on the X-Y table 23 (after the semiconductor devices have been all taken out by the semiconductor device supply station 24) are stored back in the magazine 21 by automatically moving the magazine 21 up and down (in response to a command from the not-shown control station).

Figure 20A:
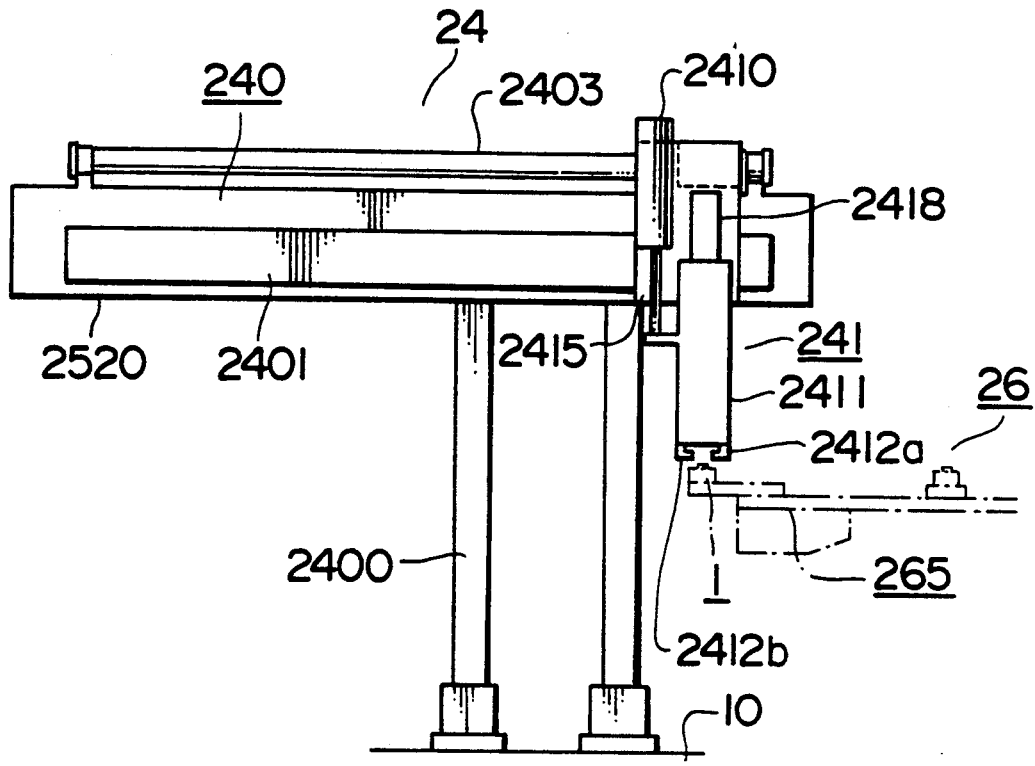
FIGS. 20a and 20b are views showing a semiconductor device supply station for conveying the workpieces to be processed.
Figure 20B:
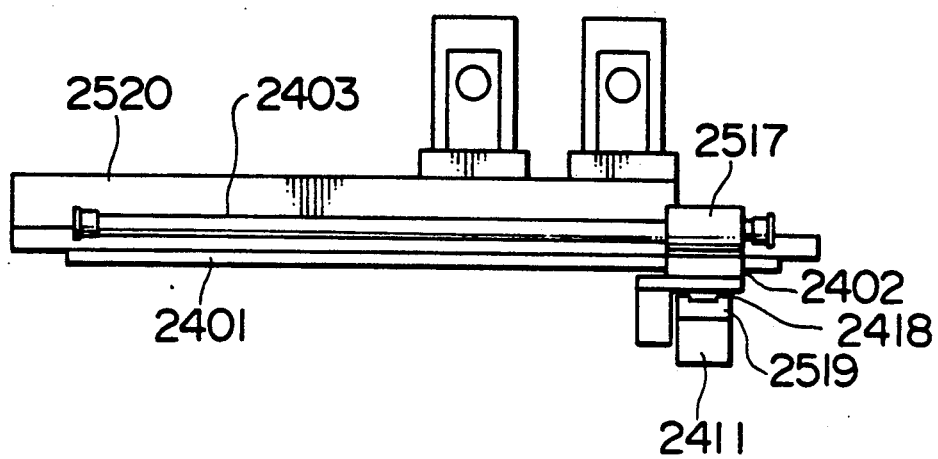

As shown in FIGS. 20a and 20b, the semiconductor device supply station 24 comprises a horizontally moving section 240 movable in the horizontal direction, a vertically moving section 241 movable in the vertical direction, and a stationary base 2520 supported by two square posts 2400 (in turn fixed to the base bench 10). The horizontally movable section 240 has a guide rail 2401 and an air cylinder 2403 both fixed to the stationary base 2520 substantially in parallel to each other. A slide table 2402 horizontally slidably fitted with the guide rail 2401 and a slider 2517 of the air cylinder 2403 are fixedly joined to each other. Therefore, the slide table 2402 can be moved horizontally along the guide rail 2401 upon a movement command applied to the air cylinder 2403 from the control station (not shown).

On the other hand, the vertically movable section 241 is mounted on the slide table 2402. More specifically, a guide rail 2418 is vertically fixed to the slide table 2402, and an air chuck 2411 is fixed to a vertical table 2519 fitted with the guide rail 2418 in a vertically slidable manner. The air chuck 2411 can be a commercially available one which is opened and closed upon the supply or release of compressed air, and has at its distal end a pair of pawls 2412(a), 2412(b) capable of selectively opening and closing to grasp the semiconductor device 1 at the outer periphery thereof. The air chuck 2411 is connected to a rod 2415 of an air cylinder 2410 for vertical movement which is also fixed to the slide table 2402.

With the above arrangement, the air chuck 2411 for grasping the semiconductor device 1 can be moved vertically and horizontally.

The horizontal movement of the air chuck 2411 has a stroke between one end above the semiconductor device 1 placed in the pallet 20 on the X-Y table 23 and the other end above a head section 265 of the turntable station (A) 26 onto which the semiconductor device 1 is to be transferred. Such a horizontal stroke can be performed in response to an operation command applied to the air cylinder 2403 from the control station (not shown). Meanwhile, the air cylinder 2410 moves the air chuck 2411 in the vertical direction. With cooperation of the air cylinder 2403 and the air cylinder 2410, therefore, the semiconductor device 1 can be grasped by the air chuck 2411, lifted off from the X-Y table 23, and then conveyed until the turntable station (A) 26 where the air chuck 2411 is lowered and opened to transfer the semiconductor device onto the head section 265.

As shown in FIG. 13, FIGS. 21a and 21b, and FIGS. 22a–22c, the turntable station (A) 26 comprises a rotation drive section 260, a rotary table section 261, and head sections 265.

Figure 21A:
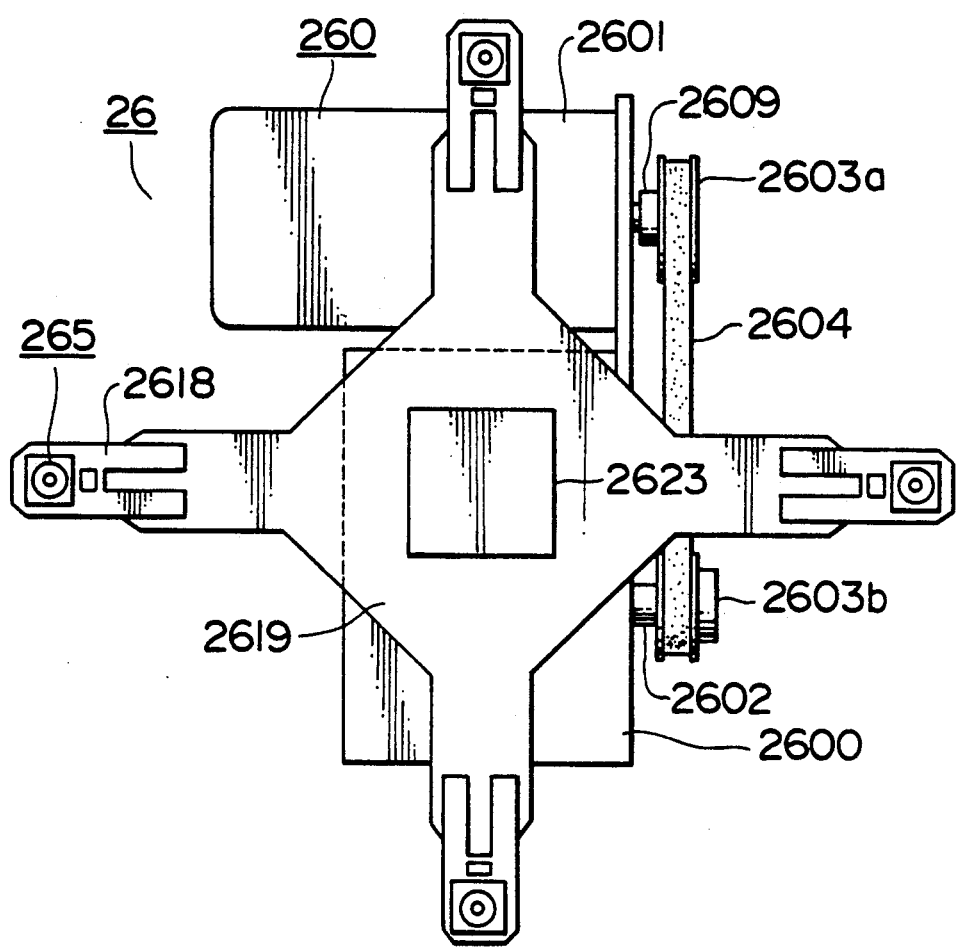
FIGS. 21a and 21b are views showing a turntable station (A) for suction and conveying the workpieces to be processed.
Figure 21B:
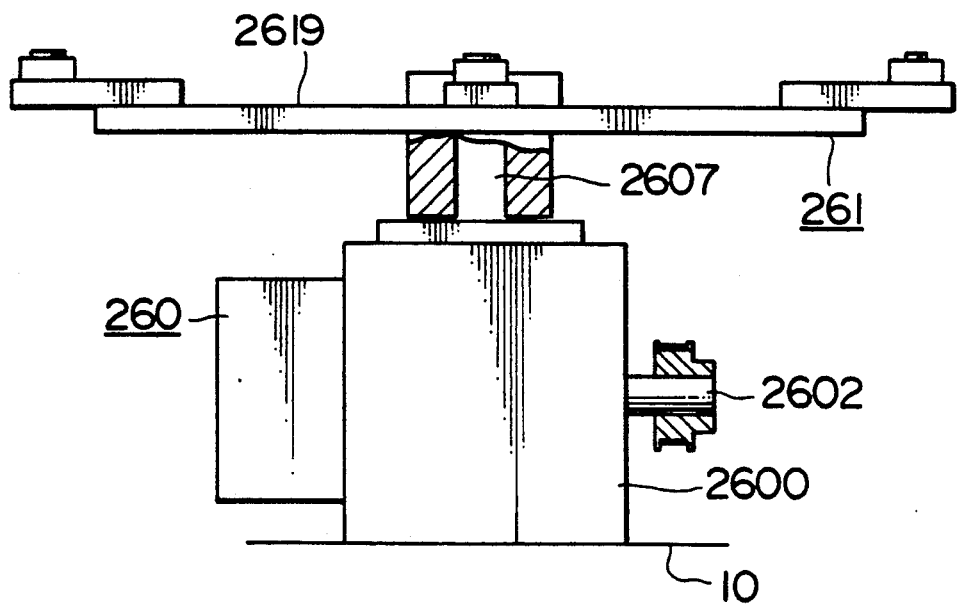

The rotation drive section 260 comprises, as shown in FIG. 21a, a commercially available index unit 2600 of four-index type, a motor 2601, timing pulleys 2603(a), 2603(b) respectively secured to a rotary shaft 2609 of the motor 2601 and an input shaft 2602 of the index unit 2600 by any suitable means (not shown), and a timing belt 2604 coupling between the timing pulleys 2603(a) and 2603(b). Accordingly, by applying a rotation command to the motor 2601 from the control station (not shown) so as to rotate the input shaft 2602 of the index unit 2600 once, an output shaft 2607 of the index unit 2600 in FIG. 21b is turned through 90 degrees. With the rotation and stop commands applied to the motor 2601 repeatedly, the output shaft 2607 of the index unit 2600 can be turned intermittently in units of 90 degrees. Since the motor can be controlled using any suitable technique (not shown) such that it is made operative and inoperative respectively upon the rotation and stop commands set to be issued at any desired time, it is possible to optionally set the start and stop of the intermittent rotation of the output shaft 2607.

Figure 22A:
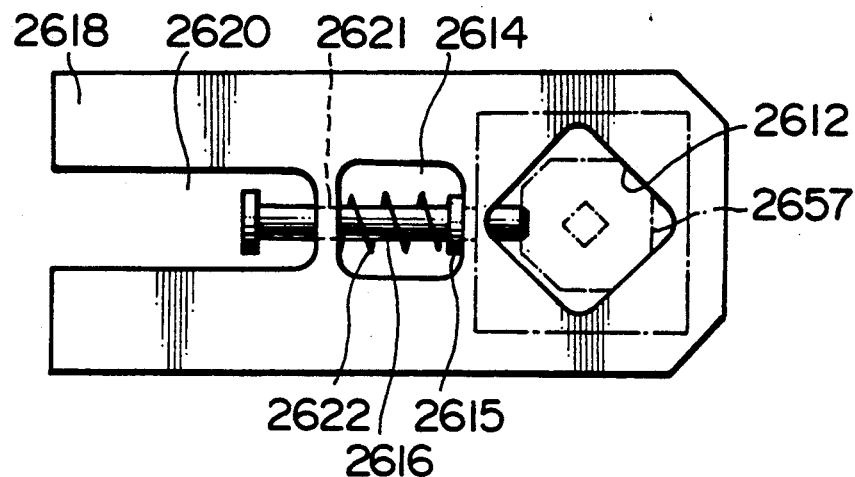
FIGS. 22a, 22b and 22c are detailed views of a head section of the turntable station (A)
Figure 22B:
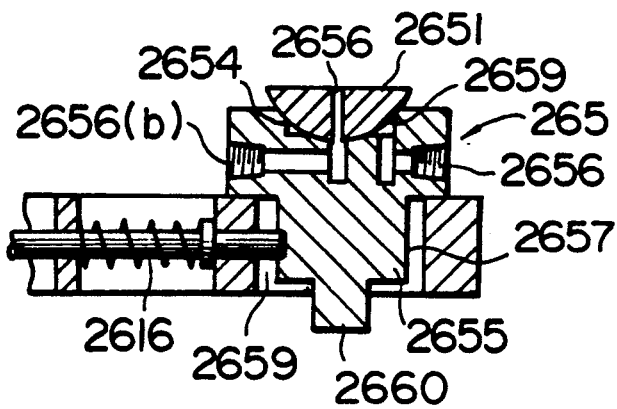
Figure 22C:
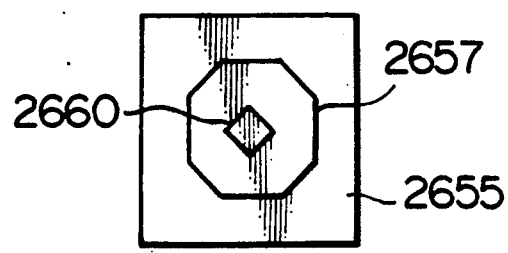

The head section 265 is shown in FIG. 22b. A head body 2655 has a semispherical hole 2659 formed therein such that a semispherical body 2651 can be placed in the semispherical hole 2659 in close contact relation (i.e., the semispherical body is placed in and rubbed against the semispherical hole). A groove 2654 is defined in a part of the semispherical hole 2659 and connected to a suction port 2656(a) (in communication with suction means). When the suction means is actuated to suction air through the suction port 2656(a), the semispherical body 2651 is firmly suctioned to the head body 2655.

Meanwhile, a through hole 2656 is bored at the center of the semispherical body 2651 and connected to a suction port 2656(b) (in communication with the suction means). When the suction means is actuated to suctioned air through the suction port 2656(b), a suction force is developed in the through hole 2656. The semiconductor device 1 transferred by the semiconductor device supply station 24 is rested on the semispherical body 2651 to be firmly suctioned via the through hole 2656.

With such an arrangement, when the semiconductor device 1 is rested on the semispherical body 2651, it is firmly sucked and held in place under the action of the suction means. Also, when the biasing load is applied to the semiconductor device 1 from the exterior, the semispherical body 2651 is inclined corresponding, and when the biasing lad is eliminate, the semispherical body 2651 is held on the head body 2655 with the suction force (developed by the suction means) with the semispherical body 2651 being in an inclined state.

The head body 2655 has a lower portion 2657 shaped to be in match with a square hole (a) 2612 as shown at a one-dot chain line in FIG. 22a, the square hole (a) 2612 having it diagonal lines coincident with the orthogonal axes of a rotary table (A) 2619 in the directions. A shaft 2616 has its tip end penetrated into a cutout hole 2659 of the head body 2655, as shown in FIG. 22b, and a compression spring 2622 fitted around the shaft 2616 to one-sidedly urge and position the lower portion 2657 of the head body 2655 against the two outer sides of the square hole (a) 2612. When detaching the head section 265 from the rotary table section 261, the shaft 2616 is retracted by any not-shown suitable means (while compressing the compressing spring 2622) and a bottom portion 2660 of the head body 2655 is grasped for lifting off.

As explained above the turntable station (A) 26 operates to receive the semiconductor device 1 form the semiconductor device supply station 24, hold the semiconductor device in place under suction (or, when the semiconductor device is inclined by an external force at a free angle, maintain it in that inclined state), and perform rotation and stoppage of the rotary table (A) 2619 intermittently in units of 90 degrees with predetermined intervals.

As shown in FIG. 21b, the rotary table section 261 has the rotary table (A) 2619 rigidly fixed to the output shaft 2607 of the index unit 2600 by any suitable means (not shown) for the purpose of the foregoing intermittent rotation. A head mount base 2618 is mounted to the rotary table (A) 2619 at each of positions dividing the circumference thereof into quarters.

In the head mount base 2618, there are defined the square hole (a) 2612 having it diagonal lines coincident with the orthogonal axes of the rotary table (A) 2619 in the directions and also receiving the head section 265 (see FIG. 22a),a square hole (b) 2614 coaxially lying on an extension of the diagonal line of the square hole (a) 2612, but turned by 90 degrees relative to the square hole (a) 2612 in the horizontal plane, and a cutout slot 2620. A through hole 2621 is bored along the axis of the rotary table (A) 2619 coupling the square hole (a) 2612, the square hole (b) 2614 and the cutout slot 2620. The shaft 2616 provided with a flange 2615 is inserted to the through hole 2621, and the compression spring 2622 is fitted around the shaft 2616 to press the shaft 2616 outwardly of the rotary table (A) 2619.

A distributing valve 2623 connected to vacuum suction means (not shown) is provided at the center of the rotary table (A) 2619 for applying suction forces to the respective head sections 265. In this way, the head section 265 is rotated by the index unit 2600 intermittently in units of 90 degrees to be held at predetermined positions for transferring the semiconductors 1 to the respective stations.

A glass jig supply/discharge station 30 comprises a discharge section 301, a handling section 304, a supply section 307, and a glass jig magazine 308, as shown in FIG. 13, FIGS. 23a-23c and FIG. 24.

Figure 24:
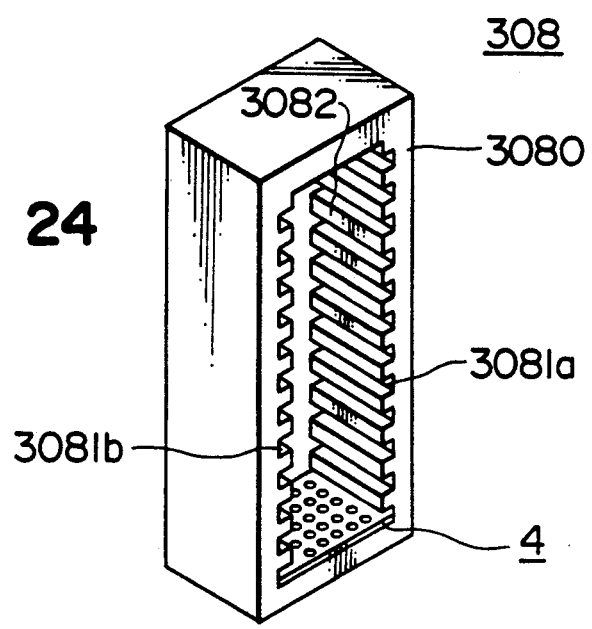
FIG. 24 is a perspective view showing a glass jig magazine in the glass jig supply and discharge station.

The glass jig magazine 308 comprises, as shown in FIG. 24, a magazine body 3080 which has several tens stages of opposite grooves 3081(a), 3081(b) with predetermined pitch and width allowing both ends of the glass jig 4 to enter and slide into the grooves. An open space 3082 is defined between the opposite grooves 3081(a) and 3081(b) of the magazine body 3080, and has the size slightly larger than the outer dimension of the glass jig 4 so that the glass jig 4 may come into and out of the grooves.

Figure 23A:
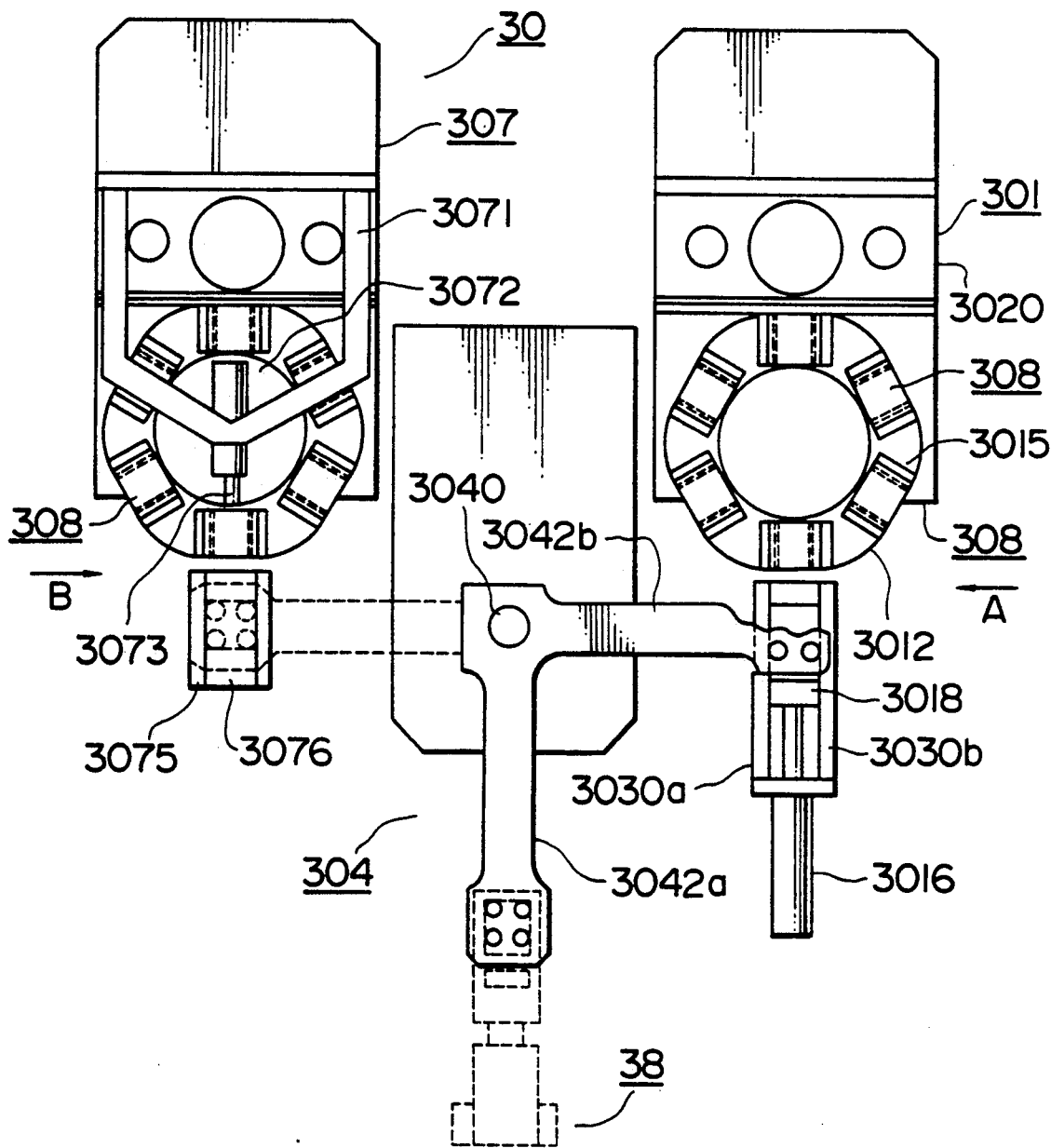
FIG. 23a is a front view showing a glass jig supply and discharge station for replacing the glass jig on which the solder bolls are to be placed.
Figure 23B:
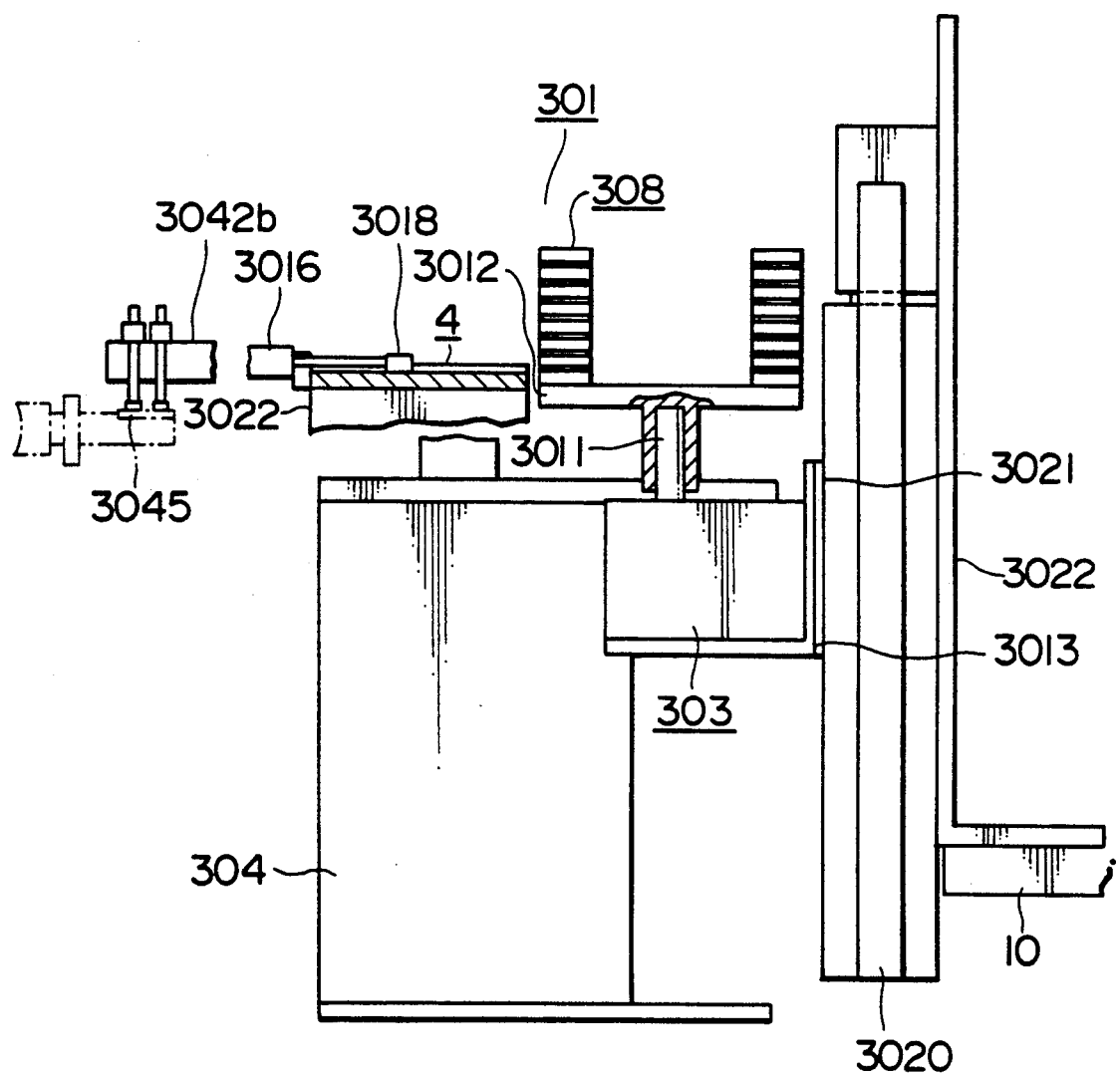
FIG. 23b is a side view of the glass jig supply and discharge station.

The discharge section 301 shown in FIG. 23b includes a commercial available slide unit 3020 which is fixed to the base bench 10 via a support base 3022 and has a slide base 3021 vertically movable with a ball screw turned upon a rotation command applied to a pulse motor from the control station (not shown). Further, the slide base 3021 has a securing base 3013 to which a commercially available index unit 303 is fixed. In response to rotation and stop commands applied to a motor (not shown), a rotary shaft 3011 of the index unit 303 can be rotated (now in units of 60 degrees) and stopped intermittently. A rotary table 3012 is fixed to the rotary shaft 3011 to be rotated intermittently therewith, the rotary table 3012 having guide plates 3015 into which the glass jig magazines 308 can be placed in a removable manner and which are arranged at six positrons concentrically about the rotary shaft 3011 with equal angular intervals therebetween.

With the above arrangement, the glass jig magazines 308 removably held on the rotary table 3012 at the six positions are automatically moved up and down at a predetermined pitch (corresponding to the intervals between the adjacent two glass jigs in each glass jig magazine), and also rotated and stopped in units of 60 degrees successively as required.

When placing the glass jig 4 into the glass magazine 308 in the discharge section 301, the glass jig 4 transferred by a handling section 304 (from the turntable station (B) 38 is put on a glass jig rest 3022 (fixed to the base bench 10) which as at the opposite ends a pair of guides 3030(a), 3030(b) with a width allowing the glass jig 4 to horizontally move therebetween. A plush plate 3018 is provided to be slidable along the center between the guides 3030(a) and 3030(b) by operation of an air cylinder 3016. Therefore, upon advance of the push plate 3018, the glass jig is pushed into the discharge section 301 (i.e., into the grooves 3081(a), 3081(b) of the glass jig magazine 308).

With the above arrangement of the discharge section 301, the glass jigs 4 transferred by the handling section 304 from the turntable station (B) are pushed into the glass jig magazine 308 one by one. In this respect, after one glass jig 4 has been placed in the glass jig magazine 308, the slide unit 3020 is actuated to lower the glass jig magazine 308 so that the next glass jig 4 may be pushed into the upper stage of grooves 3081(a), 3081(b) of the glass jig magazine 308. If all the stages of grooves are filled with the glass jigs, the index unit 303 is rotated with one index to make another empty glass jig magazine ready for receiving subsequent glass jigs. Such a step is repeated six times. It is therefore possible to accommodate a number of glass jigs successively for a long period of time. The foregoing operations are all carried out in a successive manner.

Figure 23C:
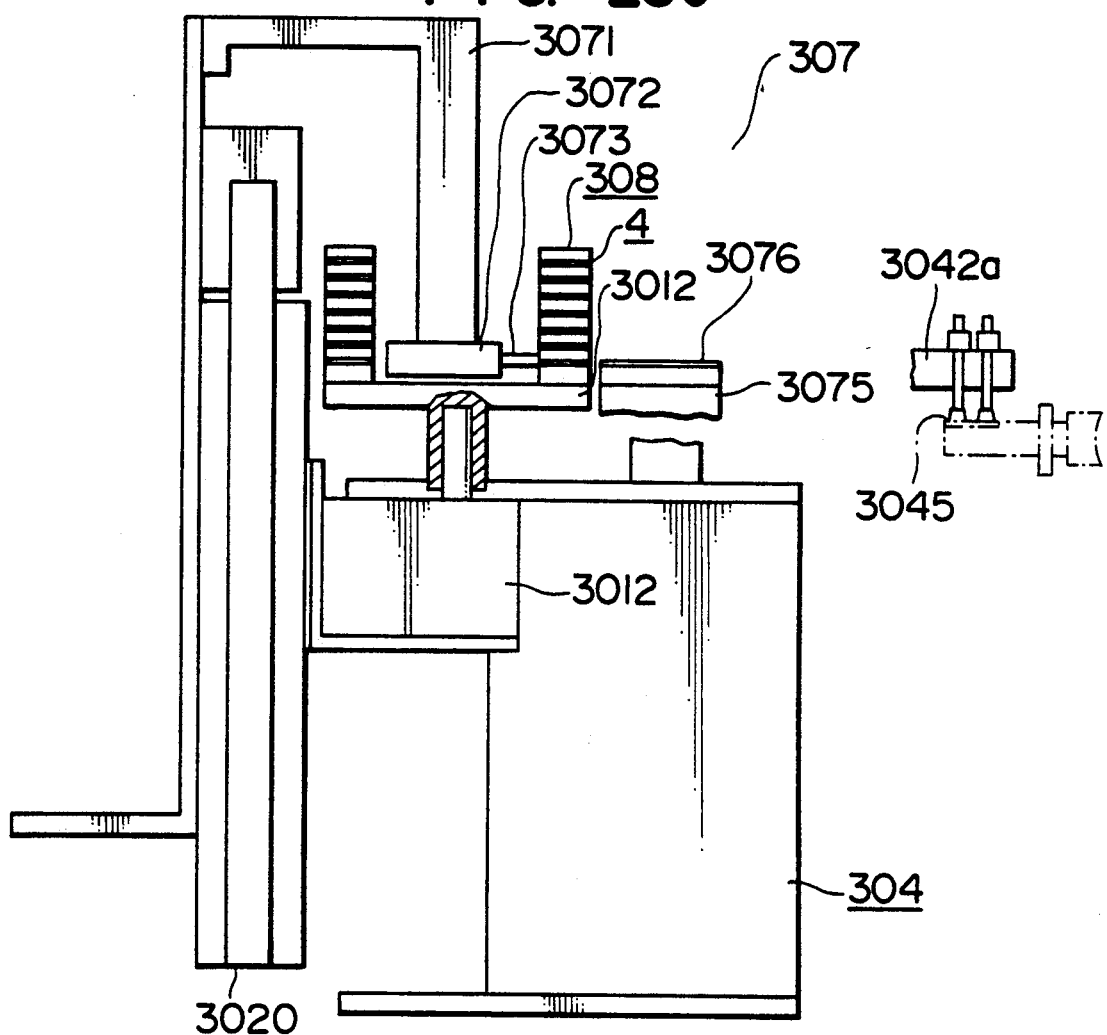

The supply section 307 shown in FIGS. 23a and 23c has almost the same structure as the discharge section 301. Thus, it has a rotary table 3012 which enables the glass jig magazines 308 thereon to be moved vertically and rotated intermittently. However, the glass jig magazines 308 in the supply section 307 are all filled with the glass jigs 4 (for replacement).

More specifically, an air cylinder 3072 is fixed to a support base 3071, in turn fixed to the base bench 10, and is disposed near the center of the rotary table 3012. A rod 3073 of the air cylinder 3072 is horizontally moved to push the glass jig 4 in the glass jig magazine 308 outwardly. The glass jig 4 thus pushed out enters a groove 3076 of a guide stand 3075 (fixed to the base bench 10) provided in a position facing the rod 3073. After one glass jig 4 has been taken out of the glass jig magazine 308 in this way, the rotary table 3012 is vertically operated in a like manner to the above case, so that the glass jig magazine is moved to a position where the next glass jig can be taken out therefrom. After all the glass jigs have been drawn out of one glass jig magazine 308, the rotary table 3012 is rotated with one index to position the next glass magazine facing the guide stand 3075. The above steps are automatically repeated until all the glass jigs set on the rotary table are depleted.

The handling section 304 has two arms 3042(a), 3042(b) of which stop positions are set as follows. Initially, one arm is located just above but spaced by a predetermined distance from a position capable of taking out the glass jig 4 on the turntable station (B) 38, and the other arm is located just above but spaced by a predetermined distance from the glass jig 4 having been pushed onto the guide stand 3075 of the supply section 307. Afterward, in response to a command from the control station (not shown), the two arms 3042(a), 3042(b) are lowered to suction the glass jigs 4 by respective suction pads 3045 provided thereon. The arms 3042 are then lifted, swung and lowered again so that one glass jig is transferred to the turntable station (B) 38 and the other is transferred to the discharge section 301. By repeating the above steps, the glass jigs are replaced one by one.

The handling section 304 comprises a pick-and-place unit 3041 having a shaft 3040 which can be moved up and down and swung through 90 degrees repeatedly upon the supply of compressed air. A swing arm body 3043 having the two arms 3042(a), 3042(b) angularly spaced by 90 degrees from each other is fixed to the shaft 3040. A plurality of suction pads 3045 are attached to each distal end portion of the arms 3042(a), 3042(b) and are selectively connected to suction means (not shown) through the shaft 3040. When the suction pads 3045 are connected to the suction means, the glass jig 4 is firmly sucked at its central portion by the suction pads 3045. After lifting, swinging (through 90 degrees) and lowering the glass jig by an operation of the swing arm body 3043, the suction pads 3045 are disconnected from the suction means by any suitable means (not shown) to eliminate the suction force (so that the glass jig is detached from the arms). The above steps are repeatedly carried out in an automatic manner.

As explained above, the glass jig supply/discharge station 30 serves to pick up the glass jig 4 (having been used once or several times) out of the turntable station (B) 38 and replace it with a new one. It is apparent that if the glass jig 4 is not contaminated during the bump forming process or so of the semiconductor device 1, there is no need of employing the glass jig supply/discharge station 30.

Figure 25A:
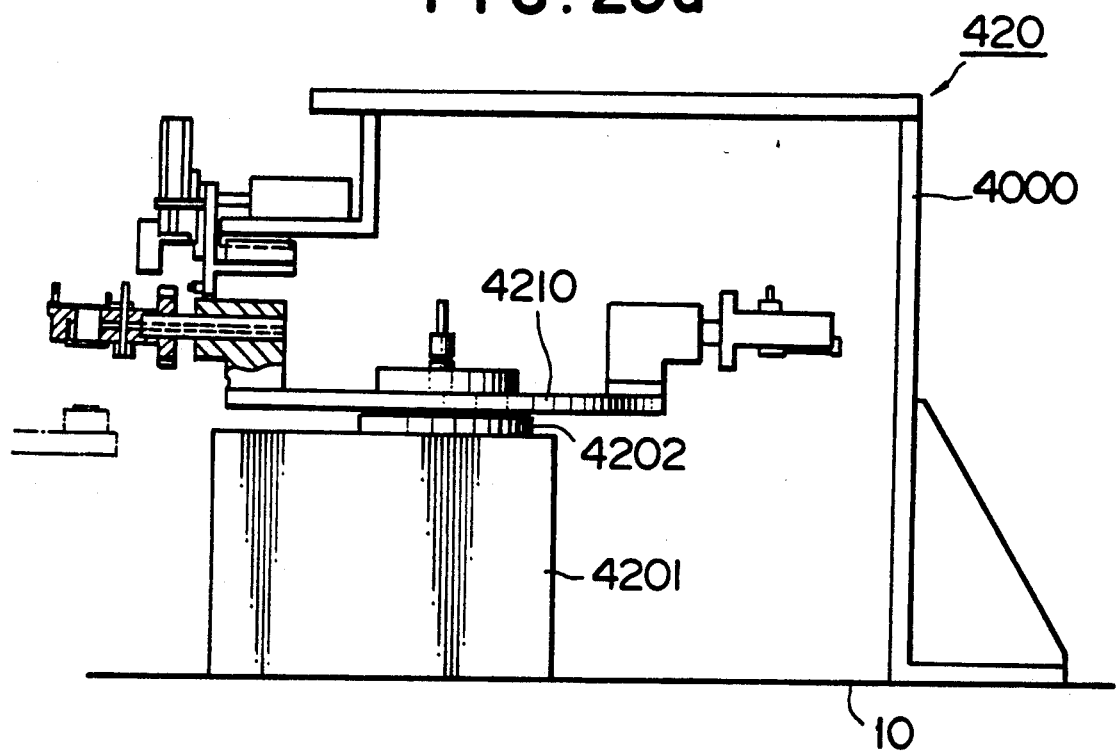
FIG. 25a is a side view showing a turntable station (B) for suction and conveying the glass jigs.
Figure 25B:
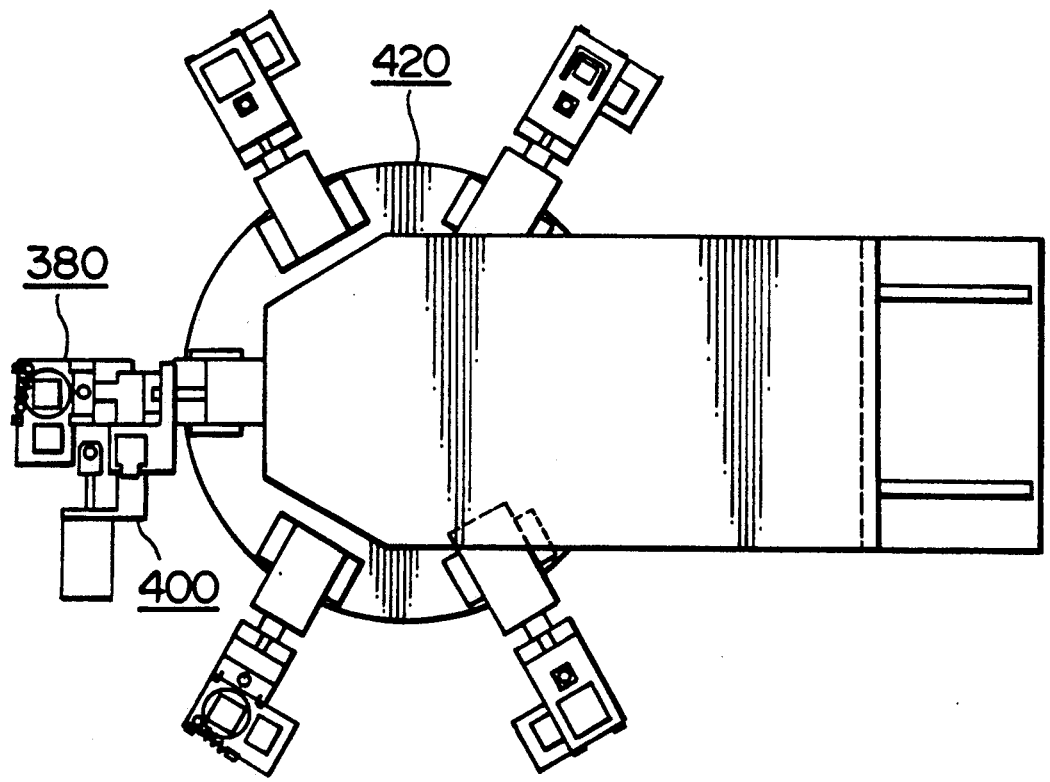
FIG. 25b is a plan view of the turntable station (B)
Figure 26A:
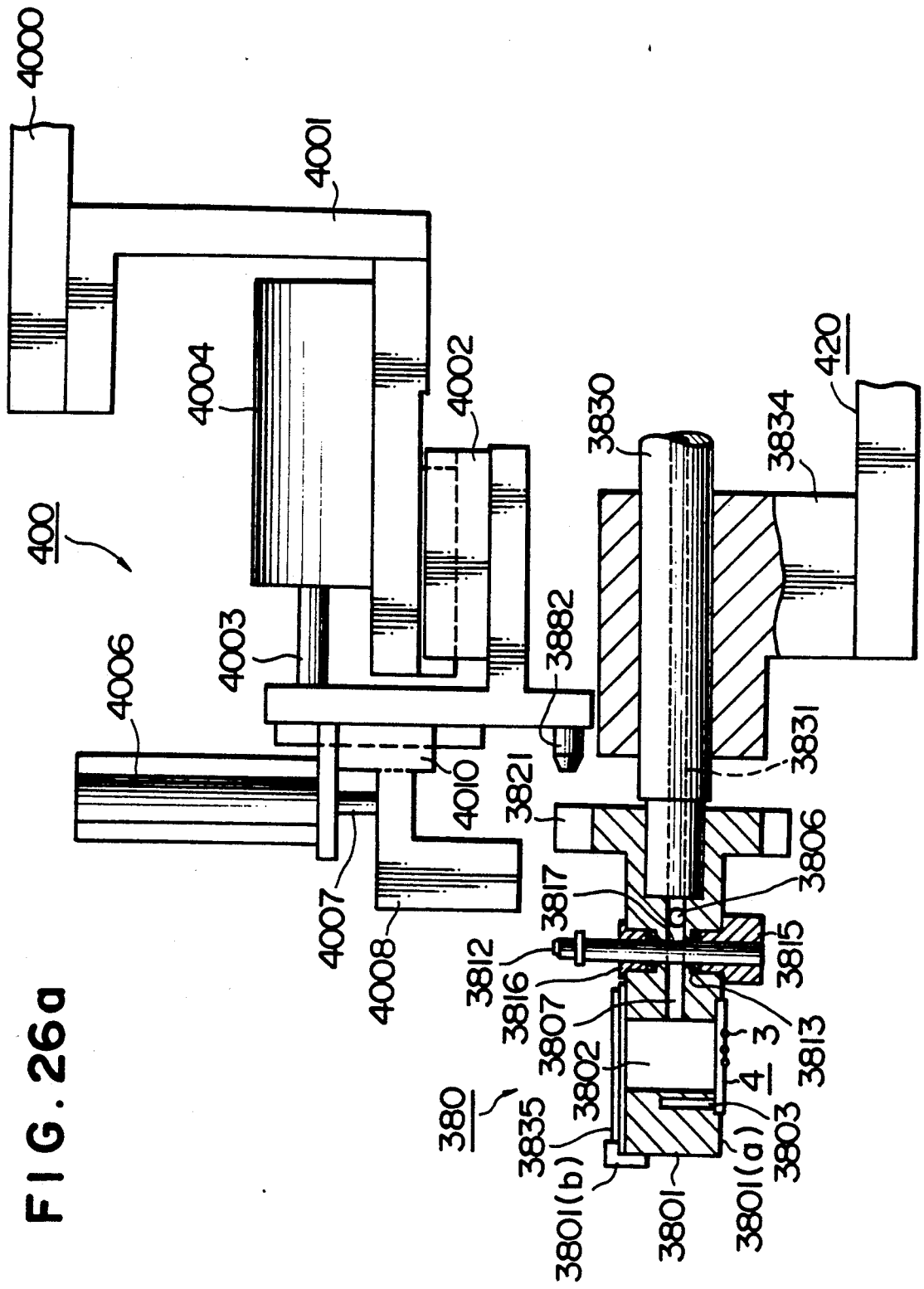
Figure 27A:
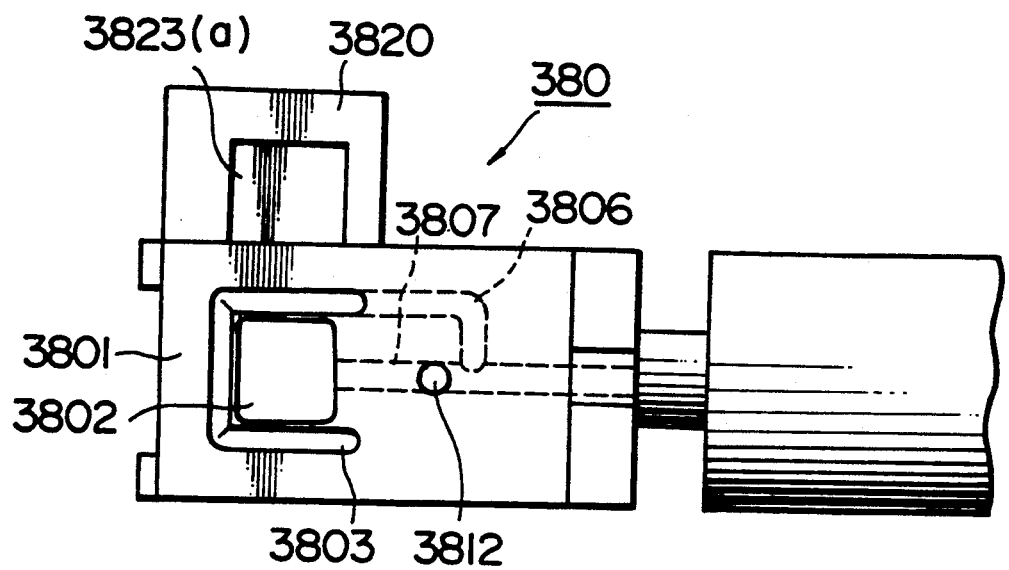
FIG. 27a is a plan view of the head section.
Figure 27B:
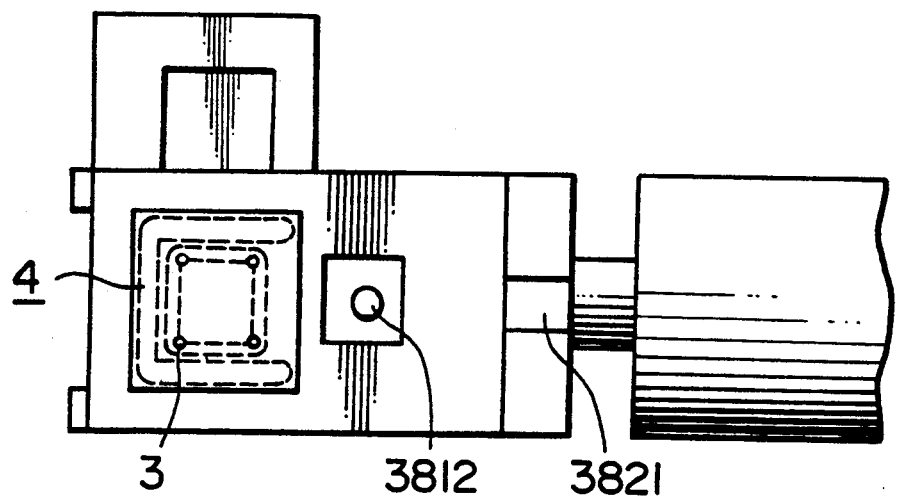
FIG. 27b is a bottom of the head section.

As shown in FIG. 13, FIGS. 25a and 25b, FIGS. 26a and 26b, as well as FIGS. 27a and 27b, the turntable station (B) 38 comprises head sections 380, a vacuum switching section 400, and a rotary table section 420.

The head section 380 has a square pillar 3801, as shown in FIG. 27a, in which there are defined a square hole (A) 3802 penetrating through the square pillar 3801, and a substantially C-shaped groove 3803 surrounding the square hole (A) 3802 and recessed from the surface of the square pillar 3801 with a predetermined depth. The square hole (A) 3802 and the groove 3803 communicate with suction means (not shown) through a flow passage (A) 3806 and a flow passage (B) 3807, respectively. The size of the square hole (A) 3802 is smaller than the glass jig 4, but larger than the area wherein the solder balls 3 are arrayed on the glass jig 4. The size of the substantially C-shaped groove 3803 is larger than the square hole (A) 3802, but smaller than the outer dimension of the glass jig 4.

Further, a vacuum switching shaft 3812 is provided at a particular position in the flow passage (B) 3807 in a vertically movable manner with a pair of O-rings 3813 secured in place by bushings 3815, 3816 on the upper and lower sides of the flow passage (B) 3807. By vertically shifting the shaft 3812, the square hole (A) 3802 and the groove 3803 are selectively connected to or disconnected from the suction means. In the condition of FIG. 26a, for example, the square hole (A) 3802 and the groove 3803 are both communicated with the suction means via the flow passage (B) 3807 and the flow passage (A) 3806, respectively, and then via a small hole 3817 bored through the shaft 3812 and a hole 3831 bored through a rotary shaft 3830 in common. When the shaft 3812 is lowered from the above condition, the small hole 3817 of the shaft 3812 is blocked off, whereby the square hole (A) 3802 and the groove 3803 are both disconnected from the suction means.

Also as shown in FIG. 26a, one surface 3801(a) of the square pillar 3801 is flat and has formed therein the substantially C-shaped groove 3803 (see FIG. 27a). On the other surface 3801 (b) of the square pillar 3801 parallel to one surface 3801(a), there is rested a flat plate 3820 having a square hole (B) 3823(a) and a square hole (C) 3823(b), each having the same size as the aforesaid square hole (A) 3802, with a predetermined pitch therebetween, the square hole (C) 2823(b) being covered with a sheet of transparent glass 3827 bonded in place (see FIG. 26b). There are also provided a guide plate 3821 for guiding the flat plate 3820 in a slidable manner, a tension spring 3825 for pulling the flat plate 3820 in one direction, a pair of spring latched 3826(a), 3826(b) to which both ends of the spring 3825 are respectively latched, and a pin 3822 used when sliding the flat plate 3820. The flat plate 3820 is normally biased by the tension spring 3825 so that the square hole (C) 3823(b) covered with the sheet of transparent glass 3827 agrees with the square hole (A) 3802 of the square pillar 3801. With such an arrangement, when the glass jig 4 with the solder balls 3 loaded therein is placed on the surface 3801(a) and the flow passages 3806, 3807 shown in FIGS. 26a and 27a are connected to the suction means, the space in the square hole (A) 3802 is evacuated into a vacuum to such the glass jig 4 along with the solder balls 3. Meanwhile, when the flat plate 3820 shown in FIGS. 26b and 27a is moved via the pin 3822 under control of the vacuum switching section 400 (described later) so that the square hole (C) 3823(b) now agrees with the square hole (A) 3802 of the square pillar 3802, the square hole (A) 3802 is open to the atmosphere and released from a vacuum state. In addition, as shown in FIG. 26a, the square pillar 3801 is provided on both the surfaces 3801(a), 3801(b) thereof with positioning guides which have positioning slots 3821 in diametrically opposite relation. While a positioning pin 3882 of the vacuum switching section 400 is fitted in the positioning slot 3821, the surfaces 3801(a), 3801(b) of the square pillar 3801 are kept in certain flat planes at all times. The square pillar 3801 is fixed by any suitable means (not shown) to the rotary shaft 3830 having the hole 3831 centrally bored therethrough and connected to the suction means, while the rotary shaft 3830 is rotatably supported by a bearing 3834 (in turn fixed to the rotary table section 420).

Moreover, the rotary shaft 3830 is arranged using any suitable means (not shown) such that it can hold the flat surfaces 3801(a), 3801(b) of the square pillar 3801 at a predetermined angular position with a certain retaining force and, when a force in excess of the certain retaining force is applied externally, it can be turned through 180 degrees.

The vacuum switching section 400 comprises a horizontally moving base 4001 fixed to a support base 4000 (in turn fixed to the base bench 10), a commercially available slide table 4002 engaging the horizontally moving base 4001 to be slidable in the horizontal direction, and an air cylinder 4004 mounted on the horizontally moving base 4001 and having a rod 4003 extendible to move the slide table 4002. An air cylinder 4006 and a slide table 4010 both for vertical movement are fixed to the slide table 4002, and the air cylinder 4006 has a rod 4007 coupling between the slide side of the slide table 4010 and an elevatable stage 4008. Accordingly, the elevatable stage 4008 can be moved not only back and forth by the air cylinder 4004, but only in the vertical direction by the air cylinder 4006. When the elevatable stage 4008 is advanced from its retracted position shown in FIG. 26a, the elevatable stage 4008 comes to a position just above the aforesaid vacuum switching shaft 3812 (while it is kept in a lifted state at this time). In response to a descent command, the elevatable stage 4008 is descended to lower the vacuum switching shaft 3812, whereby the square hole (A) 3802 and the groove 3803 are disconnected from the vacuum suction means as mentioned above.

In addition, as shown in FIG. 26b, the elevatable stage 4008 mounts thereon an air cylinder 3840 for moving the aforesaid flat plate 3820 in the head section 380. A hole 3846 bored in an opening/closing block 3845, which is fixed to a rod 3842 of the air cylinder 3840, is fitted over the pin 3842 fixedly provided on the flat plate 3820 (when the elevatable stage 4008 is advanced and descended). Under this condition, the air cylinder 3840 is actuated to move the flat plate 3820 (for making the square hole (A) 3802 open to the atmosphere).

The rotary table drive section 420 shown in FIG. 25a comprises an index unit 4201 of six-index type (one index corresponding to a rotational angle of 60 degrees) which is mounted on the base bench 10 and driven by a commercially available motor to be intermittently rotated upon rotation and stop commands applied to the motor from the control station (not shown), and a rotary table 4210 which is fixed to an output shaft 4202 of the index unit 4201 and has the head sections 380 mounted thereon at positions equally dividing the circumference of the rotary table 4210 into six parts about the output shaft 4202 of the index unit 201. Therefore, the rotary table drive section 420 can repeatedly rotate and stop the head sections 380 fixedly mounted on the rotary table 4210 in units of 60 degrees.

As explained above, the turntable station (B) 38 operates to firmly suction the glass jig 4 (including the solder balls 3) to the head section 380, make the square hole (A) 3802 connected to or disconnected from the suction means and then open to the atmosphere under control of the vacuum switching section 400, and position the head section 380 properly. Moreover, the index unit 4201 operates to intermittently rotate and stop the head sections 380 in units of 60 degrees, thereby delivering the glass jigs to the respective next steps successively.

The aligning station 60 in an overall view (FIG. 13) of the apparatus embodying the present invention will be described below.

Figure 28:
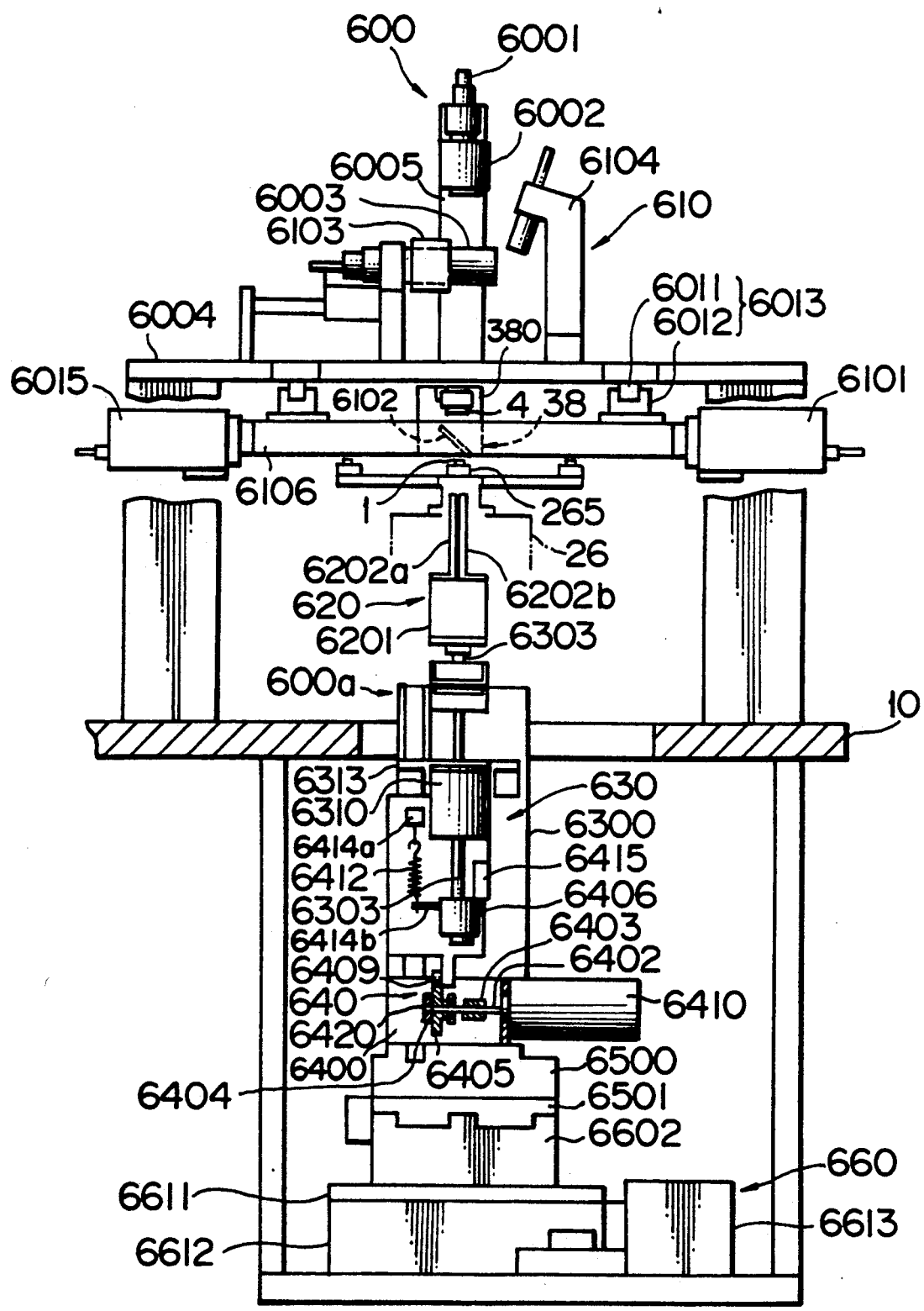

The aligning station 60 for aligning between connecting pads of a chip and solder balls comprises, as shown in FIG. 28, a laser beam irradiator section 600 for irradiating a laser beam, a position offset detector section 610 for detecting a position offset between the solder ball 3 firmly suctioned to the solder ball holder 4 and the connecting pad of the semiconductor device 1, and a positioning section 600a for relatively positioning the semiconductor device 1 and the solder ball holder 4 firmly sucked on the holder turntable station (B) 38.

Figure 31:
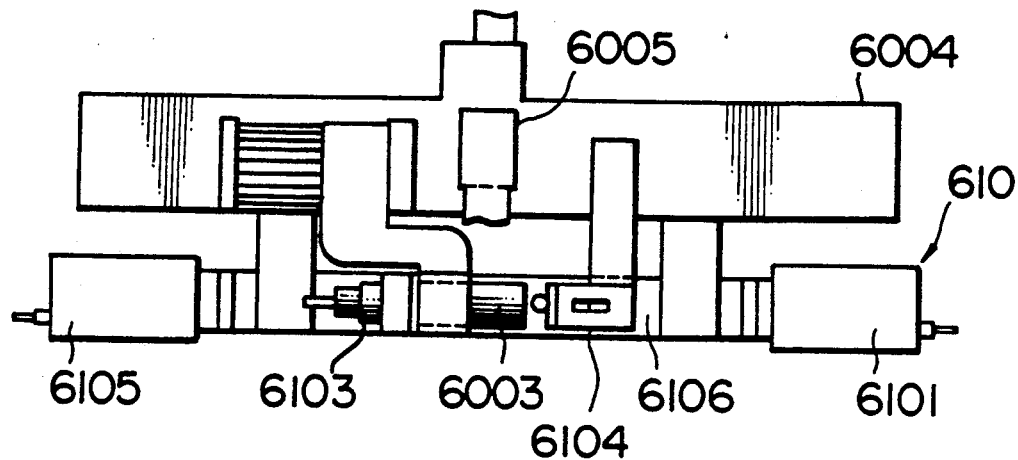
Figure 32:
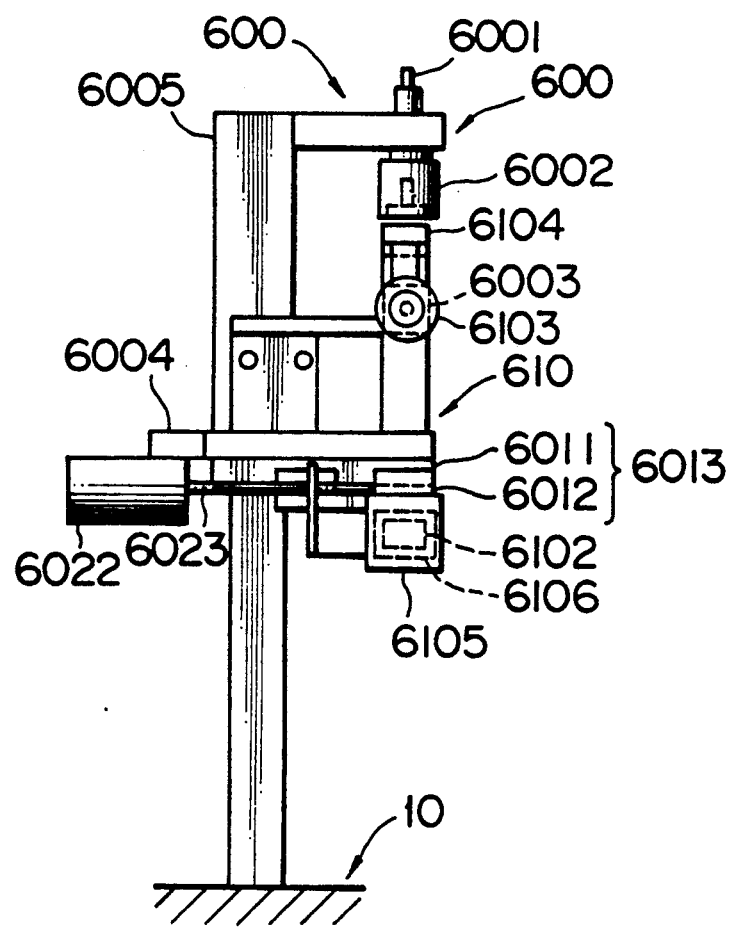

As shown in FIGS. 28, 31 and 32, the laser beam irradiator section 600 comprises irradiation stage 6004 mounted on the base bench 10, a YAG laser oscillator (not shown), an optical system 6002 for adjusting the diameter of a laser beam so that the laser beam can irradiate the entire surface of the semiconductor device 1 at a time, an optical fiber 6001 connecting the optical system 6002 and the laser oscillator, and a optical system support 6005 for supporting the optical system 6002. The optical system support 6005 is mounted on the irradiation stage 6004.

Also as shown in FIGS. 28, 31 and 32, the position offset detector section 610 includes a device camera 6105 for picking up an image of the semiconductor device 1, and a holder camera 6101 for picking up an image of the solder ball holder 4. The device camera 6105 and the holder camera 6101 are interconnected by a mirror tube 6106 in opposed relation to each other. A reflecting mirror 6102 of both-side reflection type is disposed substantially at the center of the mirror tube 6106 along its length. The mirror tube 6106 is mounted to the irradiation stage 6004 through a slide unit 6013 comprising convex slide rails 6011 and concave slide rails 6012 engaging the convex slide rails 6011 in a slidable manner. The concave slide rail 6012 fixed to the mirror tube 6106 is connected to an air cylinder 6022 through a rod 6023. The air cylinder 6022 is fixedly mounted to the irradiation stage 6004. The irradiation stage 6004 is also provided with a reflecting mirror 6003, a holder light source 6103 for illuminating the solder ball holder 4 via the reflecting mirror 6003, and a device light source 6104 for illuminating the semiconductor device 1.

Figure 30:
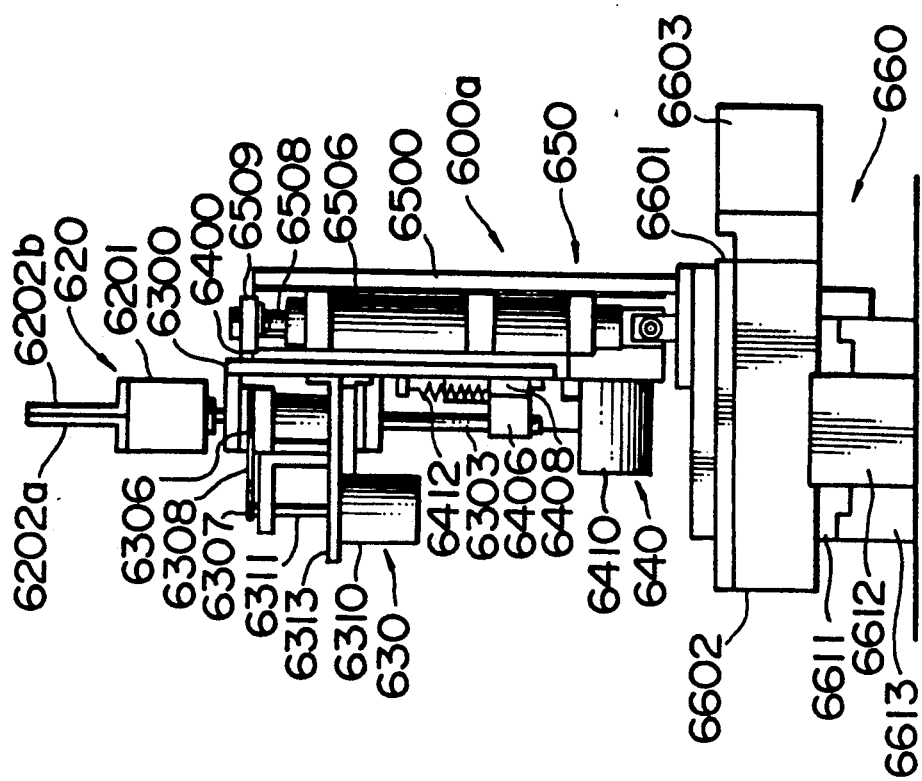
Figure 29:
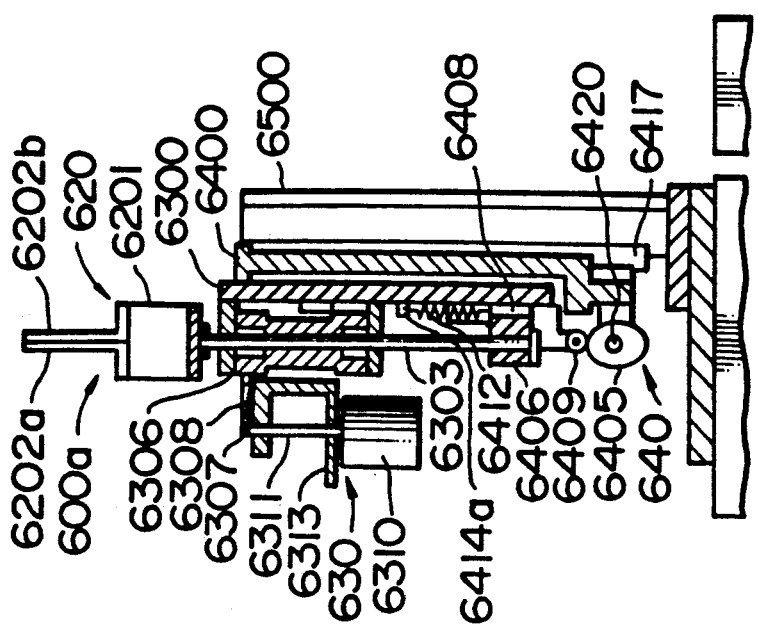

As shown in FIGS. 28-30, the positioning section 600a is disposed just below the position offset detector section 610, and comprises a chuck unit 620 for grasping the head section 265 of the device turntable station (A) 26, a rotator unit 630 for rotating the chuck unit 620, a vertical drive unit (A) 640 for vertically moving the chuck unit 620 by a cam mechanism, a vertical drive unit (B) 650 for vertically moving the chuck unit 620 by an air cylinder 6506, and an X-Y drive unit 660 for moving the chuck unit 620 in the X and Y directions.

The chuck unit 620 consists of a pair of pawls (or fingers) 6202a, 6202b for grasping the head section 265 of the device turntable station (A) 26, and an actuator 6201 for driving the pawls. The chuck unit 620 is supported on a vertically movable rod 6303.

The vertically movable rod 6303 is supported to an elevatable stage (a) 6300 constituting a part of the vertical drive unit (A) 640 in a rotatable and vertically movable manner.

The rotator unit 630 for rotating the chuck unit 620 is provided on the elevatable stage (a) 6300. The rotator unit 630 consists of a chuck rotating motor 6310, a motor bracket 6313 for supporting the chuck rotating motor 6310, a shaft 6311 for transmitting a drive force of the chuck rotating motor 6310, a pulley 6307 mounted to the distal end of the shaft 6311, a pulley 6306 fixed to a upper portion of the vertically movable rod 6303, and a belt 6308 entrained between the pulleys 6307 and 6406.

A lower portion of the vertically movable rod 6303 is supported by a rod receiver 6406 in a rotatable manner. The rod receiver 6406 is in turn supported by the elevatable stage (a) 6300 through a slide unit 6408 comprising a pair of slide rails. Spring latches 6414a, 6414b are fixedly attached to the elevatable stage (a) 6300 and the rod receiver 6406, respectively, with a spring 6412 compressed between the spring latches 6414a and 6414b for upwardly urging both the rod receiver 6406 and the vertically movable rod 6303. The elevatable stage (a) 6300 is also provided with a stopper 6415 for restricting upward movement of the rod receiver 6406, and a cam follower 6409 constituting a part of a cam mechanism adapted to lift up the elevatable stage (a) 6300 itself.

The elevatable stage (a) 6300 is supported in a vertically movable manner to an elevatable stage (a) 6300 constituting a part of the vertical drive unit (B) 640. A cam 6045 in cooperation with the cam follower 6409 is provided o the elevatable stage (b) 6400 through a cam shaft 6420 and a bearing 6404. The cam 6405 has an outer profile defined by a deformed trapezoidal curve. The cam shaft 6420 is connected through a joint 6403 to a shaft 6402 of a cam drive motor 6410. The cam drive motor 6410 is fixedly mounted to the elevatable stage (b) 6400.

The elevatable stage (b) 6400 is mounted to a vertical drive unit support 6500 in a vertically movable manner. The vertical drive unit support 6500 has an air cylinder 6506 fixedly attached thereto for moving the elevatable stage (b) 6400 up and down. A rod 6508 of the air cylinder 6506 is connected to the elevatable stage (b) 6400 through a coupling plate 6509. The air cylinder 6506 is driven in two steps such that the semiconductor device 1 being grasped by the chuck unit 620 is moved, during the first step, from the lowermost level to a position offset detecting level where the position offset between the semiconductor device 1 and the solder ball holder 4 is detected, and the semiconductor device 1 is then moved, during the second step, from the position offset detecting level to a level immediately prior to contact with the solder balls 3 while leaving a spacing of 0.5 mm between the semiconductor device 1 and the solder ball holder 4.

The vertical drive unit support 6500 is fixed to an X-direction slider 6601. The X-direction slider 6601 is slidably mounted on an X-direction slider base 6602 having an X-direction guide groove formed therein, and an X-direction drive actuator 6603 for moving the X-direction slider 6601 is fixedly attached to the X-direction slider base 6602. The X-direction slider base 6602 is fixed to a Y-direction slider 6611. The Y-direction slider 6611 is slidably mounted on a Y-direction slider base 6612 having a Y-direction guide groove formed therein, and a Y-direction drive actuator 6613 for moving the Y-direction slider 6611 is fixedly attached to the Y-direction slider base 6612.

The control station (not shown) comprises a control panel and a main control station consisted of a CPU, a memory and others. The memory stores therein a program for controlling the operations of the respective stations. Note that the images picked up by the cameras 6101, 6105 are transmitted to the main control station through optical fiber cables.

Operation of the solder bump forming apparatus of this embodiment will be described below.

First, the pallets 20 each accommodating the plurality of semiconductor devices 1, 1, . . . are set in the device magazine 21 of the pallet supply station 22.

Also, the solder ball holders 4 are set in the first group of holder magazines 302 of the holder supply/discharge station 30. The solder balls 3, 3, . . . are placed in the solder ball station 50.

After the pallets 2 and so on are completely set, the solder bump forming apparatus starts operating in response to a command from the control station.

The pallets 20 in the pallet supply station 22 are each delivered by the pallet feed mechanism 221 to the X-Y table station 23 where the semiconductor devices 1 are picked up by the semiconductor device supply station 24 out of the pallet 20 one by one for transfer onto the head section 265 of the device turntable station (A) 26. The emptied pallets 20 are stored in the empty pallet storage (or pallet discharge) station 25. The turntable 261 is then turned through approximately 90 degrees so that the semiconductor device 1 being firmly suctioned to the head section 265 comes to a position just below the optical system 6002 for the laser irradiator section 600 and just above the chuck unit 620 of the positioning section 600a.

Figure 33B:
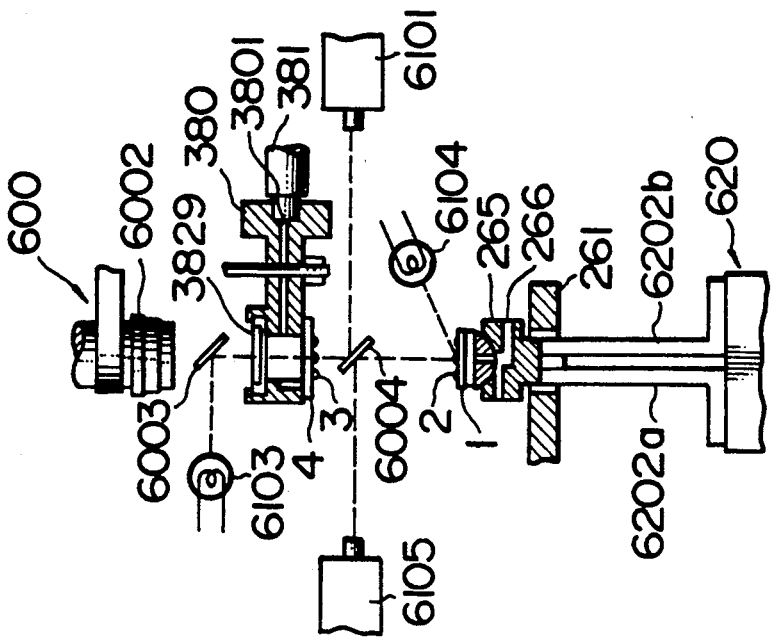
Figure 33A:
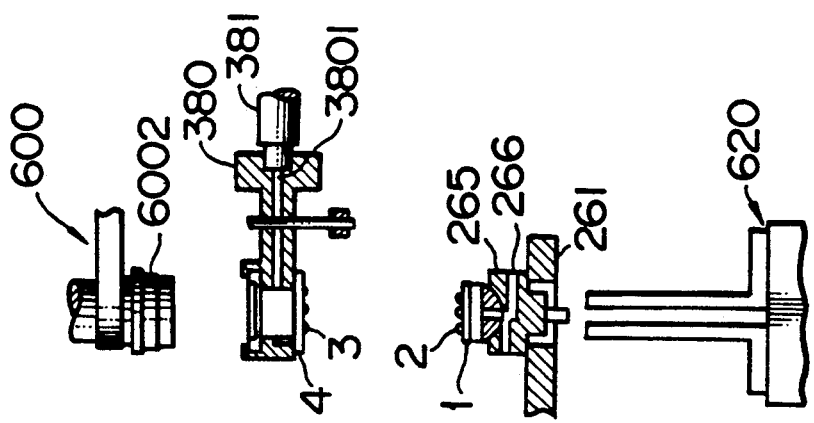

On the other hand, the solder holders 4 are each taken out of the first group of holder magazines 302 and rested on the head section 380 of the holder turntable station (B) 38. After the turntable 381 is rotated through a predetermined angle, the plurality of solder balls 3, 3, . . . are supplied from the solder ball supply station 50 and loaded in the respective loading holes 5a, 5a, . . . of the solder ball holder 4 rested on the head section 380. The turntable 381 is rotated again through a predetermined angle so that the solder holder 4 comes to a position just below the optical system 6002 for the laser beam irradiator section 600 as shown in FIG. 33a. At this time, the head section 180 is turned over or turned through 180 degrees, whereby the solder ball holder 4 and the solder balls 3 are directed downwardly to face the semiconductor device 1. Nevertheless, the solder balls 3 will not drop from the solder ball holder 4 because they are firmly suctioned to the head section 380.

When the device turntable station (A) 26 and the holder turntable station (B) 38 are both rotated to align the optical system 6002 for the laser beam irradiator section 600, the solder ball holder 4, the chuck unit 620 of the positioning section 600a substantially on a line, the air cylinder 6506 of the positioning section 600a is actuated to lift the elevatable stage (a) 6300 and the chuck unit 620 along with the elevatable stage (b) 6400. While ascending, the pair of pawls 6202a, 6202b of the chuck unit 620 grasp the head section 265 of the device turntable station (A) 26. Then, the chuck unit 620 is further elevated until the semiconductor device 1 reaches the position offset detecting level, as shown in FIG. 33b.

When the semiconductor device 1 reaches the position offset detecting level, the holder light source 6103 and the device light source 6104 are lit up to illuminate the solder ball holder 4 and the semiconductor device 1, respectively. The light emitted from the holder light source 6103 is reflected by the reflecting mirror 6003 and passes through the glass sheet 3829, followed by impinging upon the solder ball holder 4.

An image of the solder ball holder 4 and the solder balls 3, 3, . . . loaded therein under light irradiation is picked up by the holder camera 6101. Likewise, an image the semiconductor device 1 is picked up by the device camera 6105 under light irradiation. Image data are sent through the optical fibers to the main control station where the image data are converted to electric signal for the purpose of image processing. If any position offset between the solder balls 3 and the pads 2 of the semiconductor device 1 is detected through the image processing, operation commands are issued from the main control station to the X-direction drive actuator 6603, the Y-direction drive actuator 6613 and the chuck rotating motor 6310, whereupon these components are driven to correct the position offset in the X-, Y- and µ-directions in units of 1 µm.

After the correction of the position offset, the air cylinder 6022 of the position offset detector section 610 is actuated to retreat the device camera 6105 and the holder camera 6101 along with the mirror tube 6106. Then, the air cylinder 6506 of the positioning section 600a is actuated again to lift the semiconductor device 1 from the position offset detecting level up to the level immediately prior to contact with the solder balls 3, as shown in FIG. 33c.

Figure 34A:
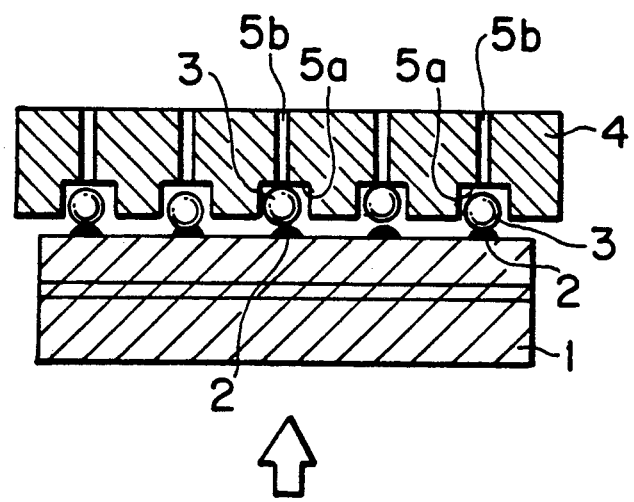
FIGS. 34a and 34b are explanatory views showing the positional relationship among the solder ball, a solder ball holder and the semiconductor device.

Next, the cam drive motor 6410 is driven to rotate the cam 6405 so that the cam follower 6409 and the elevatable stage (A) 6300 are slowly lifted along the deformed trapezoidal cam curve. This elevates the chuck unit 620 and the semiconductor device 1 as well, with the result of that the semiconductor device 1 reaches the contact level at which it abuts against the solder balls 3 placed in the solder ball holder 4, as shown in FIG. 33d. Even after abutment of the semiconductor device 1 against the solder balls 3, the cam drive motor 6410 is driven continuously so that the elevatable stage (A) 6300 to continues to ascend. With the semiconductor device 1 held in abutment against the solder balls 3, while the elevatable stage (A) 6300 is ascending, the chuck unit 620 and the semiconductor device 1 will not rise because the elevatable stage (A) 6300 slides with respect to them through the slide unit 6408, thereby extending the spring 6412. At this time, the positional relationship among the solder ball holder 4, the solder balls 3, 3, . . . and the semiconductor device 1 is, as shown in FIG. 34a, such that some of the numerous solder balls 3, 3, . . . abut against the pads 2, 2, . . . , but the others thereof do not abut against the pads owing to the respective solder balls being different in diameter from one another. Those solder balls held in abutment against the pads 2, 2, . . . are pressed by the pads 2, 2, . . . under the action of the spring 6412.

Figure 34B:
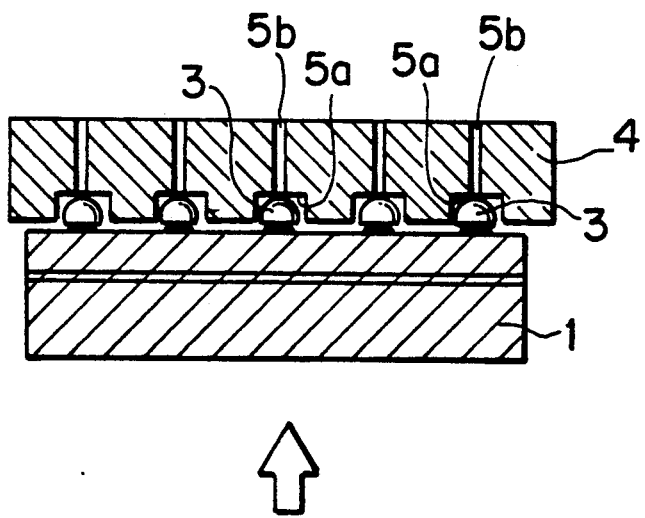

Under that condition, as shown in FIG. 33e, the defocused laser beam is irradiated from the laser beam irradiator section 600 to all the solder balls 3, 3, . . . and the semiconductor device 1 through the glass sheet 3829 and the solder ball holder 4. When the solder balls 3, 3, . . . starts melting, the semiconductor device 1 is gradually lifted under the action of the spring 6412 so that those solder balls 3, 3, . . . not yet abutting against the pads 2, 2, . . . are now forced into abutment against the pads 2, 2, . . . as shown in FIG. 34b, thereby finally forming solder bumps at all the pads.

In this way, there will not occur any position shift during the melting of the solder balls 3, 3, . . . because the solder balls 3, 3, . . . are firmly sucked in the loading holes 5a of the solder ball holder 4 and also pressed by the pads 2, 2, . . . with the pressing force of the spring 6412. For the same reason, no solder balls fail in connection to the pads due to differences in diameter of the solder balls 3, 3, . . . . In addition, since the numerous solder balls 3, 3, . . . are heated together, the step of melting the solder balls 3, 3, . . . is not time consuming.

Figure 35:
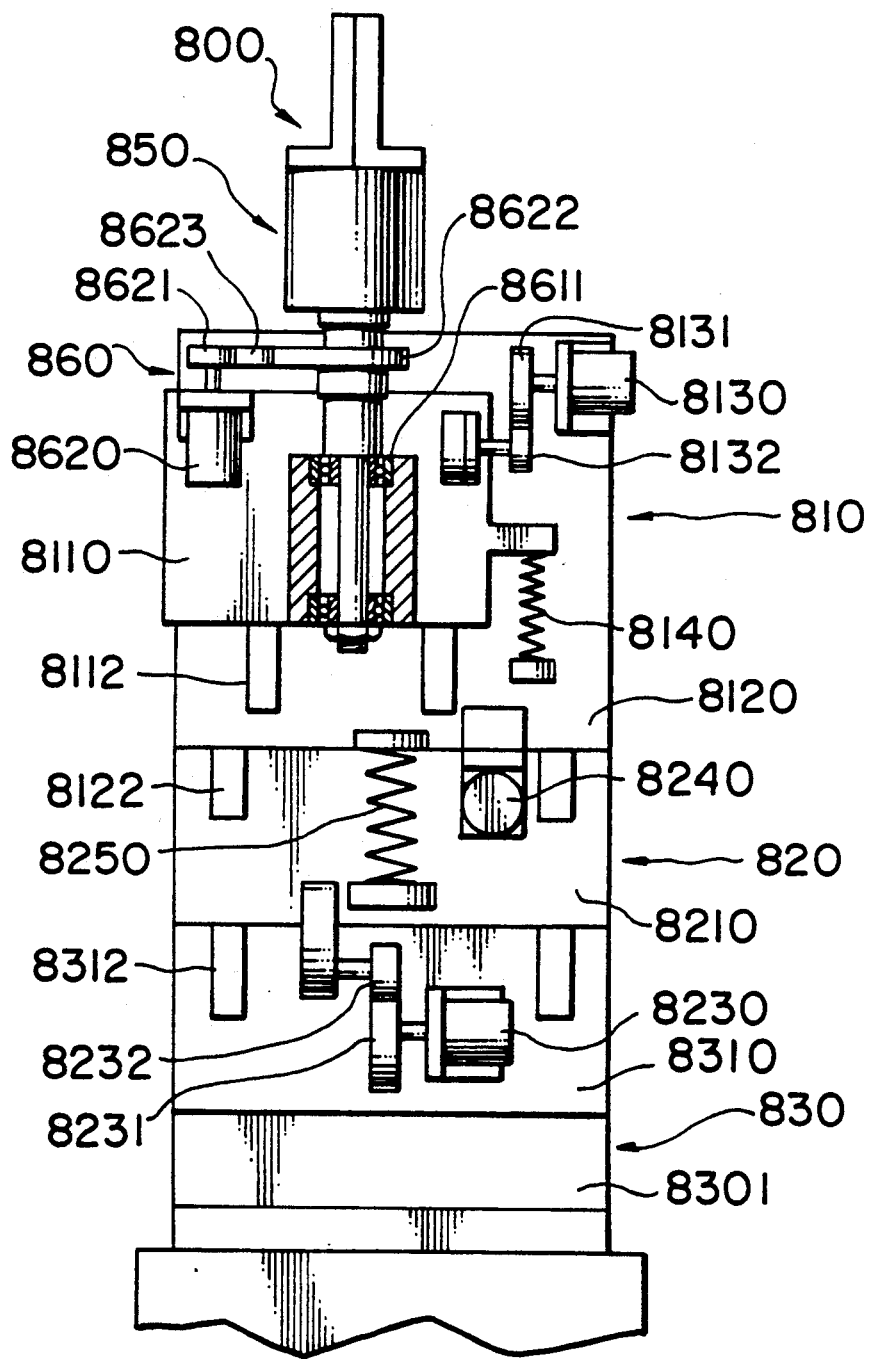
Figure 36:
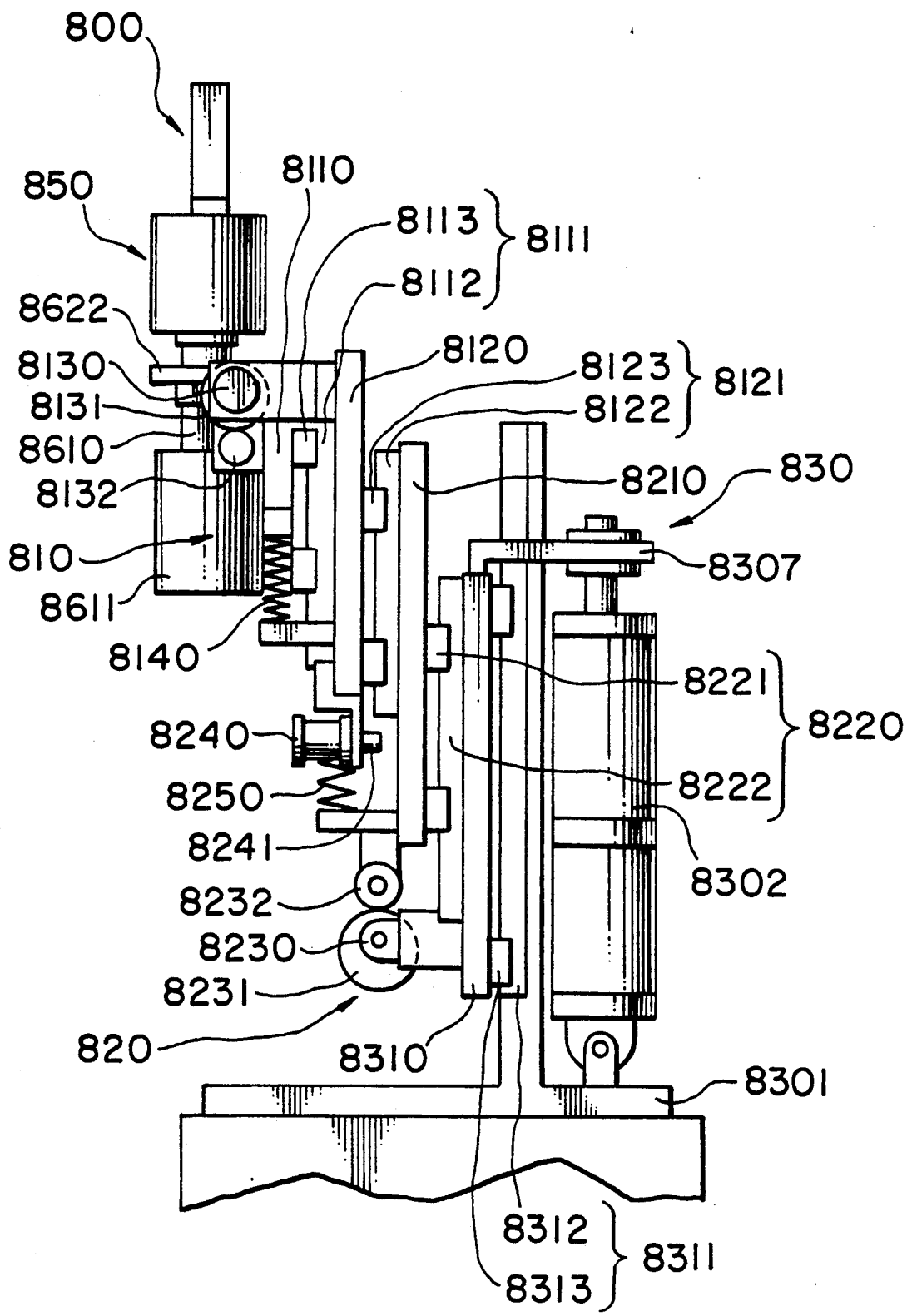

A second embodiment of the solder bump forming apparatus according to the present invention will be described hereunder with reference to FIGS. 35 and 36.

While the solder balls 3 are pressed by the pads 2 with the pressing force of the spring 6412 in the solder bump forming apparatus of the above first embodiment, such pressing force is produced by a cam mechanism in the apparatus of this embodiment. Therefore, this embodiment is different from the first embodiment in only an arrangement of the positioning section 600a.

A positioning section 800 of this embodiment comprises a chuck unit 850 for grasping the head section 265 of the device turntable station (A) 26, a rotator unit 860 for rotating the chuck unit 850, a vertical drive unit (C) 830 for moving the semiconductor device 1 being grasped by the chuck unit 850 from the lowermost level to the position offset detecting level and then to the level immediately prior to contact with the solder balls, a vertical drive unit (B) 820 for moving the semiconductor device 1 from the level immediately prior to contact with the solder balls to the contact level with the solder balls, a vertical drive unit (A) 810 for vertically moving the chuck unit 620 by a cam mechanism, and an X-Y drive unit (not shown) for moving the chuck unit 850 in the X and Y directions.

The vertical drive unit (C) 830 includes a vertical drive unit support 8301 mounted on the X-Y drive unit (not shown), an air cylinder 8302 having its stroke changed in two steps, and an elevatable stage (c) 8310 supported to the vertical drive unit support 8301 through a slide unit 8311 in a vertically movable manner and connected to the air cylinder 8302 through a coupling plate 8307.

The slide unit 8311 consists of a slide rail 8312 fixed to the vertical drive unit support 8301, and a rail receiver 8313 engaging the slide rail 8312 and fixed to the elevatable stage (c) 8310.

The vertical drive unit (B) 820 includes an elevatable stage (b) 8210 supported to the elevatable stage (c) 8310 through a slide unit 8220 in a vertically movable manner, a cam drive motor 8230 mounted on the elevatable stage (c) 8310, a cam 8231 coupled to the cam drive motor 8230, a cam follower 8232 mounted on the elevatable stage 9b) 8210 to be in cooperation with the cam 8231, an air cylinder 8240 fixed to an elevatable stage (a2) 8120 of the vertical drive unit (A) 810, and a spring 8250 disposed between the elevatable stage (a2) 8120 and the elevatable stage (b) 8210.

The slide unit 8220 consists of a slide rail 8222 fixed to the elevatable stage (e) 8210, and a rial receiver 8221 engaging the slide rail 8222 and fixed to the elevatable stage (b) 8210.

As with the first embodiment, the cam 8231 has an outer profile defined by a deformed trapezoidal curve so that the semiconductor device 1 is smoothly and slowly lifted from the level immediately prior to contact to the contact level.

The vertical drive unit (A) 810 includes an elevatable stage (a2) 8120 supported to the elevatable stage (b) 8210 through a slide unit 8121 in a vertically movable manner, an elevatable stage (a1) 8110 supported through a slide unit 8111 in a vertically movable manner like the elevatable stage (a2) 8120, a cam drive motor 130 mounted on the elevatable stage (a2) 8120, a cam 131 coupled to the cam drive motor 8130, a cam follower 132 mounted on the elevatable stage (a1) 8110 to be in cooperation with the cam 8131, and a spring 8140 disposed between the elevatable stage (a1) 8110 and the elevatable stage (a2) 8120.

The slide unit 8111, 8121 consist of slide rails 8112, 8122 and rail receivers 8113, 8123 engaging the slide rails 8112, 8122, respectively.

The cam 8131 has an outer profile shaped so that the semiconductor device 1 is constantly and slowly lifted from the contact level to a solder bump forming level at which all the solder balls 3 are melted to form solder bumps with a proper height.

The spring 8140 serves to upwardly bias the elevatable stage (a1) 8110 for bringing the cam 8131 and the cam follower 8132 into abutment against each other with a constant force at all times.

The spring 8250 of the vertical drive unit (B) upwardly biases the elevatable stage (a2) 8120 for allowing the vertical drive unit (A) 810 to downwardly move relative to the elevatable stage (b) 82101 so that the semiconductor device 1 will not be subjected to an undue force when the semiconductor device 1 is contacted with the solder balls 3 upon rotation of the cam 8231 of the vertical drive unit (B) 820 to further lift the vertical drive unit (A) 810. The air cylinder 8240 has a cylinder unit 8241 coming into abutment against the elevatable stage (b) 8210 when it is actuated, for restricting the positional relationship between the elevatable stage (a2) 8120 and the elevatable stage (b) 8210 relative to each other.

The rotator unit 860 comprises a chuck rod 8610 mounted to the elevatable stage (a1) 8110 through bearings 8611 in a rotatable manner, a chuck rotating motor 8620 fixed to the elevatable stage (a1) 8110, a pulley 8621 attached to a shaft of the chuck rotating motor 8620, a pulley 8622 attached to the chuck rod 8610, and a belt 8623 entrained between the pulleys 8621 and 8622.

The chuck unit 850 has the same arrangement as the first embodiment, and is mounted to the distal end of the chuck rod of the rotator section 860.

Operation of the solder bump forming apparatus of this embodiment will be described below. It is to be noted that since this embodiment also operates in a like manner to the first embodiment until the semiconductor device 1 being grasped by the chuck unit 850 reaches the level immediately prior to contact, the operation so far will not be explained here.

When the semiconductor device 1 reaches the level immediately prior to contact, the cam drive motor 8230 of the vertical drive unit (B) 820 is driven to rotate the cam 8231. This rotation causes the elevatable stage (b) 8210 and the vertical drive unit (A) 810 to be lifted so that the semiconductor device 1 moves from the level immediately prior to contact to the contact level at which it abuts against the solder balls 3. On this occasion, if the semiconductor device 1 is lifted strictly following the cam mechanism, it is likely to occur that the semiconductor device 1 will be subjected to an undue force because of variations in the distance between the level immediately prior to contact with the solder balls and the contact level with the solder balls. However, since the vertical drive unit (A) 810 mounting the chuck unit 850 thereon can be downwardly move relative to the elevatable stage (b) 82101, the semiconductor device 1 will not undergo such an undue force. It is thought that the variations in the distance between the level immediately prior to contact with the solder balls and the contact level with the solder balls depend on differences in diameter of the solder balls 3, differences in thickness of the semiconductor devices 1 and so forth.

When the semiconductor device 1 reaches the contact level with the solder balls, the air cylinder 8240 of the vertical drive unit (B) 820 is actuated to extend the cylinder rod 8241 into abutment against the elevatable stage (b) 8210, thereby restricting movement of the vertical drive unit (A) relative to the elevatable stage (b) 8210.

Next, as with the first embodiment, the laser beam is irradiated from the laser irradiator section 600 to all the solder balls 3, 3, . . . and the semiconductor device 1 through the glass sheet 3829 and the solder ball holder 4. At the same time as the irradiation, the cam drive motor 8130 of the vertical drive unit (A) 810 is driven so that the elevatable stage (a1) 8110 and the chuck unit 850 grasping the semiconductor device 1 are both slowly lifted in step with melting of the solder balls 3, 3, . . . . Since the elevatable stage (a1) 8110 and the chuck unit 850 are always upwardly biased by the spring 8140 with a constant force, even if the chuck unit 850 is forced to be about to ascend following rotation of the cam 8131, the spring 8140 is compressed due to an excessive force exerted on the semiconductor device 1, whereby the cam follower 8132 is detached from the cam 8131 and the chuck unit 850 can no longer be lifted more.

Accordingly, with this embodiment, the constant pressing force is applied to the solder balls 3 at all times during the melting, resulting in that the solder balls 3 will not cause any position shift and no solder balls are failed in connection to the pads due to differences in diameter of the solder balls 3, 3, . . . , like the first embodiment.

Figure 37:
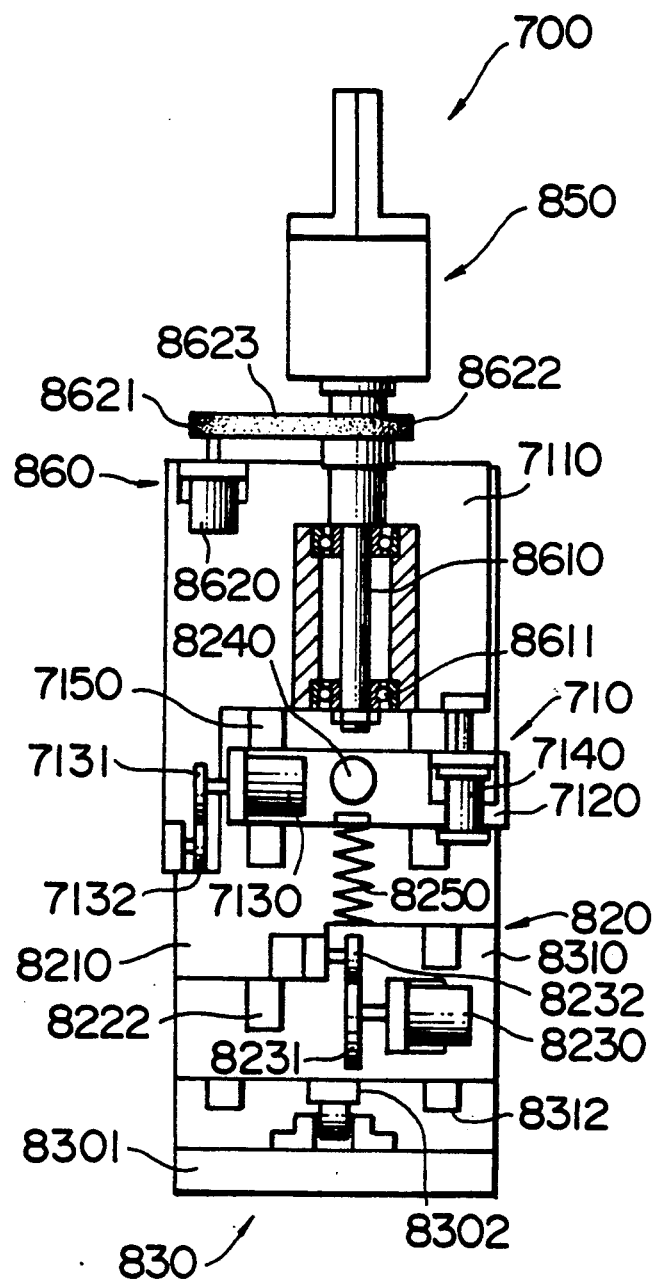
FIGS. 37 and 38 illustrate a third embodiment of the solder bump forming apparatus according to the present invention.
Figure 38:
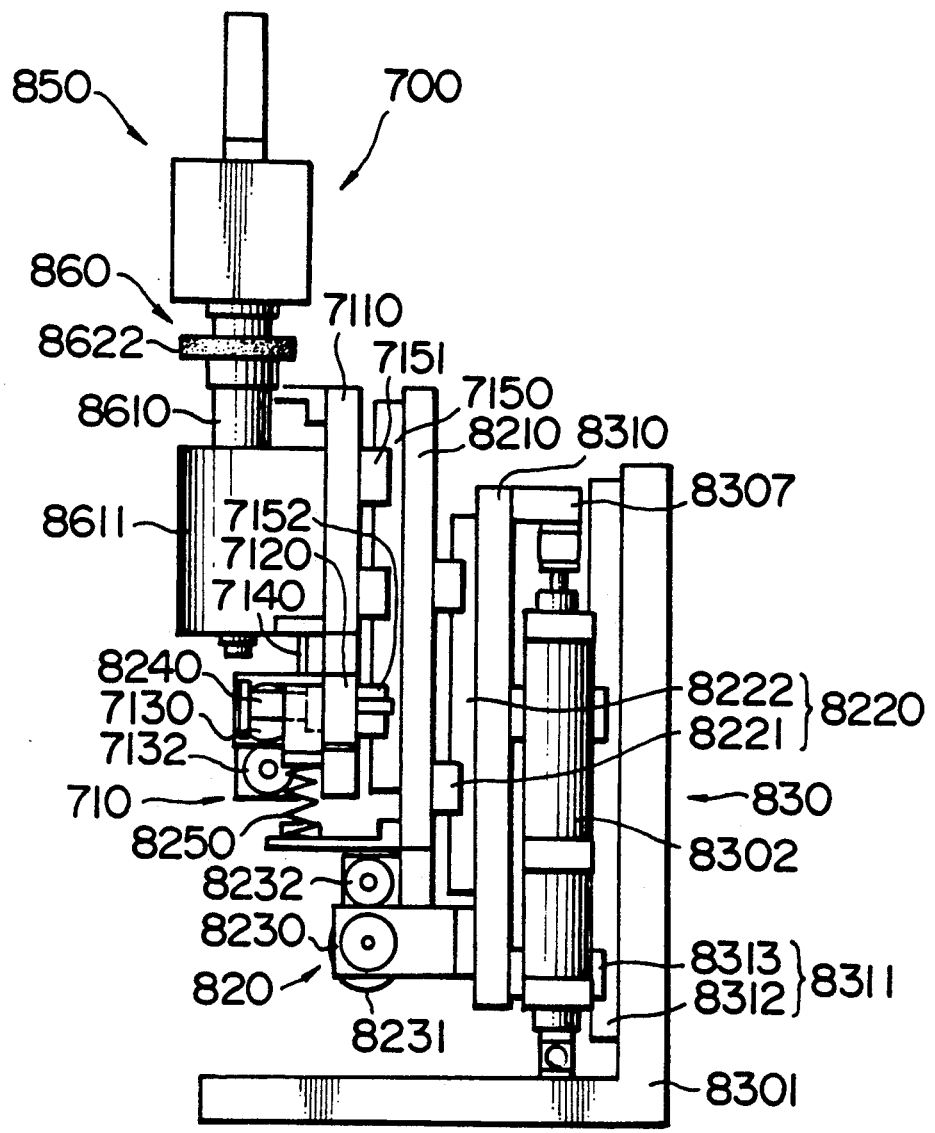
Figure 39:
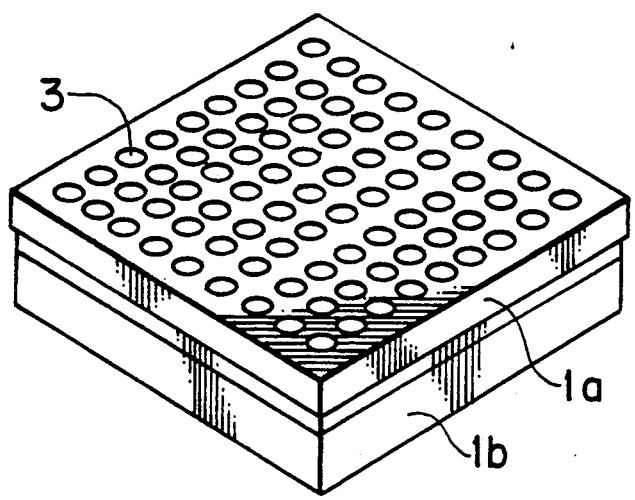
FIG. 39 is a perspective view of a semiconductor module of the flip chip type that is manufactured by using the solder ball loading method according to the present invention.
Figure 40A:
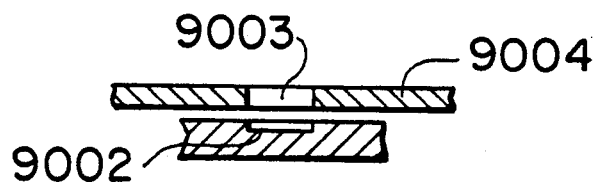
FIGS. 40a, 40b, 40c and 40d are views showing a conventional ball aligning method in successive steps.
Figure 40B:
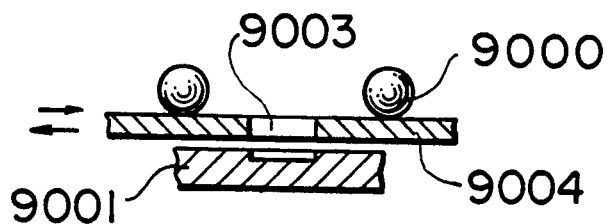
Figure 40C:
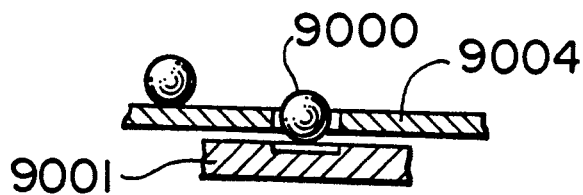
Figure 40D:
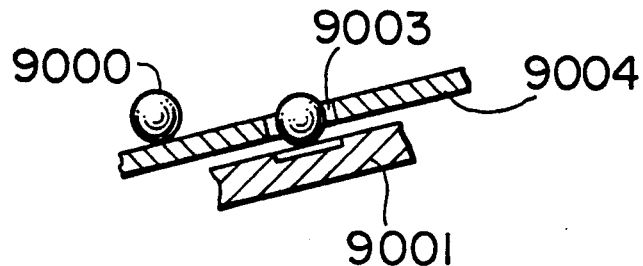
Figure 41:
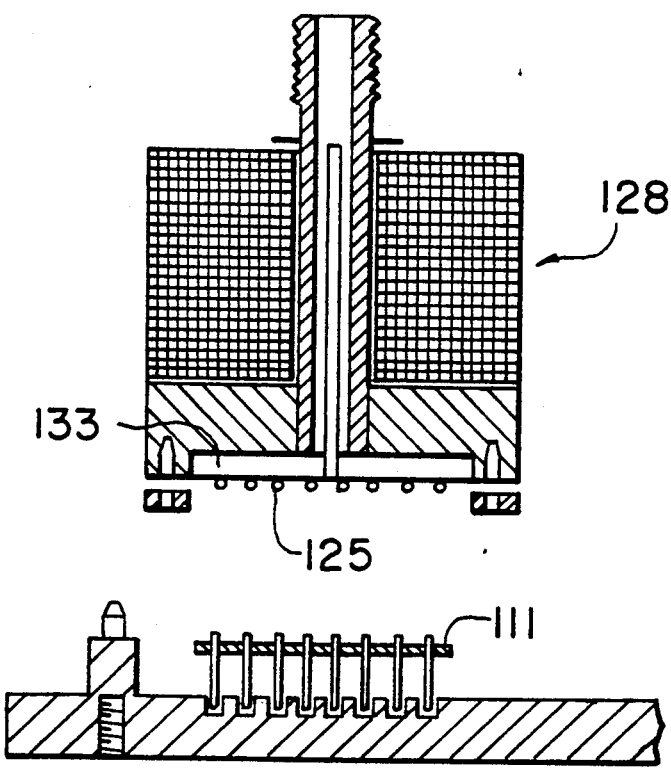
FIGS. 41-43 illustrate the prior art.
Figure 42:
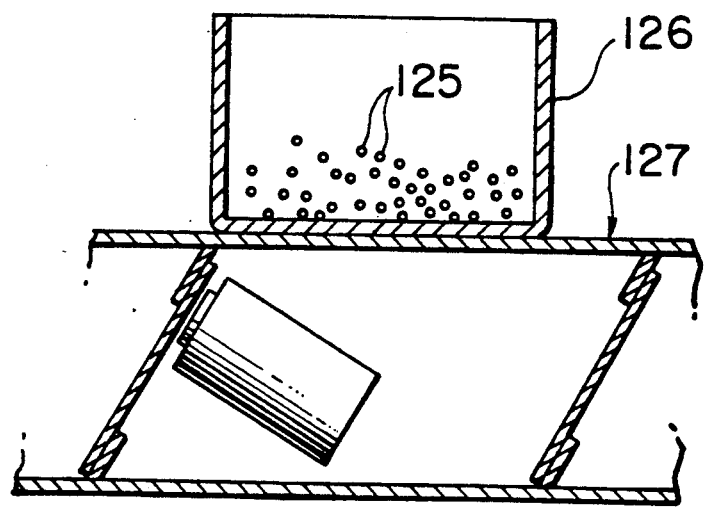
Figure 43:
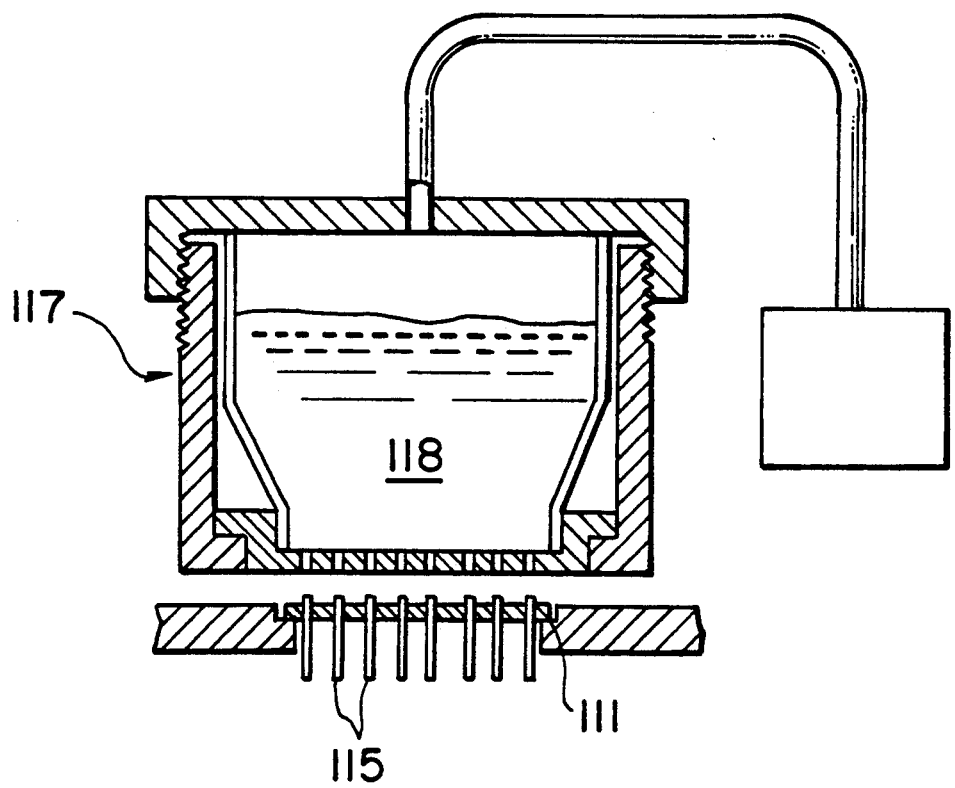

A third embodiment of the solder bump forming apparatus will be described hereunder with reference to FIGS. 37 and 38.

While the solder balls 3 are pressed by the pressing force produced by a combination of the cam and the spring in the solder bump forming apparatus of the above second embodiment, the apparatus of this embodiment produces the pressing force using a combination of an air cylinder and a spring. This embodiment is different from the second embodiment only in the vertical drive unit (A) for lifting the semiconductor device from the contact level with the solder balls to the solder bump forming level. The remaining components are substantially the same as in the second embodiment. Therefore, the vertical drive unit (A) alone will be explained, and the description of other components is omitted here by denoting them at the identical reference numerals to those in the second embodiment.

A positioning section 700 of this embodiment comprises the chuck unit 850 for grasping the head section 265 of the device turntable station (A) 26, the rotator unit 860 for rotating the chuck unit 850, the vertical drive unit (C) 830 for moving the semiconductor device 1 being grasped by the chuck unit 850 from the lowermost level to the position offset detecting level and then to the level immediately prior to contact with the solder balls, the vertical drive unit (B) 820 for moving the semiconductor device 1 from the level immediately prior to contact with the solder balls to the contact level with the solder balls, a vertical drive unit (A) 710 for lifting the semiconductor device 1 from the contact level with the solder balls to the solder bump forming level, and the X-Y drive unit (not shown) for moving the chuck unit 850 in the X and Y directions.

Among them, as mentioned above, the chuck unit 850, the rotator unit 860, the vertical drive unit (C) 830, the vertical drive unit (B) 820 and the X-Y drive unit are substantially the same as in the second embodiment.

The vertical drive unit (A) 710 comprises an elevatable stage (a2) 7120 supported to the elevatable stage (b) 8210 through a slide rail 7150 and a rail receiver 7152 in a vertically movable manner, an elevatable stage (a1) 7110 similarly supported to the elevatable stage (b) 8210 through the slide rail 7150 and a rail receiver 7151 in a vertically movable manner, an air cylinder 7140 fixedly mounted to the elevatable stage (a2) 7120 for lifting the elevatable stage (a1) 7110, a cam drive motor 7130 fixedly mounted to the elevatable stage (a2) 7120, a cam 7131 coupled to the cam drive motor 7130, and a cam follower 7132 mounted on the elevatable stage (a1) 7110 to be in cooperation with the cam 7131.

Assuming that the total weight of the elevatable stage (a1) 7110 and the chuck unit 850 is W and the pressing force applied to the solder balls 3 during the melting is RhD4phDD4phDRhDF, the drive force F produced by the air cylinder 7140 of the vertical drive stage (A) 710 is required to be given by the following equation:

$$F = W + \Delta F$$

The cam 7131 has an outer profile formed such that the elevatable stage (a1) 7110 lifted by the air cylinder 7140 is displaced at a slow speed.

As with the second embodiment, the air cylinder 8240 of the vertical drive stage (B) 820 is mounted to the elevatable stage (a2) 7120. The spring 8250 of the vertical drive unit (B) 820 is disposed between the elevatable stage (a2) 7120 and the elevatable stage (b) 8210 like the second embodiment. Further, the rotator unit 860 and the chuck unit 850 are mounted to the elevatable stage (a1) 7110.

Operation of the solder bump forming apparatus of this embodiment will be described below. It is to be noted that since this embodiment also operates in a like manner to the second embodiment until the semiconductor device 1 being grasped by the chuck unit 850 reaches the contact level with the solder balls, the operation so far will not be explained here.

When the semiconductor device 1 comes into contact with the solder balls 3, the air cylinder 8240 of the vertical drive stage (B) 820 is actuated to extend the cylinder rod 8241 into abutment against the elevatable stage (b) 8210, thereby restricting movement of the elevatable stage (a2) 7120 relative to the elevatable stage (b) 8210.

Next, as with the first embodiment, the laser beam is irradiated from the laser irradiator section 600 to all the solder balls 3, 3, . . . and the semiconductor device 1 through the glass sheet 3829 and the solder ball holder 4. At the same time as the irradiation, the air cylinder 7140 and the cam drive motor 7130 of the vertical drive unit (A) 710 are both energized.

Energizing the air cylinder 7140 lifts the elevatable stage (a1) 7110, the rotator unit 860 and the chuck unit 850. On the other hand, energizing the cam drive motor 7130 restricts a lifting speed of the elevatable stage (a1) 7110, the rotator unit 860 and the chuck unit 850 so that these members are slowly ascended at a constant speed.

Accordingly, with this embodiment, the constant pressing force is applied to the solder balls 3 at all times during the melting, resulting in that the solder balls 3 will not cause any position shift and no solder balls are failed in connection to the pads due to differences in diameter of the solder balls 3, 3, . . . , like the first embodiment.

Although the laser beam is employed as means for melting the solder balls 3 in the foregoing embodiments, the present invention is not limited to the use of a laser beam, and hot air or a light radiation beam such as light from a halogen lamp may be used for melting the solder balls.

Furthermore, the foregoing embodiments are described as forming solder bumps on the semiconductor device 1 of leadless type. However, the present invention can be applied to any types of semiconductor devices on which solder bumps should be formed, and thus is also applicable to the process of forming solder bumps on heads of connecting pins, for example, as cited in connection with the prior art.

According to the solder bump forming method of the present invention, since solder balls are melted while being pressed by solder ball connected portions (or connecting pads) with a predetermined force, the solder balls will not shift from the solder ball connected portions and are positively held in contact with the solder ball connected portions, with the result of that solder bumps can be formed at positions intended.

In addition, after the numerous solder balls are aligned and brought into abutment against the solder ball connected portions, the solder balls and a solder ball connected member (or a semiconductor device) do not need to be conveyed from the aligning station to other place, and all the solder balls are melted together under heating in the same station. Consequently, the time required for forming solder bumps is cut down.

Next, as shown in FIG. 13, the semiconductor device discharge station (or the solder bump formed device storage station) 80 is arranged similarly to the above-described line for supplying the pallets and the semiconductor devices, i.e., it also collectively includes components corresponding to the semiconductor device supply station 24 (FIGS. 20a and 20b), the pallet supply station 22 (FIGS. 18a-18c) and the X-Y table station 23 (FIGS. 19a-19c), in addition to a pallet receiver stand 900 for receiving the pallet 20. Using the same names as the above ones for convenience, therefore, the semiconductor devices are transferred by the semiconductor device supply station 24 from the turntable station (A) 26 to the X-Y table station 23 where they are stored in the pallet 20 one by one (notice that the pallet 20 transferred from the magazine 21 in the pallet supply station 22 to the X-Y table station 23 is empty). When the square grooves 202 of the pallet 20 are all filled with the semiconductor devices formed with the solder bumps, the pallet 20 is automatically transferred to the pallet receiver stand 900.

As described above, since the minute particle loading apparatus of the present invention can form a large number of bumps on the single surface of a semiconductor module with high density, the semiconductor modules of flipped chip type produced by the apparatus of the present invention can improve the processing performance when mounted on substrates for use in largescaled computers, communication equipment (electronic switchboards), high-speed electric signal measuring apparatus and so forth.

Moreover, the minute particle loading method of the present invention can provide advantageous effects as follows: (1) When loading solder balls in respective holes of a jig, compressed air is introduced in the form of a turbulent flow to stir up the solder balls so that the solder balls may be directed (or allocated) toward the holes repeatedly in a short period of time, which results in a very high hit rate of the loading; (2) By using compressed air and suction means, the solder balls can be supplied and recovered at an extremely high speed with flows of a fluid (gas), and the solder balls will not be damaged because of no need of applying any mechanical force to them; and (3) Since a large amount of solder balls sufficient for several hours of operation are stored in a stocker and then supplied little by little in an amount necessary for one cycle of the operation, the apparatus can be continuously operated for a long time.

What is claimed is:

1. A minute particle loading method comprising the steps of:

preparing a minute particle holder having regularly arranged through holes, the diameter of each of said through holes being greater at one side of the minute particle holder which presents a holding surface and smaller at the other, opposite side of said holder, each said through holes regularly holding minute particles at its greater-diameter end opening in said holding surface;

defining an enclosed space over said holding surface of said minute particle holder; and introducing a fluid into said enclosed space to stir up said minute particles put in said enclosed space, while sucking said particles by applying a reduced pressure from the other side of said holder opposite to said holding surface, so that said minute particles are directed toward and placed to be loaded in said holding surface of said minute particle holder.

2. A minute particle loading method according to claim 1, wherein the supply and stoppage of the fluid to said enclosed space are repeated at least two times.

3. A minute particle loading method according to claim 1, wherein those minute particles which have not been loaded in said minute particle holder are recovered by introducing compressed air into said enclosed space.

4. A minute particle loading method according to claim 1, wherein said minute particle holder is made of glass allowing light to pass therethrough, light is illuminated to said minute particle holder after loading said minute particles in said minute particle holder, so that shades of said minute particles are visually recognized to detect whether or not said minute particles are loaded in desired positions on said minute particle holder, and said minute particles are stirred and sucked repeatedly until said minute particles are loaded in all the desired positions.

5. A minute particle loading method according to claim 4, wherein said enclosed space is defined by a movable hopper, and the light is illuminated to said minute particle holder for confirming whether or not said minute particles are loaded in all the desired positions on said minute particle holder, under a condition that said hopper is moved to make open the space over said minute particle holder.

6. A minute particle loading method according to claim 4, wherein said minute particles are solder balls which are supplied to said enclosed space such that a solder ball push-up shaft vertically slidable in a stocker and having a recess at the upper end thereof is lifted from the stocker which stores a larger number of solder balls to be used for forming solder bumps of a semiconductor device, thereby taking out said solder balls from said stocker in number required for forming said solder bumps at one time.

7. A solder ball loading apparatus comprising:

supply means for defining an enclosed space over a solder ball holder having numerous through holes which are different in diameter on the opposite surfaces thereof, so that solder balls can be placed and loaded on the surface of said solder ball holder in which larger-diameter ones of sad holes are exposed, and for supplying the solder balls taken out by a solder ball push-up shaft to said enclosed space with compressed air; and stirring-up means for stirring up said solder balls within said enclosed space by repeating the supply and stoppage of the compressed air to said enclosed space at least two times, so that said solder ball are placed and loaded in said solder ball holder.

8. A solder ball loading apparatus comprising:

supply means for defining an enclosed space over a solder ball holder having numerous through holes which are different in diameter on the opposite surfaces thereof, so that solder balls can be placed and loaded on the surface of said solder ball holder in which larger-diameter ones of said holes are exposed, and for supplying the solder balls taken out by a solder ball push-up shaft to said enclosed space with compressed air;

stirring-up means for stirring up said solder balls within said enclosed space by repeating the supply and stoppage of the compressed air to said enclosed space at least two times;

suction means for loading said solder balls in said solder ball holder under suction by sucking said solder balls via said through holes of said solder ball holder, while stirring up said solder balls; and recovery means for recovering from said enclosed space those ones of said solder balls which are not loaded in said solder ball holder under suction, by introducing the compressed air into said enclosed space again.

9. A solder ball loading apparatus comprising:

storage means for storing a large number of solder balls to be used for forming solder bumps of a semiconductor device;

separator means for taking out the solder balls in number required for one cycle of forming said solder bumps by vertically moving a solder ball push-up shaft, which has a recess at the upper end thereof, within said storage means;

supply means for defining an enclosed space over a light-transmittable solder ball holder having numerous through holes which are different in diameter on the opposite surfaces thereof, so that solder balls can be placed and loaded on the surface of said solder ball holder in which larger-diameter ones of said holes are exposed, and for supplying the solder balls taken out by said solder ball push-up shaft to said enclosed space with compressed air;

stirring-up means for stirring up said solder balls within said enclosed space by repeating the supply and stoppage of the compressed air to said enclosed space at least two times;

suction means for positively loading said solder balls in said solder ball holder under suction by sucking said solder balls via said through holes of said solder ball holder, while stirring up said solder balls;

detector means for detecting whether or not said solder balls are loaded in desired positions on said solder ball holder, by illuminating light to said solder ball holder and visually recognizing shades of said solder balls caused by the illuminated light;

control means for controlling said respective means to supply, stir up and suck said solder balls when the result that said solder balls have not yet been loaded in all the desired positions is visually recognized, so that the supply, stirring-up and suction of said solder balls are repeated until said solder balls are loaded in all the desired positions; and recovery means for recovering from said enclosed space those ones of said solder balls which are not loaded in said solder ball holder under suction, by introducing the compressed air into said enclosed space again.

10. A minute particle holding apparatus comprising:
a minute particle holder means having regularly arranged through holes, the diameter of each of said through holes being greater at one side of said minute particle holder means presenting a holding surface and smaller at the other, opposite side of said holder means, each said through holes regularly holding minute particles at its greater-diameter end opening in said holding surface by a suction effected for the other side of said minute particle holder means opposite to said holding surface;

enclosed space defining means for defining an enclosed space over said holding surface of said holder means; and stirring-up means for stirring up said minute particles in said enclosed space with a turbulent flow of a fluid so that minute particle therein are placed and held int the greater-diameter ends of said throughholes in said holder means.

11. A minute particle holding apparatus according to claim 10, wherein the fluid for use in said stirring-up mans is a compressed fluid given by inert gas.

12. A minute particle holding apparatus according to claim 10, further comprising pressure regulator means for regulating pressure of the fluid for use in said stirring-up means to proper pressure so that said minute particles will not be changed in their shape and weight when said particles strike against said enclosed space defining means and collide with one another.

13. A minute particle holding apparatus according to claim 10, further comprising moisture removing means adapted to remove moisture of the fluid for use in said stirring-up means.

14. A minute particle holding apparatus according to claim 10, further comprising a static electricity removing device adapted to remove static electricity charged on said minute particles.

15. A minute particle holding apparatus according to claim 10, wherein said minute particles are solder balls, said apparatus further comprising preheating means for preheating said solder balls to such an extent that said solder balls are not melted, before said solder balls are brought into contact with a semiconductor device and then heated.

16. A minute particle loading apparatus according to claim 10 wherein said enclosed space has a flow passage through which the fluid introduced into said enclosed space for stirring up said minute particles is delivered outwardly of said enclosed space.

17. A minute particle holding apparatus comprising:
a minute particle holder means having regularly arranged through holes, the diameter of each of said through holes being greater at one side of said minute particle holder means presenting a holding surface at the other, opposite side of said holder means, each said through holes regularly holding minute particles at its greater-diameter end opening in said holding surface by a suction effected from the other side of said minute particle holder means opposite to said holding surface;

enclosed space defining means for defining an enclosed space over said holding surface of said holder means;

stirring-up means for stirring up minute particles in said enclosed space with a turbulent flow of a fluid so that minute particles are placed and held in said holder means; and recovering means for recovering minute particles which are not placed and held in said holder means, by introducing a fluid into said enclosed space.

18. A minute particle holding apparatus comprising:
a minute particle holder means having regularly arranged through holes, the diameter of each of said through holes being greater at one side of said minute particle holder means presenting a holding surface and smaller at the other, opposite side of said holder means, each said through holes regularly holding a minute particles at its greater-diameter end opening in said holding surface by a suction effected from the other side of said minute particle holder means opposite to said holding surface;

enclosed space defining means for defining an enclosed space over said holding surface of said holder means;

supply means for supplying said minute particles to said enclosed space by introducing a fluid into said enclosed space;

stirring-up means for stirring up said minute particles in said enclosed space with a turbulent flow of a fluid so that said minute particles are placed and held in said holder means; and recovery means for covering minute particles which are not placed and held in said holder means, by introducing a fluid into said enclosed space.

* * * * *